(12) United States Patent
Horiba et al.

(10) Patent No.: US 7,976,959 B2
(45) Date of Patent: Jul. 12, 2011

(54) ORGANIC ELECTROLUMINESCENT ELEMENT INCLUDING BIBENZOTHIOPENE CONTAINING ORGANIC COMPOUND AND DISPLAY DEVICE INCLUDING THE SAME

(75) Inventors: Koji Horiba, Kanagawa (JP); Hidekazu Hirose, Kanagawa (JP); Takeshi Agata, Kanagawa (JP); Katsuhiro Sato, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 322 days.

(21) Appl. No.: 12/248,125

(22) Filed: Oct. 9, 2008

(65) Prior Publication Data
US 2009/0243469 A1 Oct. 1, 2009

(30) Foreign Application Priority Data
Mar. 25, 2008 (JP) .................................. 2008-079128

(51) Int. Cl.
*H01J 1/63* (2006.01)
(52) U.S. Cl. ......................... 428/690; 428/917; 313/504
(58) Field of Classification Search .................. None
See application file for complete search history.

(56) References Cited

U.S. PATENT DOCUMENTS

| | | | |
|---|---|---|---|
| 4,539,507 A | 9/1985 | VanSlyke et al. | |
| 5,247,190 A | 9/1993 | Friend et al. | |
| 7,153,980 B2 * | 12/2006 | Ohba et al. .................... | 549/68 |
| 2002/0135296 A1 * | 9/2002 | Aziz et al. ................... | 313/504 |
| 2006/0046094 A1 * | 3/2006 | Nishino et al. ............... | 428/690 |

FOREIGN PATENT DOCUMENTS

| | | |
|---|---|---|
| JP | 59-194393 | 11/1984 |
| JP | 10-92576 | 4/1998 |
| JP | 2002-43066 | 2/2002 |
| JP | 2004-288531 | 10/2004 |

OTHER PUBLICATIONS

Ohshita et al. Organometallics 2004, 23, 5622-5625. Date of online publication: Oct. 12, 2004.*
Nature, vol. 357, Jun. 11, 1992, pp. 477-479.
Polymer Preprints, Japan, vol. 42, No. 7, 20J-21, 1993, pp. 2860-2863.
Proceedings of the 38th Applied Physics Related Societies Seminar, 31p-G-12, 1991.
Proceedings of the 50th Applied Physics Society Seminar, 29p-ZP-5, 1989.
Proceedings of the 51th Applied Physics Society Seminar, 28a-PB-7, 1990.
Thin Solid Films, 94, 1982, pp. 171-183.
Appl. Phys. Lett. vol. 51, Sep. 21, 1987, pp. 913-915.
Technical Report of IEICE, OME95-54, 1995, pp. 47-52.
Proceedings of the 40th Applied Physics Related Societies Seminar, 30a-SZK-14, 1993.
J. Org. Chem., 68, 26, 2003, pp. 10130-10134.

* cited by examiner

*Primary Examiner* — D. Lawrence Tarazano
*Assistant Examiner* — Andrew K Bohaty
(74) *Attorney, Agent, or Firm* — Fildes & Outland, P.C.

(57) ABSTRACT

An organic electroluminescent element which has a long lifetime and excellent manufacturability includes a charge-transporting polymer material having high mobility and solubility in solvents, and further includes a pair of electrodes and an organic compound layer sandwiched between the pair of electrodes, at least one of the electrodes being transparent, the organic compound layer being formed of one or more layers, and at least one of the one or more layers containing at least one charge-transporting polyester represented by Formula (I-1) or (I-2), 15 Claims, 2 Drawing Sheets

ORGANIC ELECTROLUMINESCENT ELEMENT INCLUDING BIBENZOTHIOPENE CONTAINING ORGANIC COMPOUND AND DISPLAY DEVICE INCLUDING THE SAME

CROSS-REFERENCE TO RELATED APPLICATION

This application is based on and claims priority under 35 USC 119 from Japanese Patent Application No. 2008-079128 filed Mar. 25, 2008.

BACKGROUND

1. Technical Field

The present invention relates to an organic electroluminescent element and a display device utilizing the element.

2. Related Art

Electroluminescent elements are self-luminous fully-solid elements, and it is expected that they will be utilized in a wide variety of applications due to their high visibility and high resistance to shocks. Electroluminescent elements composed of inorganic or organic materials are being widely studied and, in recent years, electroluminescent elements composed of charge-transporting polymer materials have also been widely studied and developed.

In order to improve the light-emitting properties, charge injection properties, luminescence efficiency, and manufacturability of organic electroluminescent elements, elements composed of conductive polymers such as poly(p-phenylenevinylene), elements composed of a polymer having triphenylamine in the side chain of polyphosphazene, and elements composed of hole-transporting polyvinylcarbazole mixed with an electron-transporting material and a fluorescent dye, and elements composed of a hole-transporting polyester resin have been proposed.

To simplify production, improve workability, achieve suitably large surface area, and reduce costs, the element is preferably produced by a coating method. It has been disclosed that elements can be produced by a casting method. For film formation from a solution of a polymer material, polyvinyl carbazole is commonly used.

SUMMARY

According to an aspect of the invention, an organic electroluminescent element is provided comprising a pair of electrodes and an organic compound layer sandwiched between the pair of electrodes, at least one of the electrodes being transparent, the organic compound layer comprising one or more layers, and at least one of the one or more layers containing at least one charge-transporting polyesters represented by the following Formula (I-1) or (I-2).

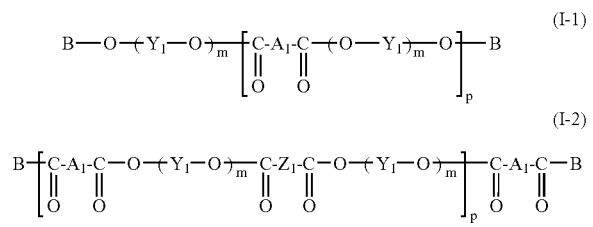

[In Formulae (I-1) and (I-2), $A_1$ represents at least one structure selected from the structures represented by the following Formulae (II-1) and (II-2), $Y_1$ represents a divalent alcohol residue, $Z_1$ represents a divalent carboxylic acid residue, the terminal groups B each independently represent hydrogen or a group represented by —O—$(Y_1$—O$)_m$—H, —O—$(Y_1$—O$)_m$—CO—$Z_1$, or —CO—OR' (wherein R' represents a hydrogen atom, an alkyl group, a substituted or unsubstituted aryl group, or a substituted or unsubstituted aralkyl group), m represents an integer of 1 to 5, and p represents an integer of 5 to 5000.]

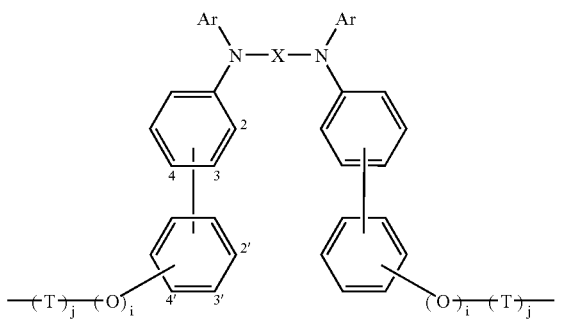

[In Formulae (II-1) and (II-2),

Ar represents a substituted or unsubstituted phenyl group, a substituted or unsubstituted monovalent polynuclear aromatic hydrocarbon group having 2 to 10 aromatic rings, a substituted or unsubstituted monovalent condensed aromatic hydrocarbon group having 2 to 10 aromatic rings, or a substituted or unsubstituted monovalent aromatic heterocyclic group, i and j each represent 0 or 1, T represents a divalent straight-chain hydrocarbon group having 1 to 6 carbon atoms or a divalent branched hydrocarbon group having 2 to 10 carbon atoms, and X represents a divalent group represented by the following Formula (III).]

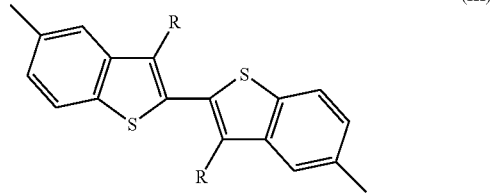

[In Formula (III), R represents a hydrogen atom, a straight-chain hydrocarbon group having 1 to 6 carbon atoms, or a monovalent branched hydrocarbon group having 2 to 10 carbon atoms.]

BRIEF DESCRIPTION OF THE INVENTION

Exemplary embodiment(s) of the present invention will be described in detail based on the following figures, wherein.

DETAILED DESCRIPTION

Figure 1:
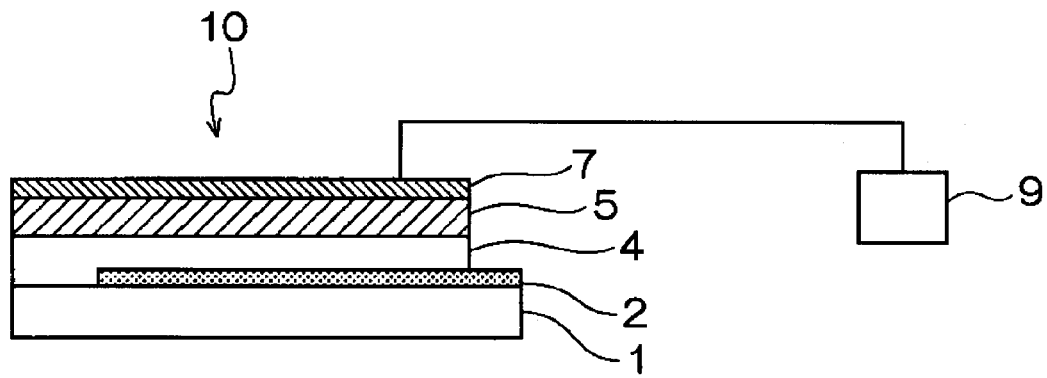
FIG. 1 is a schematic block diagram showing the display device in the exemplary embodiment.

Exemplary embodiments of the invention are described in detail hereinafter. More specifically, the invention in accordance with a first aspect of the invention is an organic electroluminescent element comprising a pair of electrodes and an organic compound layer sandwiched between the pair of electrodes, at least one of the electrodes being transparent, the organic compound layer comprising one or more layers, and at least one of the one or more layers containing at least one charge-transporting polyesters represented by the following Formula (I-1) or (I-2).

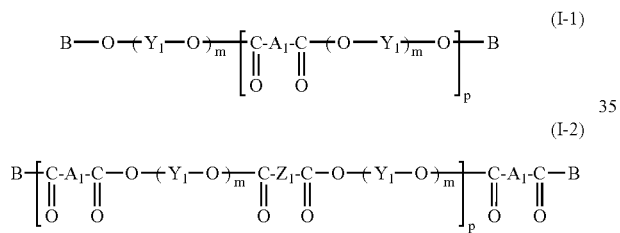

[In Formulae (I-1) and (I-2), $A_1$ represents at least one structure selected from the structures represented by the following Formulae (II-1) and (II-2), $Y_1$ represents a divalent alcohol residue, $Z_1$ represents a divalent carboxylic acid residue, the terminal groups B each independently represent hydrogen or a group represented by —O—$(Y_1$—O$)_m$—H or —O—$(Y_1$—O$)_m$—CO—$Z_1$—CO—OR' (wherein R' represents a hydrogen atom, an alkyl group, a substituted or unsubstituted aryl group, or a substituted or unsubstituted aralkyl group), m represents an integer of 1 to 5, and p represents an integer of 5 to 5000.]

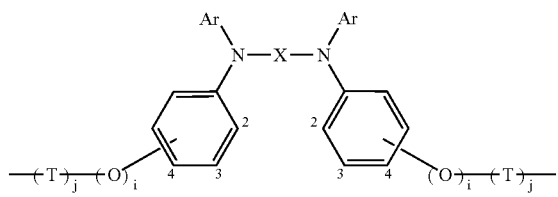

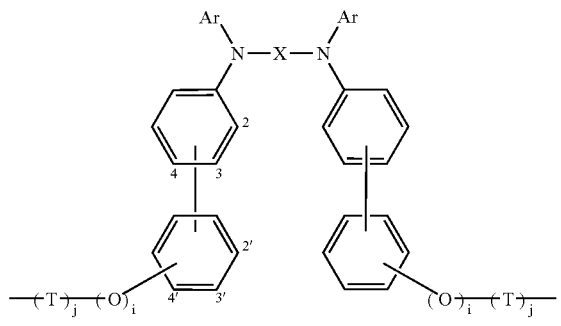

[In Formulae (II-1) and (II-2),

Ar represents a substituted or unsubstituted phenyl group, a substituted or unsubstituted monovalent polynuclear aromatic hydrocarbon group having 2 to 10 aromatic rings, a substituted or unsubstituted monovalent condensed aromatic hydrocarbon group having 2 to 10 aromatic rings, or a substituted or unsubstituted monovalent aromatic heterocyclic group, i and j each represent 0 or 1, T represents a divalent straight-chain hydrocarbon group having 1 to 6 carbon atoms or a divalent branched hydrocarbon group having 2 to 10 carbon atoms, and X represents a divalent group represented by the following Formula (III).]

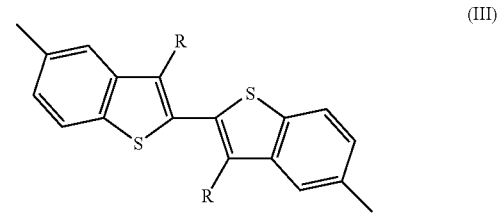

[In Formula (III), R represents a hydrogen atom, a straight-chain hydrocarbon group having 1 to 6 carbon atoms, or a monovalent branched hydrocarbon group having 2 to 10 carbon atoms.]

The invention in accordance with a second aspect of the invention is the organic electroluminescent element of the first aspect, wherein the organic compound layer comprises at least a light-emitting layer as well as an electron-transporting layer and/or an electron-injecting layer, wherein at least one layer selected from the light-emitting layer, the electron-transporting layer, and the electron-injecting layer comprises the at least one charge-transporting polyester.

The invention in accordance with a third aspect of the invention is the organic electroluminescent element of the first aspect, wherein the organic compound layer comprises at least a light-emitting layer as well as a hole-transporting layer and/or a hole-injecting layer, wherein at least one layer selected from the light-emitting layer, the hole-transporting layer, and the hole-injecting layer comprises the at least one charge-transporting polyester.

The invention in accordance with a fourth aspect of the invention is the organic electroluminescent element of the first aspect, wherein the organic compound layer comprises at least a light-emitting layer, at least one layer selected from a hole-transporting layer or a hole-injecting layer, and at least one layer selected from an electron-transporting layer or an electron-injecting layer, wherein at least one layer selected from the light-emitting layer, the hole-transporting layer, the hole-injecting layer, the electron-transporting layer and the electron-injecting layer comprises the at least one charge-transporting polyester.

The invention in accordance with a fifth aspect of the invention is the organic electroluminescent element of the first aspect, wherein the organic compound layer comprises a light-emitting layer having charge-transporting properties, wherein the light-emitting layer having charge-transporting properties comprises the at least one charge-transporting polyester.

The invention in accordance with a sixth aspect of the invention is the organic electroluminescent element of any one of aspects 1 to 5 above, wherein the Ar is a phenyl group, a biphenyl group, a thienylphenyl group, a dimethylbiphenyl group, a triphenylamino group, a 9,9-dimethyl-2-fluorenyl group, or an ethylphenyl group, and the $Y_1$ and $Z_1$ are selected from the groups represented by the following Formulae (1) to (6).

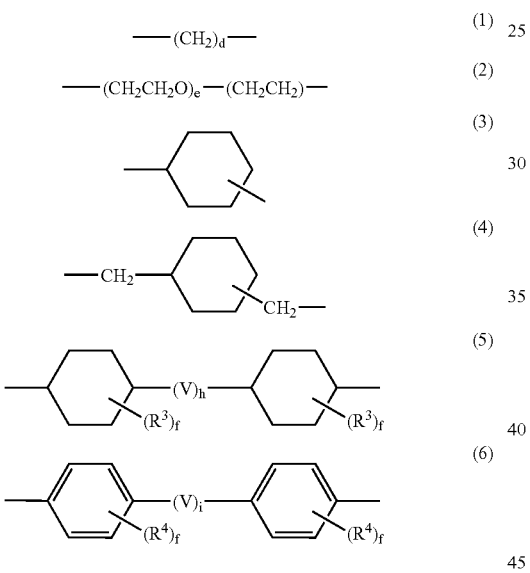

In Formulae (1) to (6), $R^3$ and $R^4$ each represent a hydrogen atom, an alkyl group having 1 to 4 carbon atoms, an alkoxyl group having 1 to 4 carbon atoms, a substituted or unsubstituted phenyl group, a substituted or unsubstituted aralkyl group, or a halogen atom, d and e each represent an integer of 1 to 10, f represents an integer of 0, 1, or 2, h and i each represent 0 or 1, and V is selected from the groups represented by the following Formulae (13) to (33).

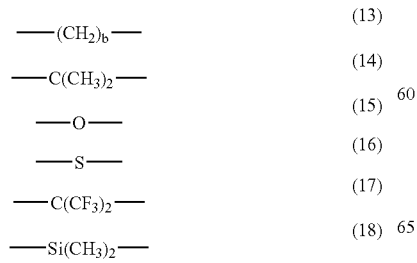

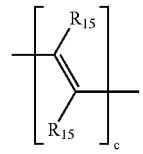

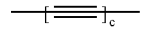

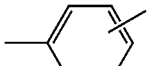

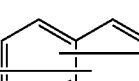

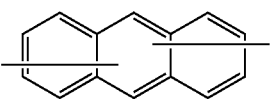

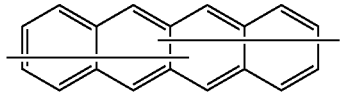

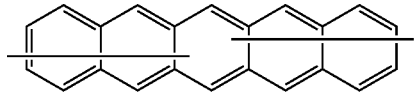

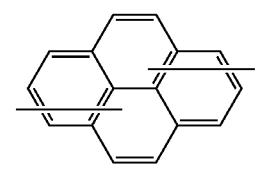

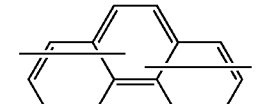

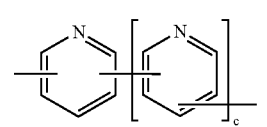

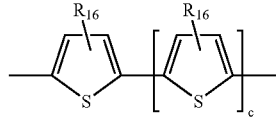

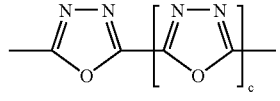

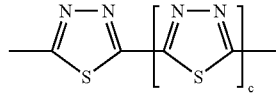

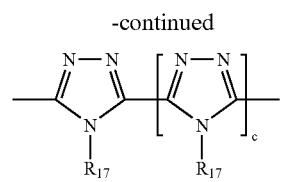

In Formulae (13) to (33), $R_{15}$ represents a hydrogen atom, an alkyl group, or a cyano group, $R_{16}$ to $R_{17}$ represents a hydrogen atom, an alkyl group having 1 to 10 carbon atoms, an alkoxyl group having 1 to 10 carbon atoms, a substituted or unsubstituted phenyl group, a substituted or unsubstituted aralkyl group, or a halogen atom, b represents an integer of 1 to 10, and c represents an integer of 1 to 10.

The invention in accordance with a seventh aspect of the invention is the organic electroluminescent element of the first aspect, wherein the organic compound layer further comprises a hole-transporting material or an electron-transporting material that is different to the at least one charge-transporting polyester.

The invention in accordance with a eighth aspect of the invention is the organic electroluminescent element of seventh aspect, wherein the hole-transporting material is at least one selected from the group consisting of tetraphenylenediamine derivatives, triphenylamine derivatives, carbazole derivatives, stilbene derivatives, arylhydrazone derivatives, and porphyrin-based compounds, and the electron-transporting material is at least one selected from the group consisting of oxadiazole derivatives, triazole derivatives, phenylquinoxaline derivatives, nitro-substituted fluorenone derivatives, diphenoquinone derivatives, thiopyran dioxide derivatives, and fluorenylidenemethane derivatives.

The invention in accordance with a ninth aspect of the invention is the e organic electroluminescent element of the second or forth aspect, wherein the electron-injecting layer comprises a metal, a metal fluoride, and/or a metal oxide.

The invention in accordance with a tenth aspect of the invention is the e organic electroluminescent element of the third or forth aspect, wherein the hole-injecting layer further comprises at least one selected from the group consisting of tetraphenylenediamine derivatives, triphenylamine derivatives, carbazole derivatives, stilbene derivatives, arylhydrazone derivatives, and porphyrin-based compounds.

The invention in accordance with a eleventh aspect of the invention is the organic electroluminescent element of any one of aspects 1 to 5 above, wherein the organic compound layer further comprises a light-emitting compound that is different to the at least one charge-transporting polyester.

The invention in accordance with a twelfth aspect of the invention is the organic electroluminescent element of the eleventh, wherein the light-emitting compound is at least one selected from the group consisting of organic metal chelate complexes, polynuclear or condensed aromatic cyclic compounds, perylene derivatives, coumarin derivatives, styrylarylene derivatives, silole derivatives, oxazole derivatives, oxathiazole derivatives, oxadiazole derivatives, polyparaphenylene derivatives, polyparaphenylene vinylene derivatives, polythiophene derivatives, polyacetylene derivatives, and polyfluorene derivatives.

The invention in accordance with a thirteenth aspect of the invention is the organic electroluminescent element of any one of aspects 1 to 5, wherein the at least one charge-transporting polyester further comprises a doped dye compound that is different to a light-emitting compound.

The invention in accordance with a fourteenth aspect of the invention is the organic electroluminescent element of claim 13, wherein the dye compound is at least one selected from the group consisting of 4-dicyanmethylene-2-methyl-6-(p-dimethylaminostyryl)-4H-pyran (DCM) derivatives, quinacridone derivatives, rubrene derivatives, and porphyrin-based compounds.

The invention in accordance with a fifteenth aspect of the invention is a display device comprising the organic electroluminescent elements of the first aspect and a driving means for driving the organic electroluminescent elements, the organic electroluminescent elements being arranged in a matrix configuration and/or a segment configuration.

DETAILED DESCRIPTION OF THE INVENTION

The organic electroluminescent element in the exemplary embodiment includes a pair of electrodes and an organic compound layer sandwiched and fixed between the pair of electrodes, at least one of the electrodes being transparent, the organic compound layer comprising one or more layers, and at least one of the one or more layers containing at least one charge-transporting polyesters represented by the following Formula (I-1) or (I-2). The term "charge-transporting polyester" refers to a polyester having a mobility of $10^{-5}$ cm²/Vs or more.

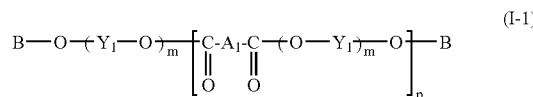

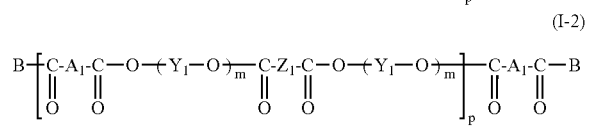

In Formulae (I-1) and (I-2), $A_1$ represents at least one structure selected from the structures represented by Formulae (II-1) and (II-2) below, $Y_1$ represents a divalent alcohol residue, $Z_1$ represents a divalent carboxylic acid residue, the terminal groups B each independently represent hydrogen or a group represented by —O—$(Y_1$—O$)_m$—CO—$Z_1$—CO—OR' (wherein R' represents a hydrogen atom, an alkyl group, a substituted or unsubstituted aryl group, or a substituted or unsubstituted aralkyl group), m represents an integer of 1 to 5, preferably 1, and p represents an integer of 5 to 5000.

$Y_1$ (divalent alcohol residue) and $Z_1$ (divalent carboxylic acid residue) are formed through the polymerization of, for example, the charge-transporting monomer represented by Formula (I-3), a divalent alcohol, a divalent carboxylic acid, or a divalent carboxylic acid halide by, for example, the below-described method. The linking group remaining after a reactive group (alcoholic hydroxy group) is removed from the divalent alcohol is referred to as "divalent alcohol residue", and the linking group remaining after a reactive group (e.g., carboxyl group) is removed from the divalent carboxylic acid or the like is referred to as "divalent carboxylic acid residue".

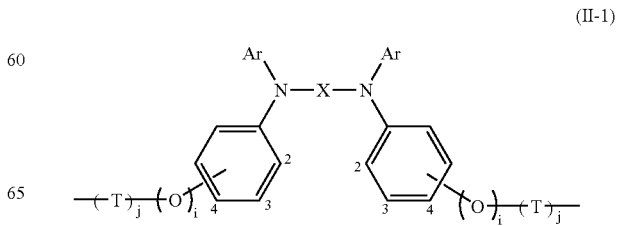

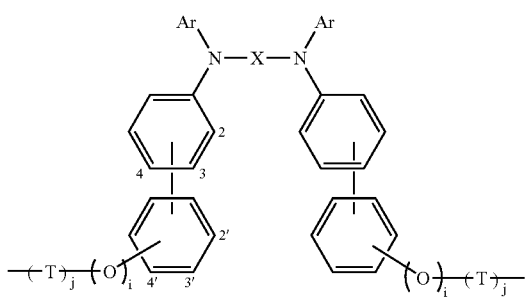

In Formulae (II-1) and (II-2), Ar represents a substituted or unsubstituted phenyl group, a substituted or unsubstituted monovalent polynuclear aromatic hydrocarbon group having 2 to 10 aromatic rings, a substituted or unsubstituted monovalent condensed aromatic hydrocarbon group having 2 to 10 aromatic rings, or a substituted or unsubstituted monovalent aromatic heterocyclic group, i and j each represent 0 or 1, preferably i represents 0, and j represents 1. T represents a divalent straight-chain hydrocarbon group having 1 to 6 carbon atoms or a divalent branched hydrocarbon group having 2 to 10 carbon atoms, and X represents a divalent group represented by the following Formula (III).

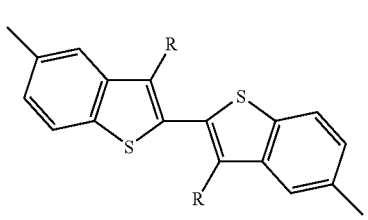

In Formula (III), R represents a hydrogen atom, a straight-chain hydrocarbon group having 1 to 6 carbon atoms, or a monovalent branched hydrocarbon group having 2 to 10 carbon atoms.

The charge-transporting polyester used in the exemplary embodiment is further described regarding the portions represented by Formula (II-1) or (II-2). In Formula (II-1) and Formula (II-2), Ar represents a polynuclear aromatic hydrocarbon or condensed aromatic hydrocarbon group having 2 to 10, preferably 2 to 6 aromatic rings. In Formula (II-1) and Formula (II-2), the polynuclear aromatic hydrocarbon group, condensed aromatic hydrocarbon group, or aromatic heterocyclic group represented by Ar is not particularly limited. In the exemplary embodiment, the polynuclear aromatic hydrocarbon group, condensed aromatic hydrocarbon group, and aromatic heterocyclic group specifically have the following definitions.

That is, the "polynuclear aromatic hydrocarbon" is a hydrocarbon containing two or more aromatic rings which consist of carbon and hydrogen atoms and which are bound to each other via a carbon-carbon bond. Specific examples thereof include biphenyl and terphenyl. The "condensed aromatic hydrocarbon" is a hydrocarbon compound having two or more aromatic rings consisting of carbon and hydrogen atoms wherein there are a pair of vicinal carbon atoms bonded to each other that are shared by aromatic rings. Specific examples thereof include naphthalene, anthracene, pyrene, phenanthrene, perylene, and fluorene.

The "aromatic heterocycle" (i.e., aromatic heterocyclic group) represents an aromatic ring also containing one or more other elements than carbon and hydrogen. The scope of the aromatic heterocycle encompasses a heterocycles substituted by an aromatic ring and an aromatic ring substituted by a heterocycle. In the heterocycle, the number (Nr) of the atoms constituting the cyclic skeleton thereof may be 5 or 6. The kind and number of other atoms (heteroatoms) than carbon atoms in the cyclic skeleton are not particularly limited. For example, a sulfur atom, a nitrogen atom, an oxygen atom, a serene atom, a silicon atom or the like may be used. The cyclic skeleton may contain two or more kinds of heteroatoms and/or two or more heteroatoms. In particular, thiophene, pyrrole, furan, serenophene, silole, or a heterocycle obtained by substituting the carbon atom at the 3- or 4-position of any of the above compounds with a nitrogen atom may be used as a heterocycle having a 5-membered ring structure, and pyridine may be used as a heterocycle having a 6-membered ring structure.

Examples of a substituent that can be substituted on a phenyl group, the polynuclear aromatic hydrocarbon group, the condensed aromatic hydrocarbon group or the aromatic heterocyclic group selected as a structure for Ar in Formula (II-1) and Formula (II-2) include a hydrogen atom, an alkyl group, an alkoxy group, an aryl group, an aralkyl group, a substituted amino group, and a halogen atom. The alkyl group may be a group having 1 to 10 carbon atoms, such as a methyl group, an ethyl group, a propyl group, an isopropyl group or a tert-butyl group. The alkoxy group may be a group having 1 to 10 carbon atoms, such as a methoxy group, an ethoxy group, a propoxy group or an isopropoxy group. The aryl group may be a group having 6 to 20 carbon atoms, such as a phenyl group or a toluyl group. The aralkyl group may be a group having 7 to 20 carbon atoms, such as a benzyl group or a phenethyl group. Examples of a substituent in the substituted amino group include an alkyl group, an aryl group and an aralkyl group, and specific examples thereof are as described above. Examples of the halogen atom include a fluorine atom, a chlorine atom, bromine atom, and iodine atom. Among these, a fluorine atom is preferable as the halogen atom.

The substituted or unsubstituted phenyl group, the substituted or unsubstituted monovalent condensed aromatic hydrocarbon group having 2 to 10 aromatic rings, and the substituted or unsubstituted monovalent aromatic heterocyclic group are same meaning to those defined for Ar in the above Formulae (II-1) and (II-2) respectively.

In Formulae (II-1) and (II-2), T represents a divalent straight-chain hydrocarbon group having 1 to 6 carbon atoms or a divalent branched hydrocarbon group having 2 to 10 carbon atoms, preferably a group selected from divalent straight-chain hydrocarbon groups having 2 to 6 carbon atoms and divalent branched hydrocarbon groups having 3 to 7 carbon atoms. Specific structures of T are shown below.

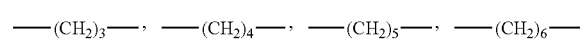
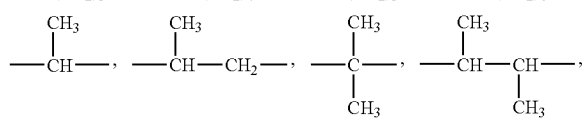

-continued

—C(CH₃)₂—CH₂—,   —CH(CH₃)—CH₂—CH₂—

—CH₂—CH(CH₃)—CH₂—,   —CH(C₂H₅)—CH(CH₃)—,   —CH(C₃H₇)—CH₂—,

—C(CH₃)₂—CH₂—CH₂—,   —CH(CH₃)—CH(CH₃)—CH₂—,

—CH(CH₃)—CH₂—CH(CH₃)—,   —CH₂—C(CH₃)₂—CH₂—,

—CH(CH₃)—CH₂—CH₂—CH₂—,   —CH₂—CH(CH₃)—CH₂—CH₂—,

—CH(CH₃)—CH₂—CH₂—CH₂—CH₂—,

—CH₂—CH(CH₃)—CH₂—CH₂—CH₂—,

—CH₂—CH₂—CH(CH₃)—CH₂—CH₂—

—CH₂—C(CH₃)₂—CH₂—CH₂—,

—CH₂—CH(CH₃)—CH₂—CH₂—CH₂—CH₂—,

—CH₂—CH(CH₃)—CH₂—CH(CH₃)—CH₂—

—CH₂—CH(C₂H₅)—CH₂—CH₂—CH₂—,

—CH₂—C(C₂H₅)(CH₃)—CH₂—CH₂—CH₂—,

—CH₂—CH(CH₃)—(CH₂)₅—,   —CH₂—C(C₂H₅)(CH₃)—(CH₂)₄—,

—CH₂—CH(CH₃)—(CH₂)₆—,   —CH₂—C(C₂H₅)(CH₃)—(CH₂)₅—

In Formulae (II-1) and (II-2), according to an preferable aspect, Ar is a phenyl group, a biphenyl group, a toluyl group, an ethylphenyl group, a fluorophenyl group, benzothieno[3,2-b][1]benzothiophene, benzoselenopheno [3,2-b][1]benzoselenophene, a benzothienyl group, a triphenylamino group, a thienylphenyl group, a 9,9-dimethylfluorenyl group, a 9,9-dihexylfluorenyl group, a diphenylstilbenyl group, an N-phenylcarbazole group, dibenzothiophene, a quarter thienyl group, a spirofluorenyl group, a phenylsilole group, a phenylselenophenyl group, or a phenyl furan, i and j are 0 or 1, T is an ethylene group, a propylene group, a 2-methylpropylene group, a 2,2'-dimethylbutylene group, a butylene group, a pentylene group, a 2-methyloctylene group, or a hexylene group, and the bonding sites are 3, 4, 3, 3', or 4, 4'.

In Formulae (II-1) and (II-2), according to a particularly preferable aspect, Ar is a phenyl group, a biphenyl group, a thienylphenyl group, a dimethylphenyl group, a triphenylamino group, a 9,9-dimethyl-2-fluorenyl group, or an ethylphenyl group, i and j are 0 or 1, T is an ethylene group, a butylene group, or a hexylene group, and the binding site is 4 or 4,4'.

In the charge-transporting polyester used in the exemplary embodiment, in Formula (II-1) or (II-2), the group represented by X (the group represented by Formula (III)) is further described.

The group represented by Formula (III) is characterized in that it contains two fragments each composed of a condensed ring formed from one thiophene ring and one benzene ring, and that the two fragments are linked together via carbon atoms forming the thiophene rings.

On the other hand, common polythiophenes exhibit conductivity, so that the group X in Formula (II-1) or (II-2) preferably contains thiophene thereby securing and improving mobility of the charge-transporting polyester.

Therefore, the inventors eagerly studied the groups containing thiophene as the group X. However, when a linear polythiophene is used as the group X, solubility of the charge-transporting polyester in a solvent decreases as the increase of the chain length. A group composed of thiophene and other aromatic group (e.g., fluorene) improves the solubility to a degree, but requires further improvement for striking a good balance between the mobility and solubility.

In the exemplary embodiment, the group X has a condensed ring structure shown in Formula (III) composed of a thiophene ring and a benzene ring, so that it offers an excellent balance between the mobility and solubility at high levels. The detailed reason for this is unknown, but is considered that the condensed ring structure allows the formation of a π electron conjugated system in the group represented by Formula (III) to improve the planarity of the group.

When the substituent R linked to the thiophene ring is a hydrocarbon group, the increase of the number of carbon atoms (or the increase of the steric hindrance) increases the steric repulsion between the substituent $R_s$ linked to independent thiophene rings, which improves amorphous properties, and further improves the solubility.

As described above, the R is selected from a hydrogen atom, a straight-chain hydrocarbon group having 1 to 6 carbon atoms, or a branched divalent hydrocarbon group having 2 to 10 carbon atoms. From the above-described viewpoint, the R is preferably a straight-chain hydrocarbon group having 2 to 6 carbon atoms or a divalent branched hydrocarbon group having 3 to 8 carbon atoms. Specific examples of the group include a butyl group, a hexyl group, an isopropyl group, and a t-butyl group.

Specific examples of the structure represented by Formula (II-1) (structure number 1 to 124) are shown in the following Tables 1 to 32.

TABLE 1

| *St | X | Ar | T | i | j | *B.P. |
|---|---|---|---|---|---|---|
| 1 | (5-methylbenzothiophene)-2-(5-methylbenzothiophene) | phenyl | —CH₂CH₂— | 0 | 1 | 4 |
| 2 | (5-methylbenzothiophene)-2-(5-methylbenzothiophene) | 4-methylphenyl | —CH₂CH₂— | 0 | 1 | 4 |
| 3 | (5-methylbenzothiophene)-2-(5-methylbenzothiophene) | 2',4-dimethylbiphenyl | —CH₂CH₂CH₂CH₂— | 0 | 1 | 4 |
| 4 | (5-methylbenzothiophene)-2-(5-methylbenzothiophene) | biphenyl | —CH₂CH₂— | 0 | 1 | 4 |

*St = Structure,

*B.P. = Binding Position.

TABLE 2

| *St | X | Ar | T | i | j | *B.P. |
|---|---|---|---|---|---|---|
| 5 | (5-methylbenzothiophene)-2-(5-methylbenzothiophene) | 4-ethylphenyl | —CH₂CH₂— | 0 | 1 | 4 |
| 6 | (5-methylbenzothiophene)-2-(5-methylbenzothiophene) | 4-fluorophenyl | —CH₂CH₂— | 0 | 1 | 4 |

TABLE 2-continued

| *St | X | Ar | T | i | j | *B.P. |
|---|---|---|---|---|---|---|
| 7 | (benzothiophene-benzothiophene dimer with methyl groups) | (4-methylphenyl-N-carbazole) | —CH₂CH₂— | 0 | 1 | 4 |
| 8 | (benzothiophene-benzothiophene dimer with methyl groups) | (9,9-dimethyl-2-methylfluorene) | —CH₂CH₂— | 0 | 1 | 4 |

*St = Structure,
*B.P. = Binding Position.

TABLE 3

| *St | X | Ar | T | i | j | *B.P. |
|---|---|---|---|---|---|---|
| 9 | (benzothiophene-benzothiophene dimer with methyl groups) | (9,9-dihexyl-2-methylfluorene) | —CH₂CH₂— | 0 | 1 | 4 |
| 10 | (benzothiophene-benzothiophene dimer with methyl groups) | (2-methyl-9,9'-spirobifluorene) | —CH₂CH₂— | 0 | 1 | 4 |
| 11 | (benzothiophene-benzothiophene dimer with methyl groups) | (4-methylstyryl-diphenylmethane derivative) | —CH₂CH(CH₃)CH₂CH₂— (with CH₃ branch) | 0 | 1 | 4 |
| 12 | (benzothiophene-benzothiophene dimer with methyl groups) | (3-methylphenyl-N-carbazole) | —CH₂CH₂— | 0 | 1 | 4 |

*St = Structure,
*B.P. = Binding Position.

TABLE 4

| *St | X | Ar | T | i | j | *B.P. |
|---|---|---|---|---|---|---|
| 13 | (5-methylbenzothiophene-2-yl)-(5-methylbenzothiophene) | N-phenylcarbazole with methyl | —CH₂CH₂— | 0 | 1 | 4 |
| 14 | (5-methylbenzothiophene-2-yl)-(5-methylbenzothiophene) | 9-(p-tolyl)-N,N,N',N'-tetraphenyl-9H-carbazole-2,7-diamine | —CH₂CH₂— | 1 | 0 | 4 |
| 15 | (5-methylbenzothiophene-2-yl)-(5-methylbenzothiophene) | 2-methyl-6-methylbenzothiophene | —CH₂CH₂CH₂— | 0 | 1 | 4 |

*St = Structure, *B.P. = Binding Position.

TABLE 5

| *St | X | Ar | T | i | j | *B.P. |
|---|---|---|---|---|---|---|
| 16 | (5-methylbenzothiophene-2-yl)-(5-methylbenzothiophene) | methyl-silole-thiophene | —CH₂CH₂— | 0 | 1 | 4 |
| 17 | (5-methylbenzothiophene-2-yl)-(5-methylbenzothiophene) | methyl-dibenzothiophene | —CH₂CH₂— | 0 | 1 | 4 |

TABLE 5-continued

| *St | X | Ar | T | i | j | *B.P. |
|---|---|---|---|---|---|---|
| 18 | (benzothiophene-benzothiophene dimer, dimethyl substituted) | (4'-methylbiphenyl-4-yl diphenylamine) | —CH$_2$CH$_2$CH$_2$— | 0 | 1 | 4 |
| 19 | (benzothiophene-benzothiophene dimer, dimethyl substituted) | (3,6-dimethyl-9-(p-tolyl)carbazole) | —CH$_2$CHCH$_2$—<br>       |<br>      CH$_3$ | 0 | 1 | 4 |

*St = Structure, *B.P. = Binding Position.

TABLE 6

| *St | X | Ar | T | i | j | *B.P. |
|---|---|---|---|---|---|---|
| 20 | (benzothiophene-benzothiophene dimer, dimethyl substituted) | (4-methyl-N,N-diphenylaniline) | —CH$_2$CH$_2$— | 0 | 1 | 4 |
| 21 | (benzothiophene-benzothiophene dimer, dimethyl substituted) | (4-methylphenyl-thiophene) | —CH$_2$CH$_2$— | 1 | 0 | 4 |
| 22 | (benzothiophene-benzothiophene dimer, dimethyl substituted) | (methyl-quaterthiophene-hexyl) | —CH$_2$CH$_2$CH$_2$CH$_2$CH$_2$— | 0 | 1 | 4 |
| 23 | (benzothiophene-benzothiophene dimer, dimethyl substituted) | (4-methylphenyl-selenophene) | —CH$_2$CH$_2$— | 0 | 1 | 4 |

*St = Structure, *B.P. = Binding Position.

TABLE 7

| *St | X | Ar | T | i | j | *B.P. |
|---|---|---|---|---|---|---|
| 24 | (5-methylbenzothiophene-2-yl)-(5-methylbenzothiophene) | methylphenyl-furan | —CH$_2$CH$_2$— | 0 | 1 | 3 |
| 25 | (5-methylbenzothiophene-2-yl)-(5-methylbenzothiophene) | methyl-benzothieno-benzothiophene | —CH$_2$CH$_2$CH$_2$CH$_2$CH$_2$CH$_2$— | 0 | 1 | 4 |
| 26 | (5-methylbenzothiophene-2-yl)-(5-methylbenzothiophene) | methyl-benzoselenopheno-benzoselenophene | —CH$_2$CH$_2$CH$_2$CH$_2$CH$_2$— | 0 | 1 | 4 |
| 27 | (5-methylbenzothiophene-2-yl)-(5-methylbenzothiophene) | methyl-dinaphthothiophene | —CH$_2$CH$_2$CH$_2$CH$_2$CH$_2$— | 0 | 1 | 4 |

*St = Structure, *B.P. = Binding Position.

TABLE 8

| *St | X | Ar | T | i | j | *B.P. |
|---|---|---|---|---|---|---|
| 28 | (5-methylbenzothiophene-2-yl)-(5-methylbenzothiophene) | methyl-dinaphthoselenopheno-selenophene | —CH$_2$CH$_2$CH$_2$CH$_2$CH$_2$— | 0 | 1 | 4 |
| 29 | (5-methylbenzothiophene-2-yl)-(5-methylbenzothiophene) | thiazole-thiazole-selenophene-selenophene with hexyl | —CH(CH$_3$)CH$_2$CH$_2$CH$_2$CH$_2$CH$_2$CH$_2$CH$_2$— | 0 | 1 | 4 |
| 30 | (5-methylbenzothiophene-2-yl)-(5-methylbenzothiophene) | 3,5-dimethyl-ethylphenyl | —CH$_2$CH$_2$— | 0 | 1 | 4 |

TABLE 8-continued
| *St | X | Ar | T | i | j | *B.P. |
|---|---|---|---|---|---|---|
| 31 | 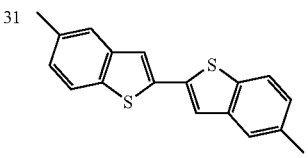 | 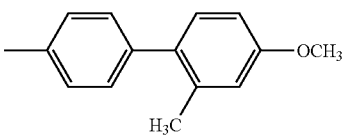 | —CH₂CH₂CH₂— | 0 | 1 | 4 |
*St = Structure, *B.P. = Binding Position.
TABLE 9
| *St | X | Ar | T | i | j | *B.P. |
|---|---|---|---|---|---|---|
| 32 | 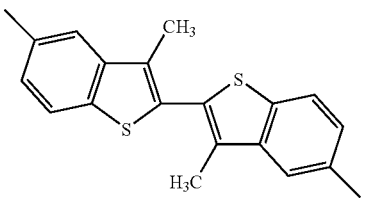 | 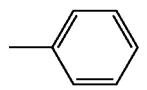 | —CH₂CH₂— | 0 | 1 | 4 |
| 33 | 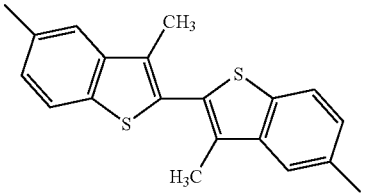 | 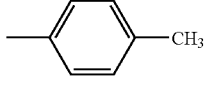 | —CH₂CH₂— | 0 | 1 | 4 |
| 34 | 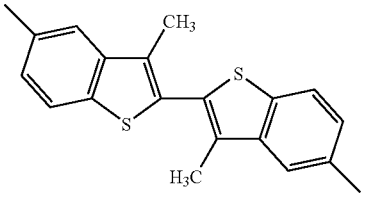 | 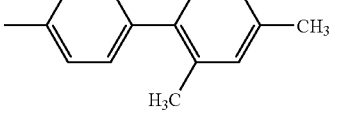 | —CH₂CH₂CH₂CH₂— | 0 | 1 | 4 |
| 35 | 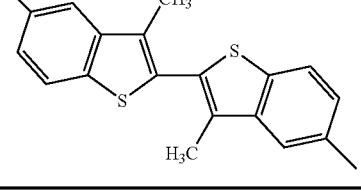 | 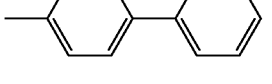 | —CH₂CH₂— | 0 | 1 | 4 |
*St = Structure, *B.P. = Binding Position.
TABLE 10
| *St | X | Ar | T | i | j | *B.P. |
|---|---|---|---|---|---|---|
| 36 | 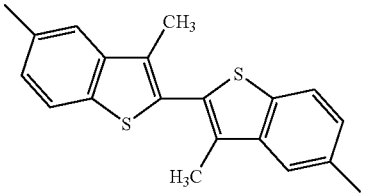 | 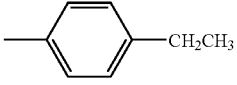 | —CH₂CH₂— | 0 | 1 | 3 |

TABLE 10-continued

| *St | X | Ar | T | i | j | *B.P. |
|---|---|---|---|---|---|---|
| 37 | (3,3'-dimethyl-5,5'-dimethyl-2,2'-bibenzothiophene) | 4-fluorophenyl | —CH$_2$CH$_2$— | 0 | 1 | 4 |
| 38 | (3,3'-dimethyl-5,5'-dimethyl-2,2'-bibenzothiophene) | 4-(9H-carbazol-9-yl)phenyl | —CH$_2$CH$_2$— | 0 | 1 | 4 |
| 39 | (3,3'-dimethyl-5,5'-dimethyl-2,2'-bibenzothiophene) | 9,9-dimethyl-9H-fluoren-2-yl | —CH$_2$CH$_2$— | 0 | 1 | 4 |

*St = Structure, *B.P. = Binding Position.

TABLE 11

| *St | X | Ar | T | i | j | *B.P. |
|---|---|---|---|---|---|---|
| 40 | (3,3'-dimethyl-5,5'-dimethyl-2,2'-bibenzothiophene) | 9,9-dihexyl-9H-fluoren-2-yl | —CH$_2$CH$_2$— | 0 | 1 | 4 |
| 41 | (3,3'-dimethyl-5,5'-dimethyl-2,2'-bibenzothiophene) | 9,9'-spirobi[fluoren]-2-yl | —CH$_2$CH$_2$— | 0 | 1 | 4 |
| 42 | (3,3'-dimethyl-5,5'-dimethyl-2,2'-bibenzothiophene) | 4-(3,3-diphenylprop-1-en-1-yl)phenyl | —CH$_2$C(CH$_3$)$_2$CH$_2$CH$_2$— | 0 | 1 | 4 |

TABLE 11-continued
| *St | X | Ar | T | i | j | *B.P. |
|---|---|---|---|---|---|---|
| 43 | 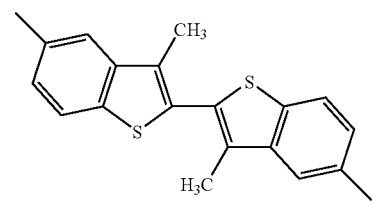 | 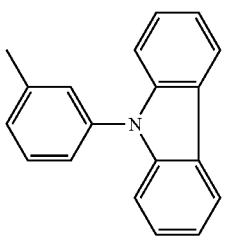 | —CH$_2$CH$_2$— | 0 | 1 | 4 |
*St = Structure, *B.P. = Binding Position.
TABLE 12
| *St | X | Ar | T | i | j | *B.P. |
|---|---|---|---|---|---|---|
| 44 | 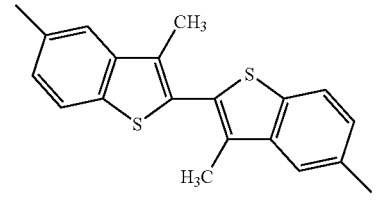 | 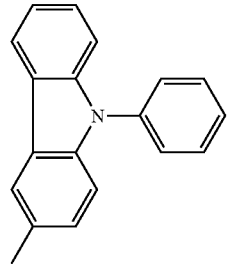 | —CH$_2$CH$_2$— | 0 | 1 | 4 |
| 45 | 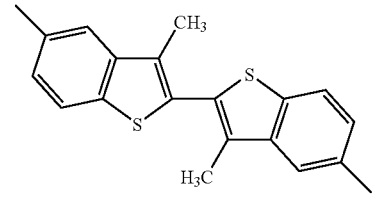 | 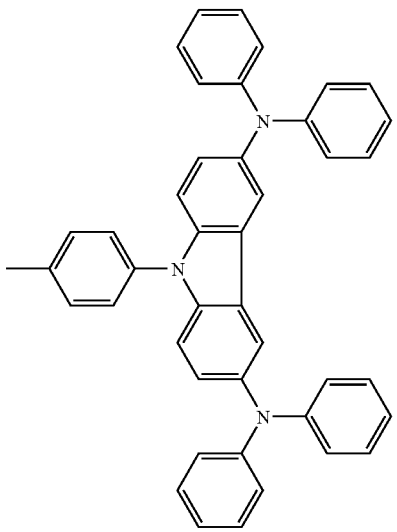 | —CH$_2$CH$_2$— | 1 | 0 | 4 |
| 46 | 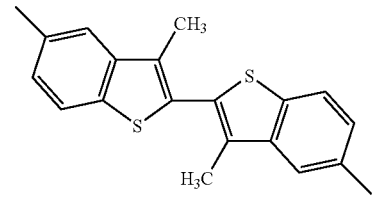 | 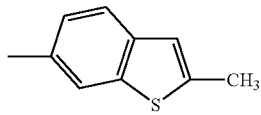 | —CH$_2$CH$_2$CH$_2$— | 0 | 1 | 4 |
*St = Structure, *B.P. = Binding Position.

TABLE 13

| *St | X | Ar | T | i | j | *B.P. |
|---|---|---|---|---|---|---|
| 47 | (benzothiophene dimer with CH3 groups) | (phenyl-silole) | —CH₂CH₂— | 0 | 1 | 4 |
| 48 | (benzothiophene dimer with CH3 groups) | (dibenzothiophene) | —CH₂CH₂— | 0 | 1 | 3 |
| 49 | (benzothiophene dimer with CH3 groups) | (biphenyl-diphenylamine) | —CH₂CH₂CH₂— | 0 | 1 | 4 |
| 50 | (benzothiophene dimer with CH3 groups) | (dimethyl-carbazole-tolyl) | —CH₂CHCH₂—<br>    \|<br>   CH₃ | 0 | 1 | 4 |

*St = Structure, *B.P. = Binding Position.

TABLE 14

| *St | X | Ar | T | i | j | *B.P. |
|---|---|---|---|---|---|---|
| 51 | (benzothiophene dimer with CH3 groups) | (tolyl-diphenylamine) | —CH₂CH₂— | 0 | 1 | 4 |
| 52 | (benzothiophene dimer with CH3 groups) | (phenyl-thiophene) | —CH₂CH₂— | 0 | 1 | 4 |

TABLE 14-continued

| *St | X | Ar | T | i | j | *B.P. |
|---|---|---|---|---|---|---|
| 53 | (structure) | (structure) | —CH₂CH₂CH₂CH₂CH₂— | 0 | 1 | 4 |
| 54 | (structure) | (structure) | —CH₂CH₂— | 0 | 1 | 4 |

*St = Structure, *B.P. = Binding Position.

TABLE 15

| *St | X | Ar | T | i | j | *B.P. |
|---|---|---|---|---|---|---|
| 55 | (structure) | (structure) | —CH₂CH₂— | 0 | 1 | 4 |
| 56 | (structure) | (structure) | —CH₂CH₂CH₂CH₂CH₂CH₂— | 0 | 1 | 4 |
| 57 | (structure) | (structure) | —CH₂CH₂CH₂CH₂CH₂— | 0 | 1 | 4 |
| 58 | (structure) | (structure) | —CH₂CH₂CH₂CH₂CH₂CH₂— | 0 | 1 | 4 |

*St = Structure, *B.P. = Binding Position.

TABLE 16

| *St | X | Ar | T | i | j | *B.P. |
|---|---|---|---|---|---|---|
| 59 | (benzothiophene dimer with CH3 groups) | (naphtho-selenopheno-naphthalene) | —CH2CH2CH2CH2CH2CH2— | 0 | 1 | 4 |
| 60 | (benzothiophene dimer with CH3 groups) | (thiazole-thiazole-selenophene-selenophene with hexyl) | —CH2CH(CH3)CH2CH2CH2CH2CH2— | 0 | 1 | 4 |
| 61 | (benzothiophene dimer with CH3 groups) | (ethyl-dimethylphenyl) | —CH2CH2— | 0 | 1 | 4 |
| 62 | (benzothiophene dimer with CH3 groups) | (methyl-biphenyl-OCH3) | —CH2CH2CH2— | 0 | 1 | 4 |

*St = Structure, *B.P. = Binding Position.

TABLE 17

| *St | X | Ar | T | i | j | *B.P. |
|---|---|---|---|---|---|---|
| 63 | (benzothiophene dimer with pentyl groups) | (phenyl) | —CH2CH2— | 0 | 1 | 4 |
| 64 | (benzothiophene dimer with pentyl groups) | (methylphenyl) | —CH2CH2— | 0 | 1 | 4 |
| 65 | (benzothiophene dimer with pentyl groups) | (dimethyl-biphenyl) | —CH2CH2CH2CH2— | 0 | 1 | 4 |

TABLE 17-continued
| *St | X | Ar | T | i | j | *B.P. |
|---|---|---|---|---|---|---|
| 66 | 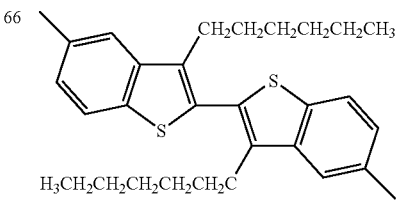 | 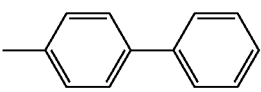 | —CH$_2$CH$_2$— | 0 | 1 | 4 |
*St = Structure, *B.P. = Binding Position.
TABLE 18
| *St | X | Ar | T | i | j | *B.P. |
|---|---|---|---|---|---|---|
| 67 | 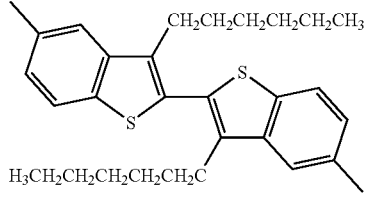 | 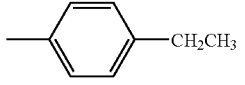 | —CH$_2$CH$_2$— | 0 | 1 | 4 |
| 68 | 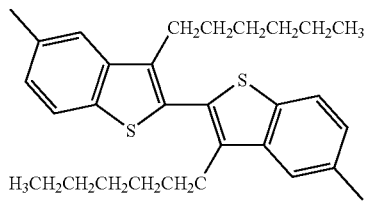 | 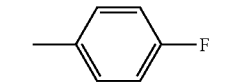 | —CH$_2$CH$_2$— | 0 | 1 | 4 |
| 69 | 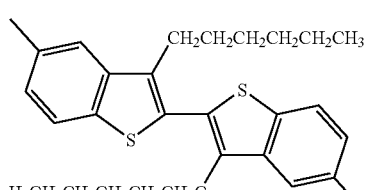 | 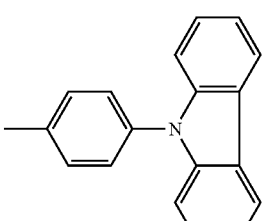 | —CH$_2$CH$_2$— | 0 | 1 | 4 |
| 70 | 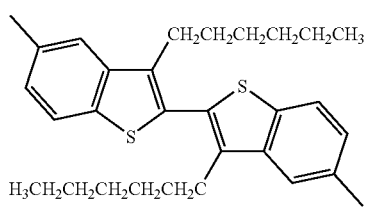 | 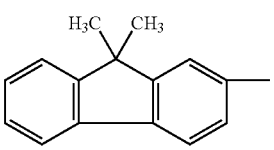 | —CH$_2$CH$_2$— | 0 | 1 | 4 |
*St = Structure,
*B.P. = Binding Position.

TABLE 19

| *St | X | Ar | T | i | j | *B.P. |
|---|---|---|---|---|---|---|
| 71 | (structure) | (structure) | —CH₂CH₂— | 0 | 1 | 4 |
| 72 | (structure) | (structure) | —CH₂CH₂— | 0 | 1 | 4 |
| 73 | (structure) | (structure) | —CH₂CH(CH₃)CH₂— | 0 | 1 | 4 |
| 74 | (structure) | (structure) | —CH₂CH₂— | 0 | 1 | 4 |

*St = Structure,
*B.P. = Binding Position.

TABLE 20

| *St | X | Ar | T | i | j | *B.P. |
|---|---|---|---|---|---|---|
| 75 | (structure) | (structure) | —CH₂CH₂— | 0 | 1 | 4 |

TABLE 20-continued
| *St | X | Ar | T | i | j | *B.P. |
|---|---|---|---|---|---|---|
| 76 | 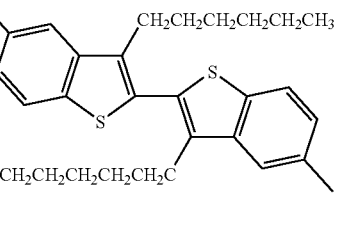 | 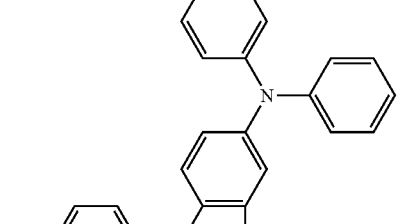 | —CH$_2$CH$_2$— | 1 | 0 | 4 |
| 77 |  | 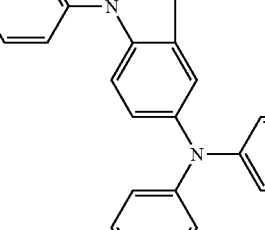 | —CH$_2$CH$_2$CH$_2$— | 0 | 1 | 4 |
*St = Structure,
*B.P. = Binding Position.
TABLE 21
| *St | X | Ar | T | i | j | *B.P. |
|---|---|---|---|---|---|---|
| 78 | | | —CH$_2$CH$_2$— | 0 | 1 | 4 |
| 79 | | | —CH$_2$CH$_2$— | 0 | 1 | 4 |
| 80 | | | —CH$_2$CH$_2$CH$_2$— | 0 | 1 | 4 |

TABLE 21-continued

| *St | X | Ar | T | i | j | *B.P. |
|---|---|---|---|---|---|---|
| 81 | [structure: 5-methyl-3-pentyl-benzothiophene linked to 3-pentyl-5-methyl-benzothiophene] | [structure: 3,6-dimethyl-9-(4-methylphenyl)carbazole] | —CH₂CHCH₂—<br>       \|<br>       CH₃ | 0 | 1 | 4 |

*St = Structure,
*B.P. = Binding Position.

TABLE 22

| *St | X | Ar |
|---|---|---|
| 82 | [structure: 5-methyl-3-pentyl-benzothiophene linked to 3-pentyl-5-methyl-benzothiophene] | [structure: 4-methyl-N,N-diphenylaniline] |
| 83 | [structure: 5-methyl-3-pentyl-benzothiophene linked to 3-pentyl-5-methyl-benzothiophene] | [structure: 4-methylphenyl-2-thienyl] |
| 84 | [structure: 5-methyl-3-pentyl-benzothiophene linked to 3-pentyl-5-methyl-benzothiophene] | [structure: quaterthiophene with hexyl chain] |
| 85 | [structure: 5-methyl-3-pentyl-benzothiophene linked to 3-pentyl-5-methyl-benzothiophene] | [structure: 4-methylphenyl-2-selenophene] |

| *St | T | i | j | *B.P. |
|---|---|---|---|---|
| 82 | —CH₂CH₂— | 0 | 1 | 4 |
| 83 | —CH₂CH₂— | 1 | 0 | 4 |
| 84 | —CH₂CH₂CH₂CH₂— | 0 | 1 | 4 |
| 85 | —CH₂CH₂— | 0 | 1 | 4 |

*St = Structure,
*B.P. = Binding Position.

TABLE 23

| *St | X | Ar | T | i | j | *B.P. |
|---|---|---|---|---|---|---|
| 86 | [structure: dibenzothiophene-like bis-benzothiophene with CH₂CH₂CH₂CH₂CH₂CH₃ and H₃CH₂CH₂CH₂CH₂CH₂C substituents] | [structure: phenyl-furan] | —CH₂CH₂— | 0 | 1 | 4 |
| 87 | [structure: bis-benzothiophene with pentyl substituents] | [structure: fused thienobenzothiophene] | —CH₂CH₂CH₂CH₂CH₂— | 0 | 1 | 4 |
| 88 | [structure: bis-benzothiophene with pentyl substituents] | [structure: fused benzoselenophene system] | —CH₂CH₂CH₂CH₂CH₂— | 0 | 1 | 4 |
| 89 | [structure: bis-benzothiophene with pentyl substituents] | [structure: dinaphtho-thienothiophene] | —CH₂CH₂CH₂CH₂CH₂— | 0 | 1 | 4 |

*St = Structure,
*B.P. = Binding Position.

TABLE 24

| *St | X | Ar |
|---|---|---|
| 90 | [structure: bis-benzothiophene with pentyl substituents] | [structure: dinaphtho-diselenophene] |
| 91 | [structure: bis-benzothiophene with pentyl substituents] | [structure: bis-thiazole-bis-selenophene with hexyl chain] |
| 92 | [structure: bis-benzothiophene with pentyl substituents] | [structure: 3,5-dimethyl-ethylbenzene] |

TABLE 24-continued

| | | *St | T | i | j | *B.P. |
|---|---|---|---|---|---|---|
| 93 | (structure) | | | | | |
| | | 90 | —CH₂CH₂CH₂CH₂CH₂— | 0 | 1 | 4 |
| | | 91 | —CH₂CH(CH₃)CH₂CH₂CH₂CH₂CH₂— | 0 | 1 | 4 |
| | | 92 | —CH₂CH₂— | 0 | 1 | 4 |
| | | 93 | —CH₂CH₂CH₂— | 0 | 1 | 4 |

*St = Structure,
*B.P. = Binding Position.

TABLE 25

| *St | X | Ar | T | i | j | *B.P. |
|---|---|---|---|---|---|---|
| 94 | (structure) | (structure) | —CH₂CH₂— | 0 | 1 | 4 |
| 95 | (structure) | (structure) | —CH₂CH₂— | 0 | 1 | 4 |
| 96 | (structure) | (structure) | —CH₂CH₂CH₂CH₂— | 0 | 1 | 3 |

TABLE 25-continued

| *St | X | Ar | T | i | j | *B.P. |
|---|---|---|---|---|---|---|
| 97 | (bis-benzothiophene with 5-methyl and 3-isopropyl substituents) | 4-biphenyl | —CH$_2$CH$_2$— | 0 | 1 | 4 |

*St = Structure,
*B.P. = Binding Position.

TABLE 26

| *St | X | Ar | T | i | j | *B.P. |
|---|---|---|---|---|---|---|
| 98 | (bis-benzothiophene with 5-methyl and 3-isopropyl substituents) | 4-ethylphenyl (—CH$_2$CH$_3$) | —CH$_2$CH$_2$— | 0 | 1 | 4 |
| 99 | (bis-benzothiophene with 5-methyl and 3-isopropyl substituents) | 4-fluorophenyl | —CH$_2$CH$_2$— | 0 | 1 | 4 |
| 100 | (bis-benzothiophene with 5-methyl and 3-isopropyl substituents) | 4-(9-carbazolyl)phenyl | —CH$_2$CH$_2$— | 0 | 1 | 4 |
| 101 | (bis-benzothiophene with 5-methyl and 3-isopropyl substituents) | 9,9-dimethylfluoren-2-yl | —CH$_2$CH$_2$— | 0 | 1 | 4 |

*St = Structure,
*B.P. = Binding Position.

TABLE 27

| *St | X | Ar | T | i | j | *B.P. |
|---|---|---|---|---|---|---|
| 102 | (bis-benzothiophene with isopropyl and methyl groups) | (9,9-dihexyl-2-methylfluorene) | —CH$_2$CH$_2$— | 0 | 1 | 4 |
| 103 | (bis-benzothiophene with isopropyl and methyl groups) | (methyl-spirobifluorene) | —CH$_2$CH$_2$— | 0 | 1 | 4 |
| 104 | (bis-benzothiophene with isopropyl and methyl groups) | (4-(2,2-diphenylvinyl)toluene) | —CH$_2$CH(CH$_3$)CH$_2$CH$_2$— | 0 | 1 | 4 |
| 105 | (bis-benzothiophene with isopropyl and methyl groups) | (9-(m-tolyl)carbazole) | —CH$_2$CH$_2$— | 0 | 1 | 4 |

*St = Structure,
*B.P. = Binding Position.

TABLE 28

| *St | X | Ar | T | i | j | *B.P. |
|---|---|---|---|---|---|---|
| 106 | (bis-benzothiophene with isopropyl and methyl groups) | (9-phenyl-3-methylcarbazole) | —CH$_2$CH$_2$— | 0 | 1 | 4 |

TABLE 28-continued

| *St | X | Ar | T | i | j | *B.P. |
|---|---|---|---|---|---|---|
| 107 | (structure) | (structure) | —CH₂CH₂— | 1 | 0 | 4 |
| 108 | (structure) | (structure) | —CH₂CH₂CH₂— | 0 | 1 | 4 |

*St = Structure,
*B.P. = Binding Position.

TABLE 29

| *St | X | Ar | T | i | j | *B.P. |
|---|---|---|---|---|---|---|
| 109 | (structure) | (structure) | —CH₂CH₂— | 0 | 1 | 4 |
| 110 | (structure) | (structure) | —CH₂CH₂— | 0 | 1 | 4 |

TABLE 29-continued

| *St | X | Ar | T | i | j | *B.P. |
|---|---|---|---|---|---|---|
| 111 | [structure: 5-methyl-3-isopropylbenzothiophene dimer with isopropyl and methyl substituents] | [structure: biphenyl-N,N-diphenylamine] | —CH₂CH₂CH₂— | 0 | 1 | 4 |
| 112 | [structure: 5-methyl-3-isopropylbenzothiophene dimer with isopropyl and methyl substituents] | [structure: 3,6-dimethyl-9-(p-tolyl)carbazole] | —CH₂CHCH₂—<br>          \|<br>          CH₃ | 0 | 1 | 4 |

*St = Structure,
*B.P. = Binding Position.

TABLE 30

| *St | X | Ar |
|---|---|---|
| 113 | [structure: 5-methyl-3-isopropylbenzothiophene dimer with isopropyl and methyl substituents] | [structure: p-tolyl-N,N-diphenylamine] |
| 114 | [structure: 5-methyl-3-isopropylbenzothiophene dimer with isopropyl and methyl substituents] | [structure: 4-(2-thienyl)toluene] |
| 115 | [structure: 5-methyl-3-isopropylbenzothiophene dimer with isopropyl and methyl substituents] | [structure: 5-hexyl-5'''-methyl-2,2':5',2'':5'',2'''-quaterthiophene] |

TABLE 30-continued

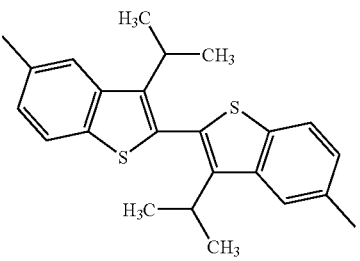
116

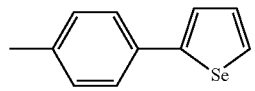

| *St | T | i | j | *B.P. |
|---|---|---|---|---|
| 113 | —CH₂CH₂— | 0 | 1 | 4 |
| 114 | —CH₂CH₂— | 1 | 0 | 4 |
| 115 | —CH₂CH₂CH₂CH₂CH₂— | 0 | 1 | 4 |
| 116 | —CH₂CH₂— | 0 | 1 | 4 |

*St = Structure,
*B.P. = Binding Position.

TABLE 31

| *St | X | Ar | T | i | j | *B.P. |
|---|---|---|---|---|---|---|
| 117 | (bis-methylbenzothiophene with isopropyl groups) | (p-tolyl-furan) | —CH₂CH₂— | 0 | 1 | 4 |
| 118 | (bis-methylbenzothiophene with isopropyl groups) | (benzothieno-benzothiophene) | —CH₂CH₂CH₂CH₂CH₂CH₂— | 0 | 1 | 4 |
| 119 | (bis-methylbenzothiophene with isopropyl groups) | (benzoselenopheno-benzoselenophene) | —CH₂CH₂CH₂CH₂CH₂CH₂— | 0 | 1 | 4 |

TABLE 31-continued

| *St | X | Ar | T | i | j | *B.P. |
|---|---|---|---|---|---|---|
| 120 | (structure) | (structure) | —CH$_2$CH$_2$CH$_2$CH$_2$CH$_2$— | 0 | 1 | 4 |

*St = Structure,
*B.P. = Binding Position.

TABLE 32

| *St | X | Ar |
|---|---|---|
| 121 | (structure) | (structure) |
| 122 | (structure) | (structure) |
| 123 | (structure) | (structure) |
| 124 | (structure) | (structure) |

TABLE 32-continued

| *St | T | i | j | *B.P. |
|---|---|---|---|---|
| 121 | —CH$_2$CH$_2$CH$_2$CH$_2$CH$_2$CH$_2$— | 0 | 1 | 4 |
| 122 | —CH$_2$C(CH$_3$)(H)CH$_2$CH$_2$CH$_2$CH$_2$CH$_2$— | 0 | 1 | 4 |
| 123 | —CH$_2$CH$_2$— | 0 | 1 | 4 |
| 124 | —CH$_2$CH$_2$CH$_2$— | 0 | 1 | 4 |

*St = Structure,
*B.P. = Binding Position.

Specific examples of the structure represented by Formula (II-2) (structure number 201 to 324) are shown in the following Tables 33 to 64.

TABLE 33

| *St | X | Ar | T | i | j | *B.P. |
|---|---|---|---|---|---|---|
| 201 | (bis-benzothiophene) | (phenyl) | —CH$_2$CH$_2$— | 0 | 1 | 4,4' |
| 202 | (bis-benzothiophene) | (4-methylphenyl) | —CH$_2$CH$_2$— | 0 | 1 | 4,4' |
| 203 | (bis-benzothiophene) | (dimethylbiphenyl) | —CH$_2$CH$_2$CH$_2$CH$_2$— | 0 | 1 | 4,4' |
| 204 | (bis-benzothiophene) | (biphenyl) | —CH$_2$CH$_2$— | 0 | 1 | 4,4' |

*St = Structure,
*B.P. = Binding Position.

TABLE 34
| *St | X | Ar | T | i | j | *.B.P. |
|---|---|---|---|---|---|---|
| 205 | 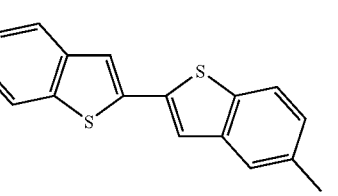 | 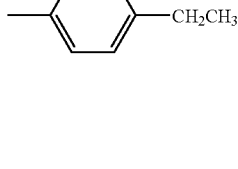 | —CH$_2$CH$_2$— | 0 | 1 | 4,4' |
| 206 | 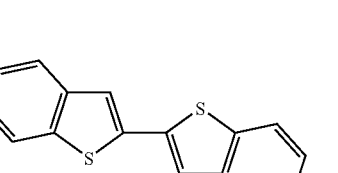 | 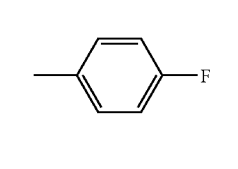 | —CH$_2$CH$_2$— | 0 | 1 | 4,4' |
| 207 | 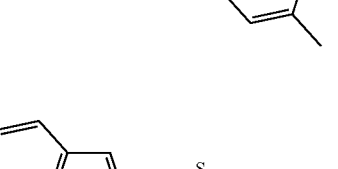 | 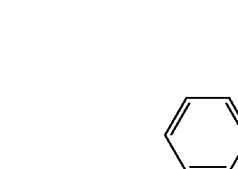 | —CH$_2$CH$_2$— | 0 | 1 | 4,4' |
| 208 | 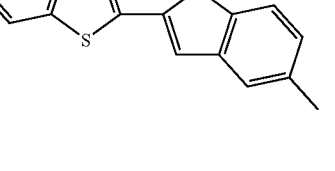 | 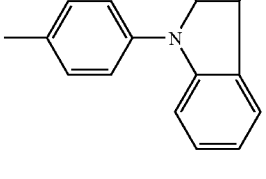 | —CH$_2$CH$_2$— | 0 | 1 | 4,4' |
*St = Structure,
*B.P. = Binding Position.
TABLE 35
| *St | X | Ar | T | i | j | *.B.P. |
|---|---|---|---|---|---|---|
| 209 |  | 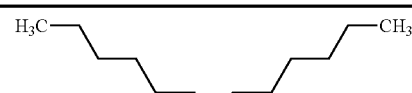 | —CH$_2$CH$_2$— | 0 | 1 | 4,4' |
| 210 | 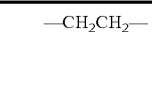 |  | —CH$_2$CH$_2$— | 0 | 1 | 4,4' |

TABLE 35-continued

| *St | X | Ar | T | i | j | *.B.P. |
|---|---|---|---|---|---|---|
| 211 | (structure) | (structure) | —CH₂C(CH₃)₂CH₂— | 0 | 1 | 4,4' |
| 212 | (structure) | (structure) | —CH₂CH₂— | 0 | 1 | 4,4' |

*St = Structure,
*B.P. = Binding Position.

TABLE 36

| *St | X | Ar | T | i | j | *B.P. |
|---|---|---|---|---|---|---|
| 213 | (structure) | (structure) | —CH₂CH₂— | 0 | 1 | 4,4' |
| 214 | (structure) | (structure) | —CH₂CH₂— | 1 | 0 | 4,4' |

TABLE 36-continued

| *St | X | Ar | T | i | j | *B.P. |
|---|---|---|---|---|---|---|
| 215 | (structure) | (structure) | —CH₂CH₂CH₂— | 0 | 1 | 4,4' |

*St = Structure,
*B.P. = Binding Position.

TABLE 37

| *St | X | Ar | T | i | j | *B.P. |
|---|---|---|---|---|---|---|
| 216 | (structure) | (structure) | —CH₂CH₂— | 0 | 1 | 4,4' |
| 217 | (structure) | (structure) | —CH₂CH₂— | 0 | 1 | 4,4' |
| 218 | (structure) | (structure) | —CH₂CH₂CH₂— | 0 | 1 | 4,4' |
| 219 | (structure) | (structure) | —CH₂CHCH₂—<br>\|<br>CH₃ | 0 | 1 | 4,4' |

*St = Structure,
*B.P. = Binding Position.

TABLE 38
| *St | X | Ar |
|---|---|---|
| 220 | 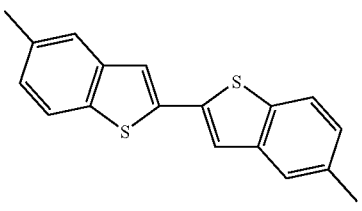 | 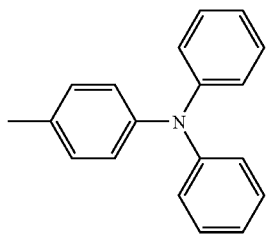 |
| 221 | 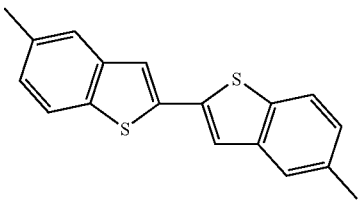 | 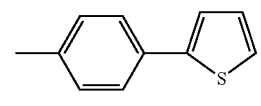 |
| 222 | 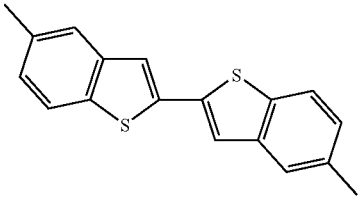 | 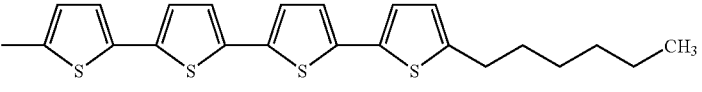 |
| 223 | 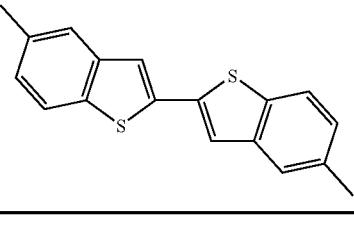 | 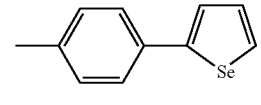 |
| *St | T | i | j | *B.P. |
|---|---|---|---|---|
| 220 | —CH$_2$CH$_2$— | 0 | 1 | 4,4' |
| 221 | —CH$_2$CH$_2$— | 0 | 1 | 4,4' |
| 222 | —CH$_2$CH$_2$CH$_2$CH$_2$CH$_2$— | 0 | 1 | 4,4' |
| 223 | —CH$_2$CH$_2$— | 0 | 1 | 4,4' |
*St = Structure,
*B.P. = Binding Position.
TABLE 39
| *St | X | Ar | T | i | j | *B.P. |
|---|---|---|---|---|---|---|
| 224 | 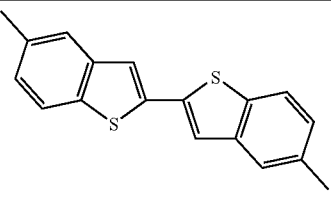 | 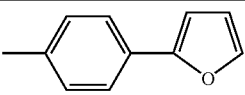 | —CH$_2$CH$_2$— | 0 | 1 | 4,4' |
| 225 | 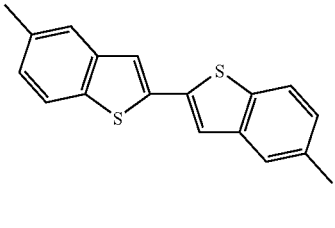 | 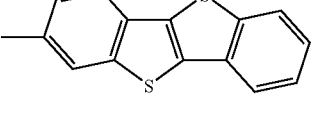 | —CH$_2$CH$_2$CH$_2$CH$_2$CH$_2$CH$_2$— | 0 | 1 | 4,4' |

TABLE 39-continued

| *St | X | Ar | T | i | j | *B.P. |
|---|---|---|---|---|---|---|
| 226 | | | —CH$_2$CH$_2$CH$_2$CH$_2$CH$_2$CH$_2$— | 0 | 1 | 4,4' |
| 227 | | | —CH$_2$CH$_2$CH$_2$CH$_2$CH$_2$CH$_2$— | 0 | 1 | 4,4' |

*St = Structure,
*B.P. = Binding Position.

TABLE 40

| *St | X | Ar |
|---|---|---|
| 228 | | |
| 229 | | |
| 230 | | |
| 231 | | |

| *St | T | i | j | *B.P. |
|---|---|---|---|---|
| 228 | —CH$_2$CH$_2$CH$_2$CH$_2$CH$_2$CH$_2$— | 0 | 1 | 4,4' |
| 229 | $-\mathrm{CH_2CH(CH_3)CH_2CH_2CH_2CH_2CH_2}-$ | 0 | 1 | 4,4' |

TABLE 40-continued

| | | | | | |
|---|---|---|---|---|---|
| 230 | —CH₂CH₂— | | 0 | 1 | 4,4' |
| 231 | —CH₂CH₂CH₂— | | 0 | 1 | 4,4' |

*St = Structure,
*B.P. = Binding Position.

TABLE 41

| *St | X | Ar | T | i | j | *B.P. |
|---|---|---|---|---|---|---|
| 232 | (structure) | (phenyl) | —CH₂CH₂— | 0 | 1 | 4,4' |
| 233 | (structure) | (tolyl) | —CH₂CH₂— | 0 | 1 | 4,4' |
| 234 | (structure) | (biphenyl with CH₃ groups) | —CH₂CH₂CH₂CH₂— | 0 | 1 | 4,4' |
| 235 | (structure) | (biphenyl) | —CH₂CH₂— | 0 | 1 | 4,4' |

*St = Structure,
*B.P. = Binding Position.

TABLE 42

| *St | X | Ar | T | i | j | *B.P. |
|---|---|---|---|---|---|---|
| 236 | (structure) | (p-ethylphenyl) | —CH₂CH₂— | 0 | 1 | 4,4' |

TABLE 42-continued

| *St | X | Ar | T | i | j | *B.P. |
|---|---|---|---|---|---|---|
| 237 | (structure) | 4-fluorophenyl | —CH₂CH₂— | 0 | 1 | 4,4' |
| 238 | (structure) | 4-(9H-carbazol-9-yl)phenyl | —CH₂CH₂— | 0 | 1 | 3,3' |
| 239 | (structure) | 9,9-dimethylfluoren-2-yl | —CH₂CH₂— | 0 | 1 | 4,4' |

*St = Structure,
*B.P. = Binding Position.

TABLE 43

| *St | X | Ar | T | i | j | *B.P. |
|---|---|---|---|---|---|---|
| 240 | (structure) | 9,9-dihexylfluoren-2-yl | —CH₂CH₂— | 0 | 1 | 4,4' |
| 241 | (structure) | 9,9'-spirobifluoren-2-yl | —CH₂CH₂— | 0 | 1 | 4,4' |
| 242 | (structure) | 4-(2,2-diphenylvinyl)phenyl | —CH₂C(CH₃)₂CH₂— | 0 | 1 | 4,4' |

TABLE 43-continued

| *St | X | Ar | T | i | j | *B.P. |
|---|---|---|---|---|---|---|
| 243 | (structure) | (structure) | —CH$_2$CH$_2$— | 0 | 1 | 4,4' |

*St = Structure,
*B.P. = Binding Position.

TABLE 44

| *St | X | Ar | T | i | j | *B.P. |
|---|---|---|---|---|---|---|
| 244 | (structure) | (structure) | —CH$_2$CH$_2$— | 0 | 1 | 4,4' |
| 245 | (structure) | (structure) | —CH$_2$CH$_2$— | 1 | 0 | 4,4' |
| 246 | (structure) | (structure) | —CH$_2$CH$_2$CH$_2$— | 0 | 1 | 4,4' |

*St = Structure,
*B.P. = Binding Position.

TABLE 45

| *St | X | Ar | T | i | j | *B.P. |
|---|---|---|---|---|---|---|
| 247 | [bis-benzothiophene with CH3 groups] | [tolyl-silole-thiophene] | —CH₂CH₂— | 0 | 1 | 4, 4' |
| 248 | [bis-benzothiophene with CH3 groups] | [methyl-dibenzothiophene] | —CH₂CH₂— | 0 | 1 | 4, 4' |
| 249 | [bis-benzothiophene with CH3 groups] | [tolyl-biphenyl-diphenylamine] | —CH₂CH₂CH₂— | 0 | 1 | 4, 4' |
| 250 | [bis-benzothiophene with CH3 groups] | [dimethyl-carbazole-N-tolyl] | —CH₂CHCH₂— with CH₃ | 0 | 1 | 4, 4' |

*St = Structure,
*B.P. = Binding Position.

TABLE 46

| *St | X | Ar |
|---|---|---|
| 251 | [bis-benzothiophene with CH3 groups] | [tolyl-triphenylamine] |
| 252 | [bis-benzothiophene with CH3 groups] | [tolyl-thiophene] |

TABLE 46-continued
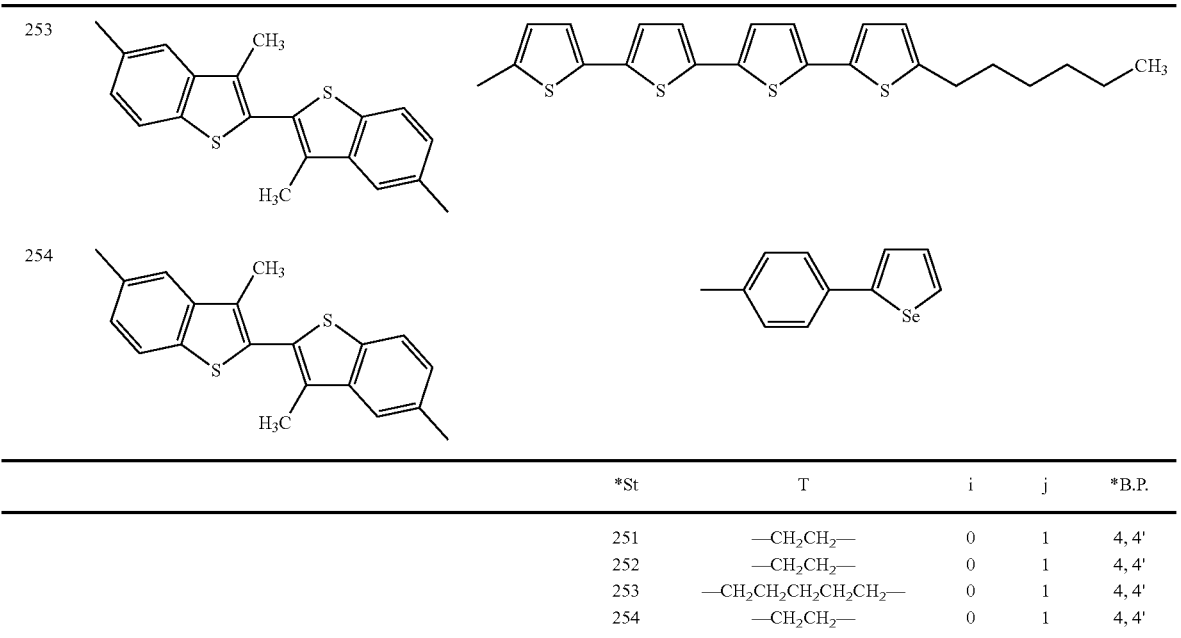
| *St | T | i | j | *B.P. |
|---|---|---|---|---|
| 251 | —CH₂CH₂— | 0 | 1 | 4, 4' |
| 252 | —CH₂CH₂— | 0 | 1 | 4, 4' |
| 253 | —CH₂CH₂CH₂CH₂CH₂— | 0 | 1 | 4, 4' |
| 254 | —CH₂CH₂— | 0 | 1 | 4, 4' |
*St = Structure,
*B.P. = Binding Position.
TABLE 47
| *St | X | Ar | T | i | j | *B.P. |
|---|---|---|---|---|---|---|
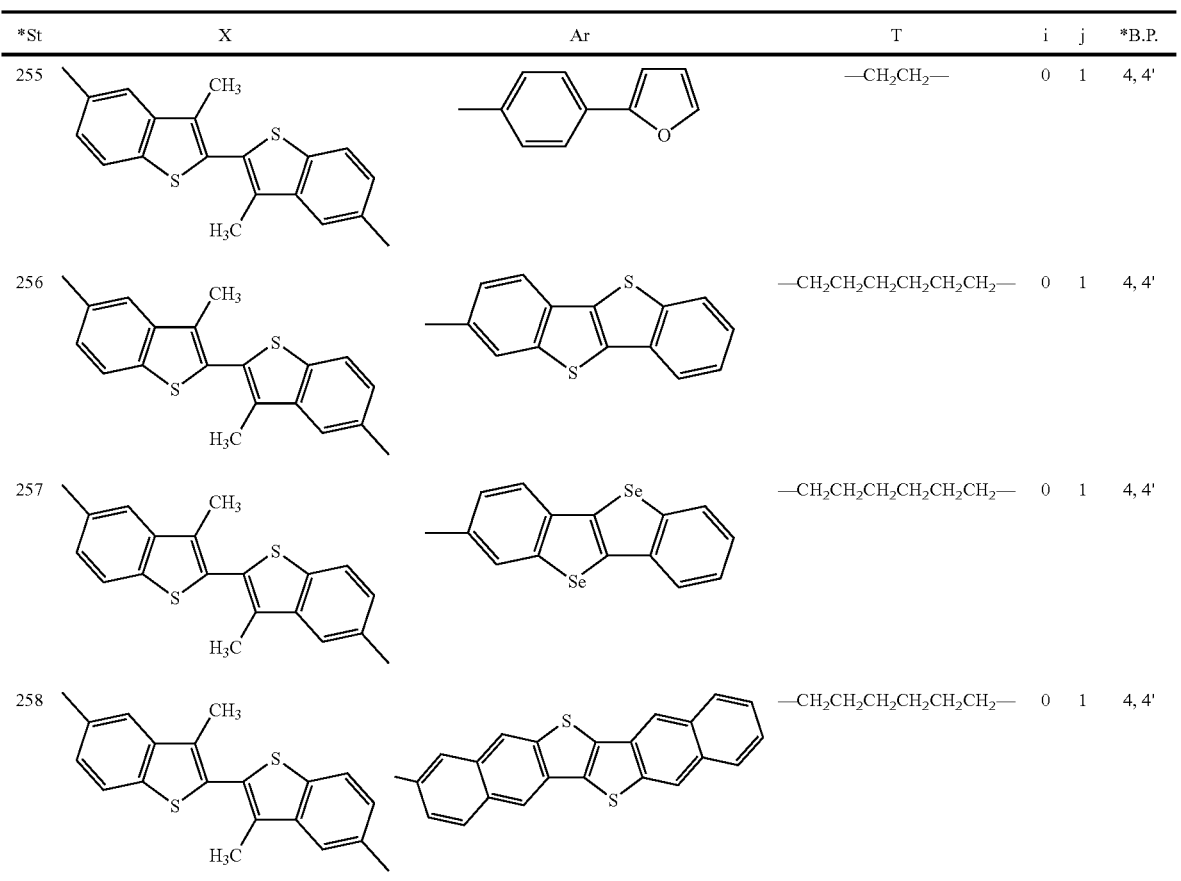
*St = Structure,
*B.P. = Binding Position.

TABLE 48
| *St | X | Ar |
|---|---|---|
| 259 | 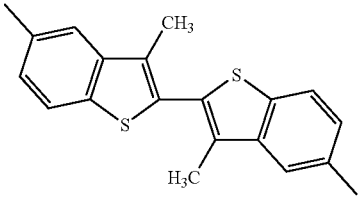 | 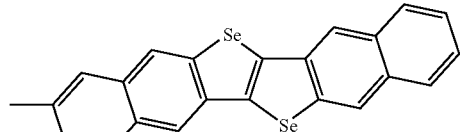 |
| 260 | 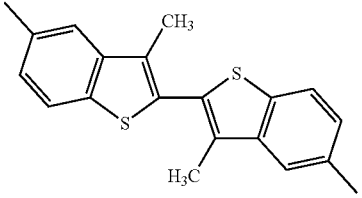 | 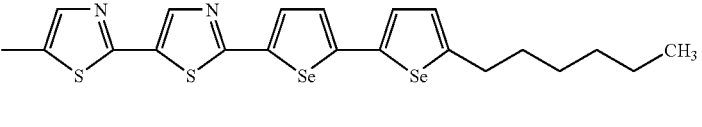 |
| 261 | 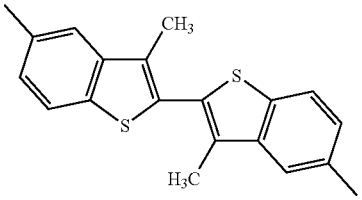 | 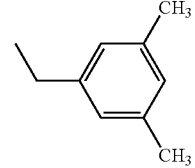 |
| 262 | 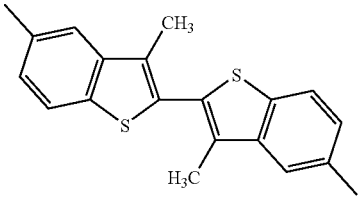 | 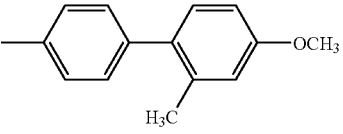 |
| *St | T | i | j | *B.P. |
|---|---|---|---|---|
| 259 | —CH$_2$CH$_2$CH$_2$CH$_2$CH$_2$CH$_2$— | 0 | 1 | 4, 4' |
| 260 | —CH$_2$CH(CH$_3$)CH$_2$CH$_2$CH$_2$CH$_2$CH$_2$CH$_2$— | 0 | 1 | 4, 4' |
| 261 | —CH$_2$CH$_2$— | 0 | 1 | 4, 4' |
| 262 | —CH$_2$CH$_2$CH$_2$— | 0 | 1 | 4, 4' |
*St = Structure,
*B.P. = Binding Position.
TABLE 49
| *St | X | Ar | T | i | j | *B.P. |
|---|---|---|---|---|---|---|
| 263 | 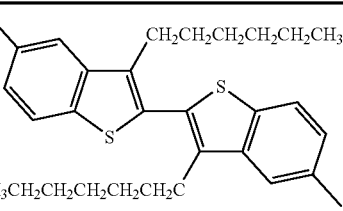 | 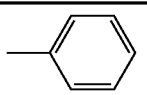 | —CH$_2$CH$_2$— | 0 | 1 | 4, 4' |

TABLE 49-continued

| *St | X | Ar | T | i | j | *B.P. |
|---|---|---|---|---|---|---|
| 264 | (bis-benzothiophene with 5-methyl and 3-pentyl substituents) | 4-methylphenyl | —CH₂CH₂— | 0 | 1 | 4, 4' |
| 265 | (bis-benzothiophene with 5-methyl and 3-pentyl substituents) | 2,4'-dimethylbiphenyl | —CH₂CH₂CH₂CH₂— | 0 | 1 | 4, 4' |
| 266 | (bis-benzothiophene with 5-methyl and 3-pentyl substituents) | biphenyl | —CH₂CH₂— | 0 | 1 | 4, 4' |

*St = Structure,
*B.P. = Binding Position.

TABLE 50

| *St | X | Ar | T | i | j | *B.P. |
|---|---|---|---|---|---|---|
| 267 | (bis-benzothiophene with 5-methyl and 3-pentyl substituents) | 4-ethylphenyl | —CH₂CH₂— | 0 | 1 | 4, 4' |
| 268 | (bis-benzothiophene with 5-methyl and 3-pentyl substituents) | 4-fluorophenyl | —CH₂CH₂— | 0 | 1 | 4, 4' |
| 269 | (bis-benzothiophene with 5-methyl and 3-pentyl substituents) | 4-(carbazol-9-yl)phenyl | —CH₂CH₂— | 0 | 1 | 4, 4' |

TABLE 50-continued

| *St | X | Ar | T | i | j | *B.P. |
|---|---|---|---|---|---|---|
| 270 | (bis-benzothiophene with 5-CH₃, 3-CH₂CH₂CH₂CH₂CH₃ substituents) | 9,9-dimethyl-2-methylfluorene | —CH₂CH₂— | 0 | 1 | 4, 4' |

*St = Structure,
*B.P. = Binding Position.

TABLE 51

| *St | X | Ar | T | i | j | *B.P. |
|---|---|---|---|---|---|---|
| 271 | (bis-benzothiophene with 5-CH₃, 3-CH₂CH₂CH₂CH₂CH₃ substituents) | 9,9-dihexyl-2-methylfluorene | —CH₂CH₂— | 0 | 1 | 4, 4' |
| 272 | (bis-benzothiophene with 5-CH₃, 3-CH₂CH₂CH₂CH₂CH₃ substituents) | 2-methyl-9,9'-spirobifluorene | —CH₂CH₂— | 0 | 1 | 4, 4' |
| 273 | (bis-benzothiophene with 5-CH₃, 3-CH₂CH₂CH₂CH₂CH₃ substituents) | 4-methyl-(3,3-diphenylallyl)benzene | —CH₂C(CH₃)₂CH₂— | 0 | 1 | 4, 4' |
| 274 | (bis-benzothiophene with 5-CH₃, 3-CH₂CH₂CH₂CH₂CH₃ substituents) | 9-(3-methylphenyl)carbazole | —CH₂CH₂— | 0 | 1 | 4, 4' |

*St = Structure,
*B.P. = Binding Position.

TABLE 52

| *St | X | Ar | T | i | j | *B.P. |
|---|---|---|---|---|---|---|
| 275 | (bis-benzothiophene with pentyl and methyl substituents) | N-phenyl carbazole with methyl | —CH$_2$CH$_2$— | 0 | 1 | 4, 4' |
| 276 | (bis-benzothiophene with pentyl and methyl substituents) | carbazole with two diphenylamino groups and tolyl | —CH$_2$CH$_2$— | 1 | 0 | 4, 4' |
| 277 | (bis-benzothiophene with pentyl and methyl substituents) | methyl-benzothiophene with methyl | —CH$_2$CH$_2$CH$_2$— | 0 | 1 | 4, 4' |

*St = Structure,
*B.P. = Binding Position.

TABLE 53

| *St | X | Ar | T | i | j | *B.P. |
|---|---|---|---|---|---|---|
| 278 | (bis-benzothiophene with pentyl and methyl substituents) | tolyl-silole-thiophene | —CH$_2$CH$_2$— | 0 | 1 | 4, 4' |

TABLE 53-continued

| *St | X | Ar | T | i | j | *B.P. |
|---|---|---|---|---|---|---|
| 279 | (structure) | (structure) | —CH₂CH₂— | 0 | 1 | 4, 4' |
| 280 | (structure) | (structure) | —CH₂CH₂CH₂— | 0 | 1 | 4, 4' |
| 281 | (structure) | (structure) | —CH₂CHCH₂—  $\vert$  CH₃ | 0 | 1 | 4, 4' |

*St = Structure,
*B.P. = Binding Position.

TABLE 54

| *St | X | Ar |
|---|---|---|
| 282 | (structure) | (structure) |
| 283 | (structure) | (structure) |
| 284 | (structure) | (structure) |

TABLE 54-continued
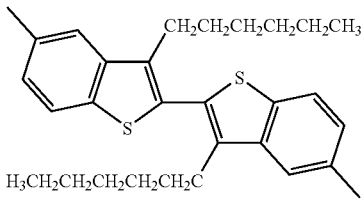
285
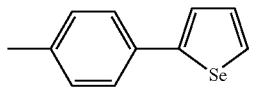
| *St | T | i | j | *BP |
|---|---|---|---|---|
| 282 | —CH₂CH₂— | 0 | 1 | 4, 4' |
| 283 | —CH₂CH₂— | 1 | 0 | 4, 4' |
| 284 | —CH₂CH₂CH₂CH₂CH₂— | 0 | 1 | 4, 4' |
| 285 | —CH₂CH₂— | 0 | 1 | 3, 3' |
*St = Structure,
*B.P. = Binding Position.
TABLE 55
| *St | X | Ar | T | i | j | *B.P. |
|---|---|---|---|---|---|---|
| 286 | (structure) | (structure) | —CH₂CH₂— | 0 | 1 | 4, 4' |
| 287 | (structure) | (structure) | —CH₂CH₂CH₂CH₂CH₂— | 0 | 1 | 4, 4' |
| 288 | (structure) | (structure) | —CH₂CH₂CH₂CH₂CH₂— | 0 | 1 | 4, 4' |
| 289 | (structure) | (structure) | —CH₂CH₂CH₂CH₂CH₂— | 0 | 1 | 4, 4' |
*St = Structure,
*B.P. = Binding Position.

TABLE 56

| *St | X | Ar |
|---|---|---|
| 290 | (bis-benzothiophene with 5-methyl and 3-pentyl substituents) | (methylnaphtho-selenophene-naphtho-selenophene fused system) |
| 291 | (bis-benzothiophene with 5-methyl and 3-pentyl substituents) | (methyl-thiazole-thiazole-selenophene-selenophene-hexyl) |
| 292 | (bis-benzothiophene with 5-methyl and 3-pentyl substituents) | (3,5-dimethyl-ethylbenzene) |
| 293 | (bis-benzothiophene with 5-methyl and 3-pentyl substituents) | (methyl-biphenyl with OCH$_3$ and CH$_3$ substituents) |

| *St | T | i | j | *BP |
|---|---|---|---|---|
| 290 | —CH$_2$CH$_2$CH$_2$CH$_2$CH$_2$CH$_2$— | 0 | 1 | 4, 4' |
| 291 | —CH$_2$CH(CH$_3$)CH$_2$CH$_2$CH$_2$CH$_2$CH$_2$— | 0 | 1 | 4, 4' |
| 292 | —CH$_2$CH$_2$— | 0 | 1 | 4, 4' |
| 293 | —CH$_2$CH$_2$CH$_2$— | 0 | 1 | 4, 4' |

*St = Structure,
*B.P. = Binding Position.

TABLE 57

| *St | X | Ar | T | i | j | *B.P. |
|---|---|---|---|---|---|---|
| 294 | (bis-benzothiophene with 5-methyl and 3-isopropyl substituents) | (methylphenyl) | —CH$_2$CH$_2$— | 0 | 1 | 3, 3' |

TABLE 57-continued

| *St | X | Ar | T | i | j | *B.P. |
|---|---|---|---|---|---|---|
| 295 | (5-methyl-3-isopropyl-benzothiophene)-2-(5-methyl-3-isopropyl-benzothiophene) | 4-methylphenyl | —CH₂CH₂— | 0 | 1 | 4, 4' |
| 296 | (5-methyl-3-isopropyl-benzothiophene)-2-(5-methyl-3-isopropyl-benzothiophene) | 2-methyl-4'-methylbiphenyl | —CH₂CH₂CH₂CH₂— | 0 | 1 | 4, 4' |
| 297 | (5-methyl-3-isopropyl-benzothiophene)-2-(5-methyl-3-isopropyl-benzothiophene) | biphenyl | —CH₂CH₂— | 0 | 1 | 4, 4' |

*St = Structure,
*B.P. = Binding Position.

TABLE 58

| *St | X | Ar | T | i | j | *B.P. |
|---|---|---|---|---|---|---|
| 298 | (5-methyl-3-isopropyl-benzothiophene)-2-(5-methyl-3-isopropyl-benzothiophene) | 4-ethylphenyl | —CH₂CH₂— | 0 | 1 | 4, 4' |
| 299 | (5-methyl-3-isopropyl-benzothiophene)-2-(5-methyl-3-isopropyl-benzothiophene) | 4-fluorophenyl | —CH₂CH₂— | 0 | 1 | 4, 4' |

TABLE 58-continued

| *St | X | Ar | T | i | j | *B.P. |
|---|---|---|---|---|---|---|
| 300 | (benzothiophene dimer with methyl and isopropyl substituents) | 4-methylphenyl-N-carbazole | —CH₂CH₂— | 0 | 1 | 3, 3' |
| 301 | (benzothiophene dimer with methyl and isopropyl substituents) | 9,9-dimethyl-2-methylfluorene | —CH₂CH₂— | 0 | 1 | 4, 4' |

*St = Structure,
*B.P. = Binding Position.

TABLE 59

| *St | X | Ar | T | i | j | *B.P. |
|---|---|---|---|---|---|---|
| 302 | (benzothiophene dimer with methyl and isopropyl substituents) | 9,9-dihexyl-2-methylfluorene | —CH₂CH₂— | 0 | 1 | 4, 4' |
| 303 | (benzothiophene dimer with methyl and isopropyl substituents) | 2-methyl-9,9'-spirobifluorene | —CH₂CH₂— | 0 | 1 | 4, 4' |
| 304 | (benzothiophene dimer with methyl and isopropyl substituents) | 4-methylstyryl-diphenylmethane | —CH₂C(CH₃)(CH₃)CH₂— | 0 | 1 | 4, 4' |

TABLE 59-continued

| *St | X | Ar | T | i | j | *B.P. |
|---|---|---|---|---|---|---|
| 305 | (5-methyl-3-isopropylbenzothiophene)-(5-methyl-3-isopropylbenzothiophene) linked at 2,2' | N-(3-methylphenyl)carbazole | —CH$_2$CH$_2$— | 0 | 1 | 4, 4' |

*St = Structure,
*B.P. = Binding Position.

TABLE 60

| *St | X | Ar | T | i | j | *B.P. |
|---|---|---|---|---|---|---|
| 306 | (5-methyl-3-isopropylbenzothiophene)-(5-methyl-3-isopropylbenzothiophene) linked at 2,2' | 3-methyl-9-phenylcarbazole | —CH$_2$CH$_2$— | 0 | 1 | 4, 4' |
| 307 | (5-methyl-3-isopropylbenzothiophene)-(5-methyl-3-isopropylbenzothiophene) linked at 2,2' | 9-(p-tolyl)-3,6-bis(diphenylamino)carbazole | —CH$_2$CH$_2$— | 1 | 0 | 4, 4' |
| 308 | (5-methyl-3-isopropylbenzothiophene)-(5-methyl-3-isopropylbenzothiophene) linked at 2,2' | 2-methyl-6-methylbenzothiophene | —CH$_2$CH$_2$CH$_2$— | 0 | 1 | 4, 4' |

*St = Structure,
*B.P. = Binding Position.

TABLE 61

| *St | X | Ar | T | i | j | *B.P. |
|---|---|---|---|---|---|---|
| 309 | (structure) | (4-methylphenyl-2-silyl-thiophene) | —CH₂CH₂— | 0 | 1 | 4, 4' |
| 310 | (structure) | (methyl-dibenzothiophene) | —CH₂CH₂— | 0 | 1 | 4, 4' |
| 311 | (structure) | (methyl-biphenyl-N,N-diphenylamine) | —CH₂CH₂CH₂— | 0 | 1 | 4, 4' |
| 312 | (structure) | (3,6-dimethyl-9-(4-methylphenyl)carbazole) | —CH₂CHCH₂— with CH₃ | 0 | 1 | 4, 4' |

*St = Structure,
*B.P. = Binding Position.

TABLE 62

| *St | X | Ar |
|---|---|---|
| 313 | (structure) | (4-methylphenyl-N,N-diphenylamine) |

TABLE 62-continued
| | | |
|---|---|---|
| 314 | 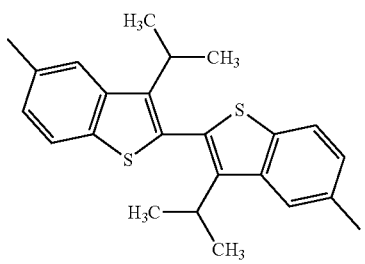 | 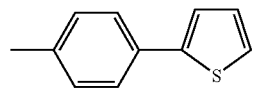 |
| 315 | 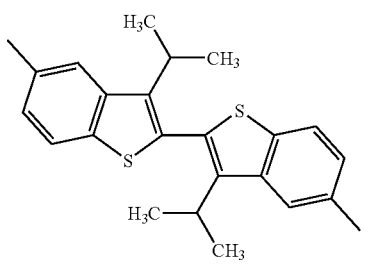 | 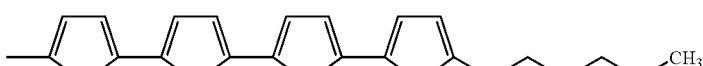 |
| 316 | 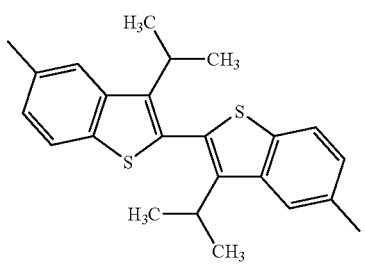 | 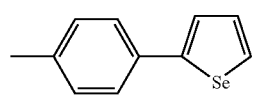 |
| *St | T | i | j | *B.P. |
|---|---|---|---|---|
| 313 | —CH$_2$CH$_2$— | 0 | 1 | 4, 4' |
| 314 | —CH$_2$CH$_2$— | 1 | 0 | 4, 4' |
| 315 | —CH$_2$CH$_2$CH$_2$CH$_2$CH$_2$— | 0 | 1 | 4, 4' |
| 316 | —CH$_2$CH$_2$— | 0 | 1 | 4, 4' |
*St = Structure,
*B.P. = Binding Position.
TABLE 63
| *St | X | Ar | T | i | j | *B.P. |
|---|---|---|---|---|---|---|
| 317 | 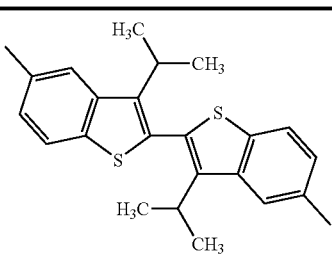 | 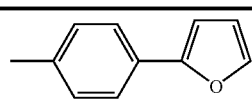 | —CH$_2$CH$_2$— | 0 | 1 | 4, 4' |
| 318 | 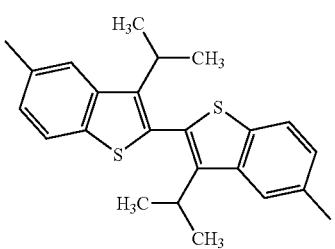 | 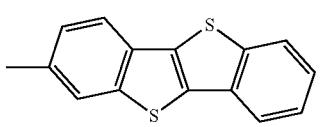 | —CH$_2$CH$_2$CH$_2$CH$_2$CH$_2$CH$_2$— | 0 | 1 | 4, 4' |

TABLE 63-continued

| *St | X | Ar | T | i | j | *B.P. |
|---|---|---|---|---|---|---|
| 319 | (structure) | (structure) | —CH$_2$CH$_2$CH$_2$CH$_2$CH$_2$CH$_2$— | 0 | 1 | 4, 4' |
| 320 | (structure) | (structure) | —CH$_2$CH$_2$CH$_2$CH$_2$CH$_2$CH$_2$— | 0 | 1 | 4, 4' |

*St = Structure,
*B.P. = Binding Position.

TABLE 64

| *St | X | Ar |
|---|---|---|
| 321 | (structure) | (structure) |
| 322 | (structure) | (structure) |
| 323 | (structure) | (structure) |

TABLE 64-continued

| | | | | |
|---|---|---|---|---|
| 324 | 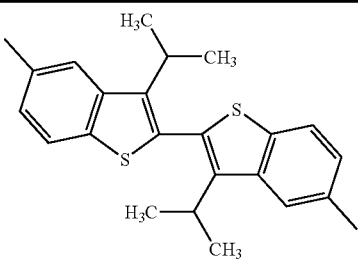 | | 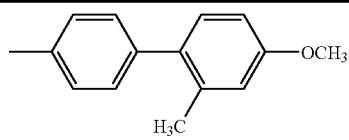 | |

| *St | T | i | j | *B.P. |
|---|---|---|---|---|
| 321 | —CH₂CH₂CH₂CH₂CH₂CH₂— | 0 | 1 | 4, 4' |
| 322 | —CH₂C(CH₃)(H)CH₂CH₂CH₂CH₂CH₂CH₂— | 0 | 1 | 4, 4' |
| 323 | —CH₂CH₂— | 0 | 1 | 4, 4' |
| 324 | —CH₂CH₂CH₂— | 0 | 1 | 4, 4' |

*St = Structure,
*B.P. = Binding Position.

Formulae (I-1) and (I-2) are further described below.

In Formulae (I-1) and (I-2), $A_1$ represents at least one or more structure selected from the structures represented by Formulae (II-1) and (II-2), wherein two or more $A_1$ structures may be contained in one polymer.

Specific examples of the $Y_1$ and $Z_1$ include the groups selected from those represented by the following Formulae (1) to (6).

$$—(CH_2)_d— \quad (1)$$

$$—(CH_2CH_2O)_e—(CH_2CH_2)— \quad (2)$$

(3) [cyclohexyl structure]

(4) —CH₂—[cyclohexyl]—CH₂—

(5) [bis-cyclohexyl with (V)ₕ, (R³)f substituents]

(6) [bis-phenyl with (V)ᵢ, (R⁴)f substituents]

In Formulae (1) to (6), $R^3$ and $R^4$ each represent a hydrogen atom, an alkyl group having 1 to 4 carbon atoms, an alkoxyl group having 1 to 4 carbon atoms, a substituted or unsubstituted phenyl group, a substituted or unsubstituted aralkyl group, or a halogen atom, d and e each represent an integer of 1 to 10, f represents an integer of 0, 1, or 2, h and i each represent 0 or 1, and V is selected from the groups represented by Formulae (13) to (33) below.

In Formulae (13) to (33), $R_{15}$ represents a hydrogen atom, an alkyl group, or a cyano group, $R_{16}$ to $R_{17}$ represents a hydrogen atom, an alkyl group having 1 to 10 carbon atoms, an alkoxyl group having 1 to 10 carbon atoms, a substituted or unsubstituted phenyl group, a substituted or unsubstituted aralkyl group, or a halogen atom, b represents an integer of 1 to 10, and c represents an integer of 1 to 10.)

$$—(CH_2)_b— \quad (13)$$

$$—C(CH_3)_2— \quad (14)$$

$$—O— \quad (15)$$

$$—S— \quad (16)$$

$$—C(CF_3)_2— \quad (17)$$

$$—Si(CH_3)_2— \quad (18)$$

(19) [vinyl with R₁₅ groups, subscript c]

(20) [alkyne with subscript c]

(21) [gem-dimethyl cyclohexyl]

(22) [phenyl]

(23) [naphthyl]

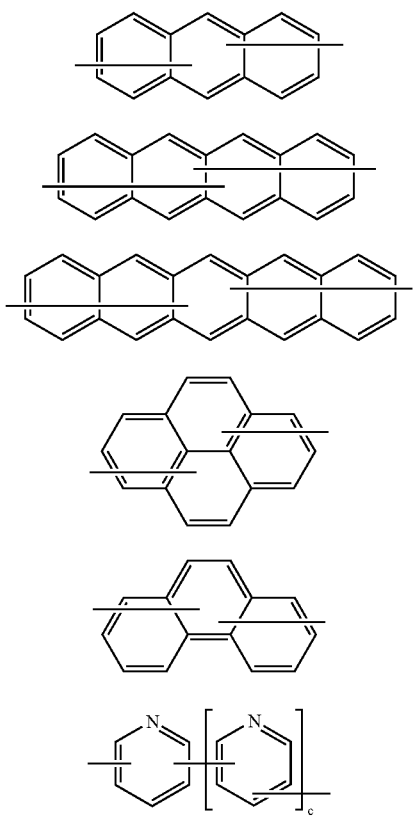

(24)
(25)
(26)
(27)
(28)
(29)

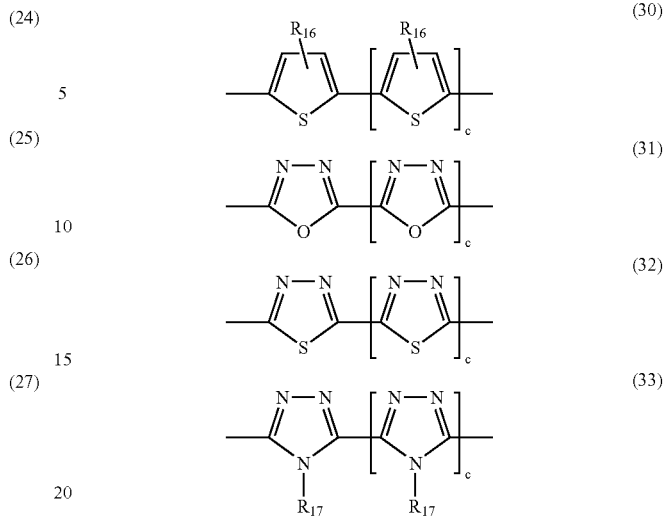

(30)
(31)
(32)
(33)

The weight average molecular weight Mw of the charge-transporting polyester used in the exemplary embodiment is preferably in the range of 5000 to 300000. The glass transition temperature of the charge-transporting polyester used in the exemplary embodiment is preferably in the range of 50° C. to 300° C.

Specific examples of the charge-transporting polyester represented by Formulae (I-1) and (I-2) are shown in the following Tables 65 to Table 71, but the exemplary embodiment is not limited to these specific examples. In Tables 65 to 71, the indication "-" in the $Z_1$ column means that the compound is represented by Formula (I-1).

TABLE 65

| *C No. | *St No. | A$_1$ Ratio | Y$_1$ | Z$_1$ | m | p |
|---|---|---|---|---|---|---|
| 1 | 1 | — | —(CH$_2$)$_2$— | — | 1 | 88 |
| 2 | 1 | — | (cyclohexane-1,4-diyl) | — | 1 | 73 |
| 3 | 1 | — | (phenyl-CH$_2$-phenyl) | — | 1 | 64 |
| 4 | 1 | — | (cyclohexyl-CH$_2$-cyclohexyl) | — | 1 | 58 |
| 5 | 1 | — | (1,3-phenylene) | — | 1 | 89 |
| 6 | 1 | — | (cyclohexane with ethyl substituents) | — | 1 | 76 |

TABLE 65-continued
| *C No. | *St No. | A₁ Ratio | Y₁ | Z₁ | m | p |
|---|---|---|---|---|---|---|
| 7 | 1 | — | 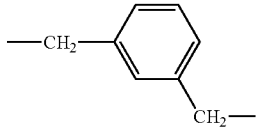 | — | 1 | 75 |
| 8 | 1 | — | —(CH₂)₆— | — | 1 | 103 |
| 9 | 34 | — | —(CH₂)₂— | — | 1 | 87 |
| 10 | 34 | — | 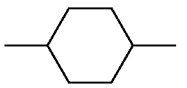 | —(CH₂)₂— | 1 | 53 |
| 11 | 34 | — | 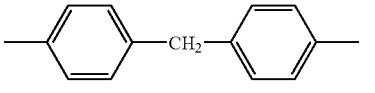 | — | 1 | 70 |
| 12 | 34 | — | 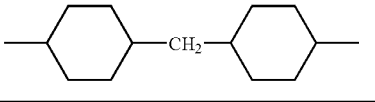 | — | 1 | 70 |
*C No. = Compound number,
*St No. = Structure number.
TABLE 66
| *C No. | *St No. | A₁ Ratio | Y₁ | Z₁ | m | p |
|---|---|---|---|---|---|---|
| 13 | 34 | — | 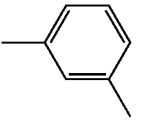 | — | 1 | 86 |
| 14 | 34 | — | 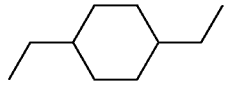 | — | 1 | 84 |
| 15 | 34 | — | 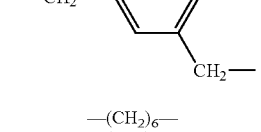 | — | 1 | 67 |
| 16 | 34 | — | —(CH₂)₆— | — | 1 | 86 |
| 17 | 35 | — | —(CH₂)₂— | — | 1 | 87 |
| 18 | 35 | — | 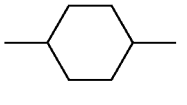 | — | 1 | 98 |
| 19 | 35 | — |  | — | 1 | 57 |
| 20 | 35 | — |  | — | 1 | 64 |

TABLE 66-continued

| *C No. | A₁ *St No. | Ratio | Y₁ | Z₁ | m | p |
|---|---|---|---|---|---|---|
| 21 | 35 | — | *m-phenylene* | — | 1 | 58 |
| 22 | 35 | — | *1,4-bis(ethyl)cyclohexane* | — | 1 | 79 |
| 23 | 35 | — | —CH₂—*m-phenylene*—CH₂— | — | 1 | 81 |
| 24 | 35 | — | —(CH₂)₆— | *4,4'-methylenebis(phenylene)* | 1 | 46 |

*C No. = Compound number,
*St No. = Structure number.

TABLE 67

| *C No. | A₁ *St No. | Ratio | Y₁ | Z₁ | m | p |
|---|---|---|---|---|---|---|
| 25 | 39 | — | —(CH₂)₂— | — | 1 | 70 |
| 26 | 39 | — | *1,4-cyclohexylene* | — | 1 | 98 |
| 27 | 39 | — | *4,4'-methylenebis(phenylene)* | —(CH₂)₂— | 1 | 74 |
| 28 | 39 | — | *4,4'-methylenebis(cyclohexylene)* | — | 1 | 63 |
| 29 | 39 | — | *m-phenylene* | — | 1 | 68 |
| 30 | 39 | — | *1,4-bis(ethyl)cyclohexane* | — | 1 | 97 |
| 31 | 39 | — | —CH₂—*m-phenylene*—CH₂— | — | 1 | 82 |
| 32 | 39 | — | —(CH₂)₆— | — | 1 | 91 |
| 33 | 51 | — | —(CH₂)₆— | —(CH₂)₂— | 1 | 46 |
| 34 | 51 | — | —(CH₂)₂— | — | 1 | 81 |

TABLE 67-continued
| *C No. | *St No. | A₁ Ratio | Y₁ | Z₁ | m | p |
|---|---|---|---|---|---|---|
| 35 | 51 | — | 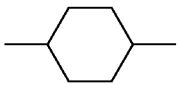 | — | 1 | 101 |
| 36 | 51 | — | 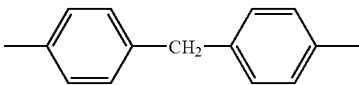 | — | 1 | 80 |
*C No. = Compound number,
*St No. = Structure number.
TABLE 68
| *C No. | *St No. | A₁ Ratio | Y₁ | Z₁ | m | p |
|---|---|---|---|---|---|---|
| 37 | 51 | — | 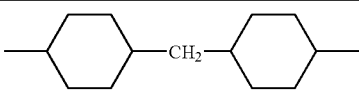 | — | 1 | 73 |
| 38 | 51 | — | 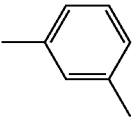 | — | 1 | 69 |
| 39 | 51 | — |  | — | 1 | 85 |
| 40 | 51 | — | 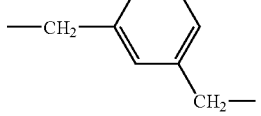 | — | 1 | 86 |
| 41 | 51 | — | —(CH₂)₆— | — | 1 | 76 |
| 42 | 52 | — | —(CH₂)₂— | — | 1 | 86 |
| 43 | 52 | — | 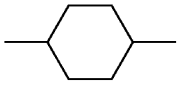 | — | 1 | 104 |
| 44 | 52 | — | 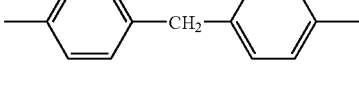 | — | 1 | 78 |
| 45 | 52 | — | 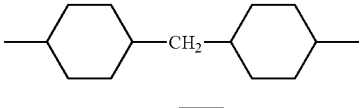 | — | 1 | 70 |
| 46 | 52 | — | 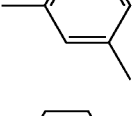 | 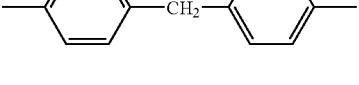 | 1 | 60 |
| 47 | 52 | — | 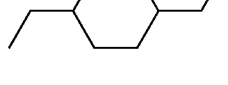 | — | 1 | 68 |

TABLE 68-continued
| | A₁ | | | | | |
|---|---|---|---|---|---|---|
| *C No. | *St No. | Ratio | Y₁ | Z₁ | m | p |
| 48 | 52 | — | 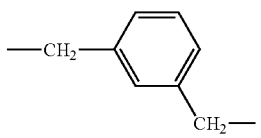 | — | 1 | 82 |
*C No. = Compound number,
*St No. = Structure number.
TABLE 69
| | A₁ | | | | | |
|---|---|---|---|---|---|---|
| *C No. | *St No. | Ratio | Y₁ | Z₁ | m | p |
| 49 | 52 | — | —(CH$_2$)$_6$— | — | 1 | 105 |
| 50 | 205 | — | —(CH$_2$)$_2$— | — | 1 | 84 |
| 51 | 205 | — |  | — | 1 | 136 |
| 52 | 205 | — | 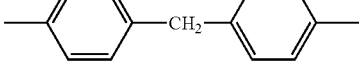 | — | 1 | 50 |
| 53 | 205 | — | 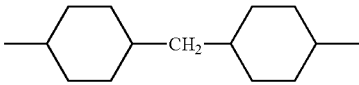 | — | 1 | 48 |
| 54 | 205 | — | 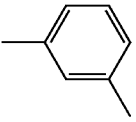 | — | 1 | 59 |
| 55 | 205 | — | 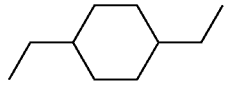 | — | 1 | 68 |
| 56 | 205 | — | 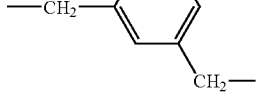 | — | 1 | 76 |
| 57 | 205 | — | —(CH$_2$)$_6$— | — | 1 | 74 |
| 58 | 284 | — | —(CH$_2$)$_2$— | — | 1 | 63 |
| 59 | 284 | — | 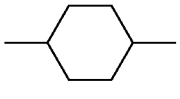 | — | 1 | 40 |
| 60 | 284 | — | 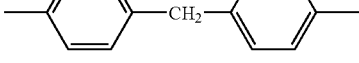 | — | 1 | 35 |
*C No. = Compound number,
*St No. = Structure number.

TABLE 70
| *C No. | *St No. | A₁ Ratio | Y₁ | Z₁ | m | p |
|---|---|---|---|---|---|---|
| 61 | 284 | — | 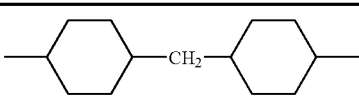 | — | 1 | 38 |
| 62 | 284 | — | 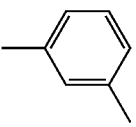 | — | 1 | 28 |
| 63 | 284 | — |  | — | 1 | 27 |
| 64 | 284 | — | 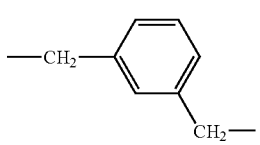 | — | 1 | 51 |
| 65 | 284 | — | —(CH₂)₆— | — | 1 | 58 |
| 66 | 1/34 | 1/1 | —(CH₂)₂— | — | 1 | 42 |
| 67 | 1/34 | 1/1 |  | — | 1 | 48 |
| 68 | 1/34 | 1/1 | 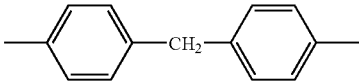 | — | 1 | 56 |
| 69 | 1/34 | 1/1 | 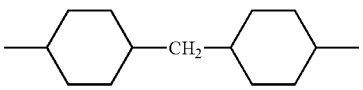 | — | 1 | 67 |
| 70 | 1/34 | 1/1 | 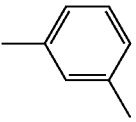 | — | 1 | 50 |
| 71 | 1/34 | 1/1 |  | — | 1 | 59 |
| 72 | 1/34 | 1/1 | 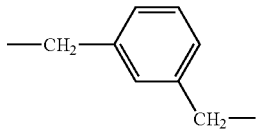 | — | 1 | 63 |
*C No. = Compound number,
*St No. = Structure number.
TABLE 71
| *C No. | *St No. | A₁ Ratio | Y₁ | Z₁ | m | p |
|---|---|---|---|---|---|---|
| 73 | 1/34 | 1/1 | —(CH₂)₆— | — | 1 | 67 |
| 74 | 1/52/284 | 1/1/1 | —(CH₂)₂— | — | 1 | 30 |

TABLE 71-continued

| *C No. | *St No. | A₁ Ratio | Y₁ | Z₁ | m | p |
|---|---|---|---|---|---|---|
| 75 | 1/52/284 | 1/1/1 |  | — | 1 | 35 |
| 76 | 1/52/284 | 1/1/1 | 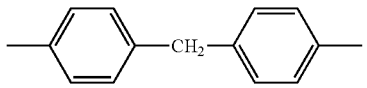 | — | 1 | 38 |
| 77 | 1/52/284 | 1/1/1 | 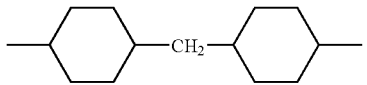 | — | 1 | 26 |
| 78 | 1/52/284 | 1/1/1 | 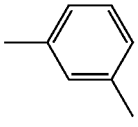 | — | 1 | 36 |
| 79 | 1/52/284 | 1/1/1 |  | — | 1 | 24 |
| 80 | 1/52/284 | 1/1/1 | 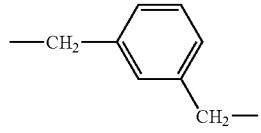 | — | 1 | 20 |
| 81 | 1/52/284 | 1/1/1 | —(CH₂)₆— | — | 1 | 29 |

*C No. = Compound number,
*St No. = Structure number.

In Tables 65 to 71, the numbers described in the column "Structure" for $A_1$ correspond to the numbers of the structures which are the specific examples of the structures represented by the above Formulae (II-1) and (II-2) shown. Also, m means the aforementioned m in Formulae (I-1) and (I-2). Specific examples (compounds) to which each number is attached, for example, a specific example to which a number 15 is attached is called an exemplified compound (15).

The method for synthesizing the charge-transporting monomer used in the exemplary embodiment is described below in detail. The synthesis method in the exemplary embodiment is not limited to them.

The charge-transporting monomer may be synthesized through the palladium coupling reaction between a dihalogen compound containing the divalent group $A_1$ represented by Formula (II-1) or (II-2) and a diarylamine compound, or the coupling reaction between a boron compound such as diboronic acid or a dipinacol ester containing a divalent group $A_1$ represented by Formulae (II-1) or (II-2), and the diarylamine compound in the presence of a copper catalyst.

The method for synthesizing the charge-transporting polyester used in the exemplary embodiment may include known methods according to the intended structure, and not particularly limited. For example, the monomer represented by the following Formula (I-3) may be polymerized by a known method described in Jikken Kagaku Koza, the 4th edition, vol. 28 (edited by The Chemical Society of Japan, Maruzen Co., Ltd., 1992).

In Formula (I-3), $A_1$ represents at least one or more structure selected from the structures represented by Formulae (II-1) and (II-2), A' represents a hydroxy group, a halogen atom, or a —O—$R^6$ group, $R^6$ represents an alkyl group, a substituted or unsubstituted aryl group, or an aralkyl group.

The polyester represented by Formulae (I-1) and (I-2) may be synthesized as described below.

1) When A' is a hydroxyl group, the monomer represented by Structural Formula (I-3) and a dihydric alcohol represented by HO—$(Y_1$—$O)_m$—H ($Y_1$ represents a residual group of dihydric alcohols, and m represents an integer of 1 or more and 5 or less.) are mixed in the equivalent weight, and the mixture is polymerized in the presence of an added acid catalyst. A common acid catalyst for esterification reaction, such as sulfuric acid, toluenesulfonic acid, or trifluoroacetic acid, may be used as the acid catalyst, and is used in an amount in the range of 1/10,000 to 1/10 part by weight, preferably in the range of 1/1,000 to 1/50 part by weight, with respect to 1 part by weight of the monomer. Use of a solvent azeotropic with water is preferable for removal of water generated during polymerization; toluene, chlorobenzene, 1-chloronaphthalene, and the like are effective; and it is used in an amount of 1 to 100 parts by weight, preferably in the range of 2 to 50 parts by weight, with respect to 1 part by weight of the monomer. The reaction temperature can be arbitrarily set, and it is preferable to perform the reaction at the boiling point of the solvent for removal of water generated during polymerization.

After reaction, when no solvent is used, the mixture is dissolved in a good solvent. When a solvent is used, the reaction solution is added dropwise as it is, into a poor solvent for polymer such as alcohol (such as methanol or ethanol) or acetone, allowing precipitation of the charge-transporting polyester, and, after separation, the charge-transporting polyester is washed with water and an organic solvent thoroughly and dried. If needed, the reprecipitation processing may be repeated, by dissolving the polyester in a suitable organic solvent and adding the solution dropwise into a poor solvent, thus, precipitating the charge-transporting polyester. During the reprecipitation processing, the reaction mixture is preferably stirred thoroughly, for example, with a mechanical stirrer. The solvent for dissolving the charge-transporting polyester during the reprecipitation processing is preferably used in an amount in the range of 1 to 100 parts by weight, preferably in the range of 2 to 50 parts by weight, with respect to 1 part by weight of the charge-transporting polyester. The poor solvent is used in an amount in the range of 1 to 1,000 parts by weight, preferably in the range of 10 to 500 parts by weight, with respect to 1 part by weight of the charge-transporting polyester.

2) When A' is a halogen atom, the monomer represented by Structural Formula (I-3) and a dihydric alcohols represented by HO—$(Y_1$—$O)_m$—H ($Y_1$ represents a residual group of dihydric alcohols, and m represents an integer of 1 or more and 5 or less.) in the same amounts are mixed with each other, and an organic basic catalyst such as pyridine or triethylamine is added thereto for polymerization. The organic base catalyst is used in an amount in the range of 1 to 10 equivalences, preferably 2 to 5 equivalence, with respect to 1 equivalence of the monomer. Examples of favorable solvents include methylene chloride, tetrahydrofuran (THF), toluene, chlorobenzene, 1-chloronaphthalene, and the like, and it is used in an amount in the range of 1 to 100 parts by weight, preferably in the range of 2 to 50 parts by weight, with respect to 1 part by weight of the monomer. The reaction temperature can be arbitrarily set. After polymerization, the reaction mixture is subjected to the reprecipitation processing described above for purification.

When a dihydric alcohol such as bisphenol higher in acidity than other solvents is used, an interfacial polymerization may be used instead. Thus, a dihydric alcohol is added to and dissolved in water with an equivalent amount of a base, and the monomer solution in an amount equivalent to the dihydric alcohol is added thereto, while the mixture is agitated vigorously for polymerization. Water is then used in an amount in the range of 1 to 1,000 parts by weight, preferably in the range of 2 to 500 parts by weight, with respect to 1 part by weight of the dihydric alcohol. Examples of the solvents effectively dissolving the monomer include methylene chloride, dichloroethane, trichloroethane, toluene, chlorobenzene, 1-chloronaphthalene, and the like. The reaction temperature can be arbitrarily set, and use of a phase-transfer catalyst such as ammonium salt or sulfonium salt is effective for accelerating the reaction. The phase-transfer catalyst is used in an amount in the range of 0.1 to 10 parts by weight, preferably in the range of 0.2 to 5 parts by weight, with respect to 1 part by weight of the monomer.

When A' is an alkoxyl group, a charge-transporting monomer represented by Structural Formula (I-3) and a dihydric alcohol represented by HO—$(Y_1$—$O)_m$—H ($Y_1$ represents a residual group of dihydric alcohols, and m represents an integer of 1 or more and 5 or less.) are added, and the mixture is heated in the presence of a catalyst such as an inorganic acid (such as sulfuric acid or phosphoric acid), an titanium alkoxide, an acetate or carbonate salt of calcium, cobalt, or the like, or an oxide of zinc or lead, for preparation by ester exchange to produce a polyester. The dihydric alcohol is used in an amount in the range of 2 to 100 equivalences, preferably in the range of 3 to 50 equivalences, with respect to 1 equivalence of the monomer.

The catalyst is used in an amount in the range of 1/10,000 to 1 part by weight, preferably in the range of 1/1,000 to 1/2 part by weight, with respect to 1 part by weight of the monomer represented by Structural Formula (I-3). The reaction is carried out at a reaction temperature of 200 to 300° C., and, after ester exchange of its alkoxyl group with the group —O—$(Y_1$—$O)_m$—H, the system is preferably placed under reduced pressure for acceleration of polymerization by release of HO—$(Y_1$—$O)_m$—H. A high-boiling-point solvent azeotropic with HO—$(Y_1$—$O)_m$—H such as 1-chloronaphthalene may be used for reaction while the HO—$(Y_1$—$O)_m$—H is removed azeotropically under atmospheric pressure.

The polyester may be synthesized as described below. In the above-described processes, the compound represented by Formula (I-4) below is formed through the reaction with an excessive amount of a divalent alcohol, and the compound is used in place of the monomer represented by Formula (I-3) above and allowed to react with, for example a divalent carboxylic acid or divalent carboxylic acid halide by the method described above to produce a polyester.

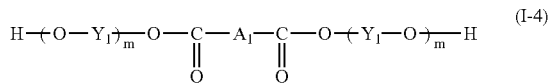

In Formula (I-4), $A_1$ represents at least one or more structure selected from the structures represented by Formulae (II-1) and (II-2), $Y_1$ represents a divalent alcohol residue, and m represents an integer of 1 to 5.

An any optional molecule may be introduced to a terminal of the charge-transporting polyester. In this case, the following method may be used. More specifically when A' is a hydroxy group, the monocarboxylic acid to be introduced to a terminal is copolymerized, or the monocarboxylic acid to be introduced to a terminal is added to and allowed to react with the electron-transporting compound after the polymerization reaction of the polymer.

When A' is a halogen, the monoacid chloride to be introduced to a terminal is copolymerized, or the monoacid chloride to be introduced to a terminal is added to and allowed to react with the electron-transporting compound after the polymerization reaction of the polymer. When A' is —O—$R^6$, the monoester to a terminal is copolymerized, or the monoester to be introduced to a terminal is added to and allowed to react after the polymerization reaction of the polymer.

Hereinafter, the layer structure of the organic electroluminescent device in the exemplary embodiment will be described in detail. The organic electroluminescent device in the exemplary embodiment has a layer structure of electrodes of an anode and cathode at least one of which is transparent or translucent and an organic compound layer or a plural layers thereof disposed between the pair of electrodes. At least one of the organic compound layers contains the at least one charge-transporting polyesters represented by Formula (I-1) or (I-2) above.

In addition, the organic compound layer located closest to the anode, among the organic compound layers containing the charge-transporting polyester, has a film thickness preferably in the range of from 20 nm to 100 nm, more preferably from 20 nm to 80 nm, and still more preferably from 20 nm to 50 nm. However the film thickness of the exemplary embodiment of the present invention in not limited to these. Preferably, the organic compound layer is an emitting layer having a charge-transporting capability when the organic compound layer is a single-layer, and a positive hole-transporting layer when it is a functionally separated layer (laminate).

In the organic electroluminescent element in the exemplary embodiment, when the organic compound layer is made only of an emitting layer, the light-emitting layer means an emitting layer having a charge-transporting capability, and the light-emitting layer having a charge-transporting capability contains the charge-transporting polyester.

Alternatively when the organic compound layer has an emitting layer, as well as additional one or more other layers (3 or more functionally separated layers), each of the other layers excluding the light-emitting layer means a carrier transport layer, i.e., a positive hole-transporting layer, an electron-transporting layer, or a positive hole- and electron-transporting layer, and at least one of the layers contains the charge-transporting polyester.

More specifically, the organic compound layer may have a configuration including, for example, (1) at least a light-emitting layer as well as an electron-transporting layer and/or an electron-injecting layer, (2) at least a light-emitting layer as well as a hole-transporting layer and/or a hole-injecting layer, (3) at least a light-emitting layer, at least one layer selected from an electron-transporting layer or an electron-injecting layer, and at least one layer selected from a hole-transporting layer or a hole-injecting layer. In this case, at least one of these layers (the hole-transporting layer, the electron-transporting layer, and the light-emitting layer) preferably contains the charge-transporting polyester, and the charge-transporting polyester is preferably used as a hole-transporting material. In particular, the charge-transporting polyester is preferably contained in at least the light-emitting layer, and at least one of the hole-transporting layer and the hole-injecting layer.

When the configuration includes a light-emitting layer as well as an electron-transporting layer and/or an electron-injecting layer offers a better balance between the manufacturability and luminescence efficiency in comparison with other layer structures. Seemingly it is because the configuration is composed of fewer layers than a configuration composed of entirely functionally separated layers, but it redeems the injection efficiency of electrons, which generally have lower mobility than holes, and balances charges in the light-emitting layer.

The configuration includes a light-emitting layer, at least one of a hole-transporting layer and a hole-injecting layer, and at least one of an electron-transporting layer and an electron-injecting layer provides better luminescence efficiency and is driven at a low voltage than other elements having other layer structures. Seemingly it is because the separation of all functions increases the charge injection efficiency to exceed other layer structures, and causes recombination of charges in the light-emitting layer.

Both the processability and the durability are more favorable in the configuration including an emitting layer and at least one of a positive hole-transporting layer and a positive hole-injecting layer than in other configurations. Seemingly it is because the number of layers is smaller in the configuration than in entirely functionally separated layer structures, the hole injection efficiency into the light-emitting layer is improved, and injection of excessive electron in the light-emitting layer is prevented.

When the organic compound layer is made only of a light-emitting layer, enlargement and production the element is easier than other element having other layer structure. This is because the number of layers is smaller than other structures.

In addition, in the organic electroluminescent element in the exemplary embodiment, the light-emitting layer may contain a charge-transporting material (e.g., hole-transporting material, electron-transporting material other than the charge-transporting polyester). The charge-transporting material is further described below.

Hereinafter, the organic electroluminescent device in the exemplary embodiment will be described in more detail with reference to drawings, however the invention is not limited by these embodiments.

Figure 2:
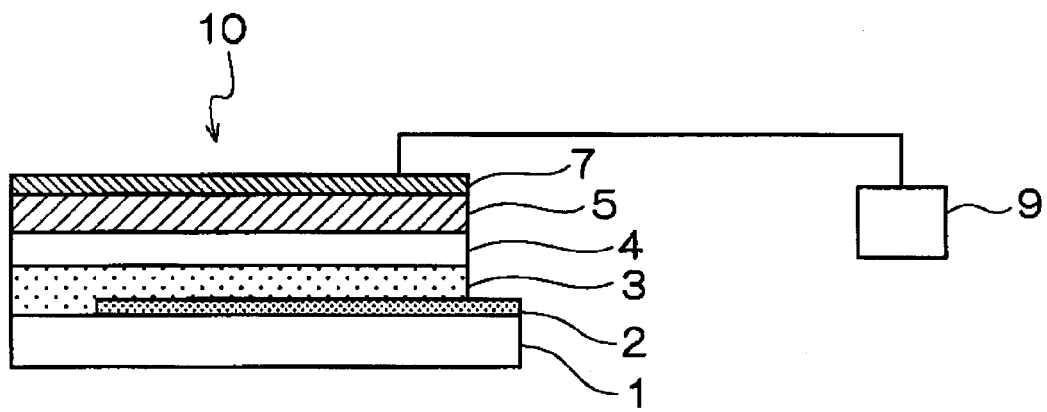
FIG. 2 is a schematic block diagram showing the display device in another exemplary embodiment.
Figure 3:
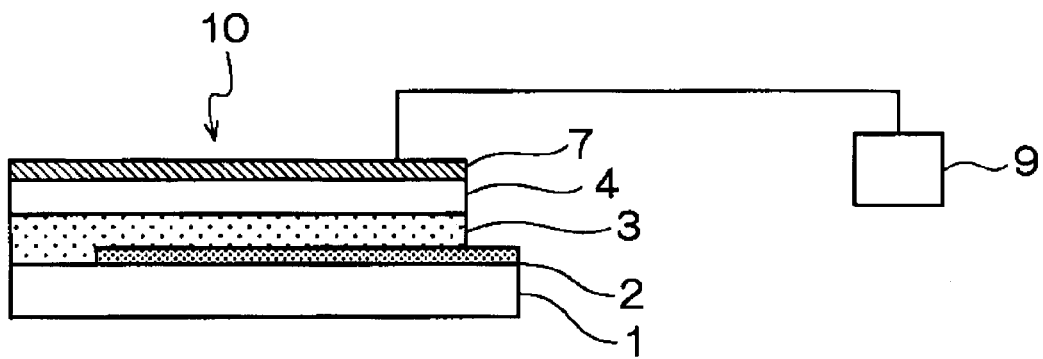
FIG. 3 is a schematic block diagram showing the display device in another exemplary embodiment.
Figure 4:
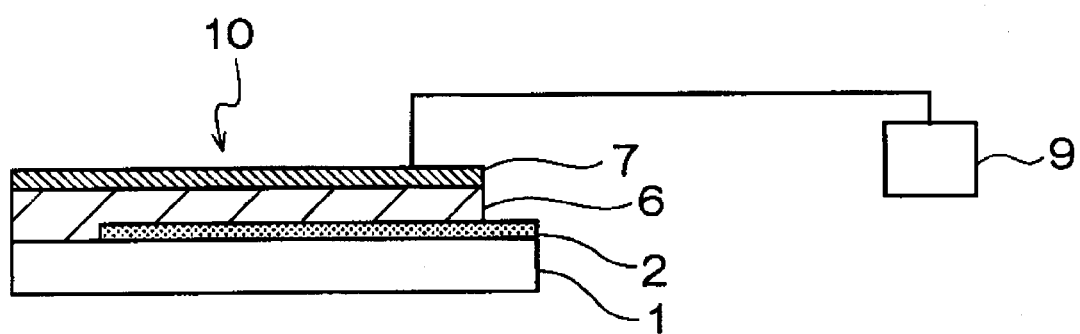
FIG. 4 is a schematic block diagram showing the display device in another exemplary embodiment.

The organic electroluminescent elements in FIGS. 1 to 3 show examples of the elements having three or four organic compound layers, while the organic electroluminescent element in FIG. 4 shows an example of the element having two organic compound layers. The invention will be described hereinafter, as the same codes are allocated to the units having the same function in FIGS. 1 to 4.

The organic electroluminescent element 10 shown in FIG. 1 has a transparent insulator substrate 1, and a transparent electrode 2, an emitting layer 4, an electron-transporting layer 5 and a rear-face electrode 7 formed thereon successively.

The organic electroluminescent element 10 shown in FIG. 2 has a transparent insulator substrate 1, and a transparent electrode 2, a positive hole-transporting layer 3, an emitting layer 4, an electron-transporting layer 5 and a rear-face electrode 7 formed thereon successively.

The organic electroluminescent element 10 shown in FIG. 3 has a transparent insulator substrate 1, and a transparent electrode 2, a positive hole-transporting layer 3, an emitting layer 4 and a rear-face electrode 7 formed thereon in this order.

The organic electroluminescent element 10 shown in FIG. 4 has a transparent insulator substrate 1, and a transparent electrode 2, a charge-transporting light-emitting layer 6, and a rear-face electrode 7 formed thereon in this order.

In FIGS. 1 to 4, the transparent electrode 2 is an anode, and the rear-face electrode 7 is a cathode. Hereinafter, each component will be described in detail.

The layer may also function as "an emitting layer 4" in the layer structure of the organic electroluminescent element 10 shown in FIG. 2 according to the context thereof; as a positive hole-transporting layer 3 or an emitting layer 4, in the layer structure of the organic electroluminescent element 10 shown in FIG. 3; and as an emitting layer 6 having a charge-transporting capability in the layer structure of the organic electroluminescent element 10 shown in FIG. 4. In particular, the charge-transporting polyester functions favorably as a positive hole-transporting material.

In the case of a layer configuration of the organic electroluminescent device shown in FIGS. 1 to 4, a transparent insulating substrate 1 is preferably transparent for taking out the emitted light and glass, plastic film and the like are used. The transparency means that transmittance of the light in a visible region is 10% or more, and further, it is preferable that this transmittance is 75% or more.

A transparent electrode 2 is transparent for taking out the emitted light as in the transparent insulating substrate, and it is preferable that the electrode has the large work function for carrying out the injection of holes. It is preferable that the value of this work function is 4 eV or more.

Examples of the transparent electrode 2 include oxidized films such as tin indium oxide (ITO), tin oxide (NESA), indium oxide, zinc oxide, indium zinc oxide and the like, and gold, platinum, palladium and the like formed by deposition or sputtering. A lower sheet resistance of a transparent electrode 2 is desirable, a few hundreds Ω/sq or less is preferable, further 100 Ω/sq or less is more preferable. In addition, in a transparent electrode 2, transmittance of the light in a visible region is 10% or more as in the transparent insulating substrate, and further, it is preferable that this transmittance is 75% or more.

In the exemplary embodiment of the invention, the buffer layer may be formed in contact with the anode (transparent electrode 2). The buffer layer preferably contains one or more charge injection materials. The charge injection material containing the substituted silicon group is used as the charge injection material. Specifically, for example, the buffer layer contains a three-dimensionally crosslinked product formed with the charge injection material containing the substituted silicon group.

The charge injecting material may have an ionization potential of 5.2 eV or less, or 5.1 eV or less, in order to improve charge injection into a layer provided in contact with a surface of the buffer layer opposite to the surface thereof in contact with the anode (namely, the light-emitting layer 4 in FIG. 1, the hole transport layer 3 in FIGS. 2 and 3, and the light-emitting layer 6 having a charge transport ability in FIG. 4). The number of the buffer layer 3 is not limited, but may be 1 or 2.

The buffer layer may further contain other materials not having a charge injecting property such as a binder resin, if necessary, in addition to the above-mentioned materials.

The electron transport layer 5 may be formed by only the aforementioned charge-transporting polyester that is provided with a desired function (electron transporting ability), or may be formed by mixing and dispersing an electron transporting material other than the charge-transporting polyester within a range of 1 to 50 wt. % for regulating the electron mobility for the purpose of further improving the electrical characteristics.

Such an electron transporting material may be an oxadiazole derivative, a triazole derivative, a phenylquinoxaline derivative, a nitro-substituted fluorenone derivative, a diphenoquinone derivative, a thiopyrandioxide derivative or a fluorenylidene methane derivative. Specific examples includes the following compounds (A-1) to (A-3), but are not limited thereto. In the case where the electron transport layer 5 is formed without the charge-transporting polyester, the layer 5 is formed by such an electron transporting material.

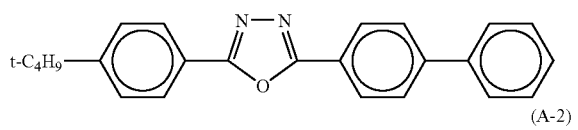
(A-1)

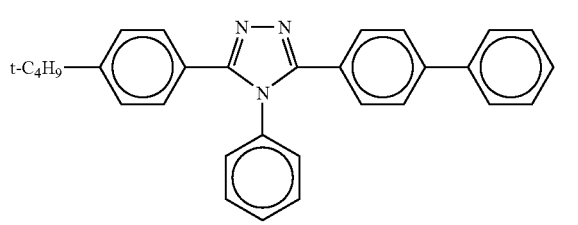
(A-2)

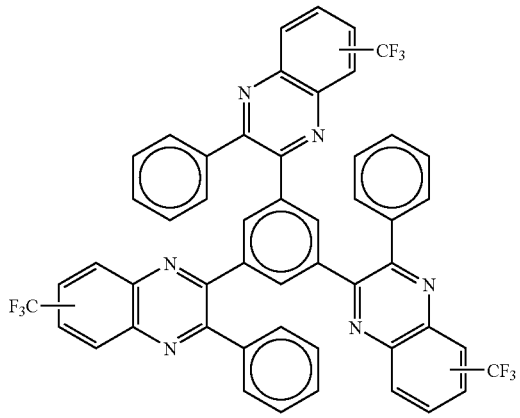
(A-3)

In order to promote electron injection from the cathode, the material of the electron-injecting layer formed between the electron-transporting layer 5 and the rear-face electrode 7 is one capable of injecting electrons from the cathode, and the material may be the same as the electron-transporting material.

The positive hole-transporting layer 3 may be formed only with a charge-transporting polyester with an added functional (positive hole-transporting capability) according to applications, but may be formed together with a positive hole-transporting material other than the charge-transporting polyester in an amount in the range of 1 to 50 wt %, for control of the positive hole mobility.

Favorable examples of the positive hole-transporting materials include tetraphenylenediamine derivatives, triphenylamine derivatives, carbazole derivatives, stilbene derivatives, arylhydrazone derivatives, porphyrin-based compounds, and the like, and particularly favorable specific examples thereof include the following compounds (IV-1) to (IV-7), and tetraphenylenediamine derivatives are particularly preferable, because they are superior in compatibility with the charge-transporting polyester. The material may be used as mixed, for example, with another common resin. When the positive hole-transporting layer 3 is formed without using the charge-transporting polyester, the positive hole-transporting layer 3 is formed with the positive hole-transporting material. In the compound (IV-7), n (integer) is preferably in the range of 10 to 100,000, more preferably in the range of 1,000 to 50,000.

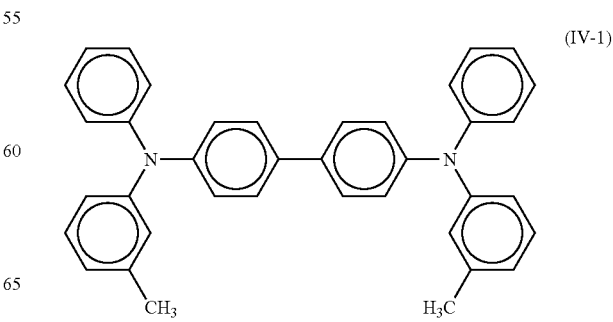
(IV-1)

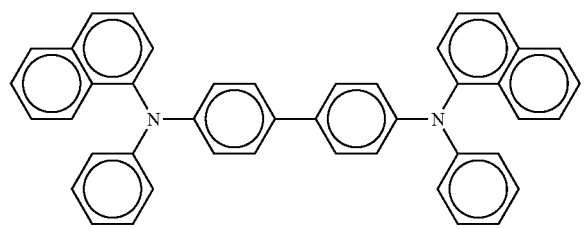
(IV-2)

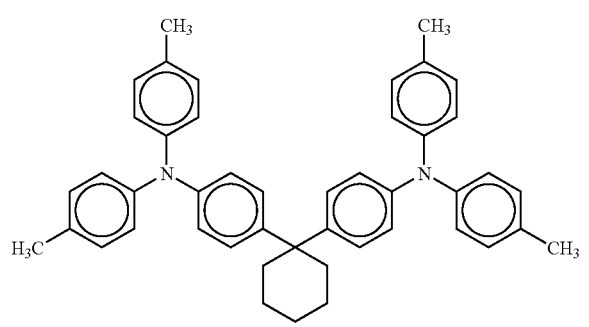
(IV-3)

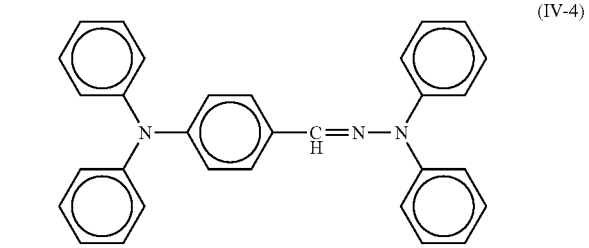
(IV-4)

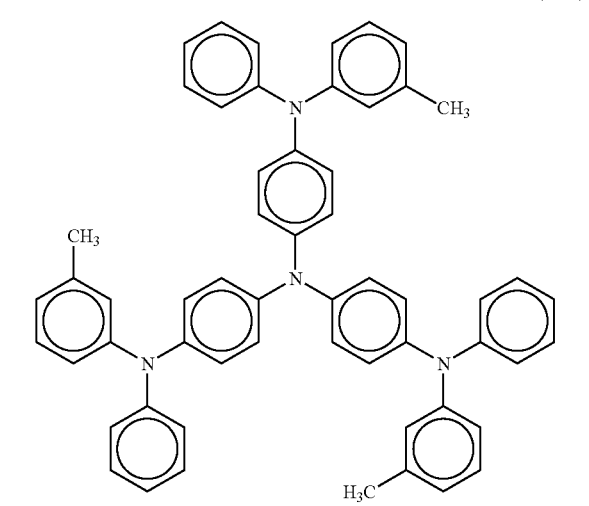
(IV-5)

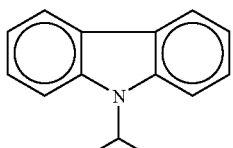
(IV-6)

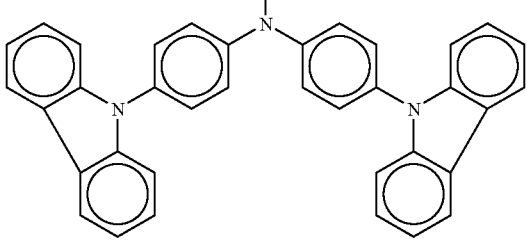
(IV-7)

In order to promote hole injection from the anode, the material of the hole-injecting layer formed between the transparent electrode 2 and the hole-transporting layer 3 is one capable of injecting holes from the anode, and the material may be the same as the hole-transporting material. Specific examples of particularly preferable ones include the following exemplary compounds (V-1) and (V-2). In Formula (V-2), n represents an integer of 1 or more.

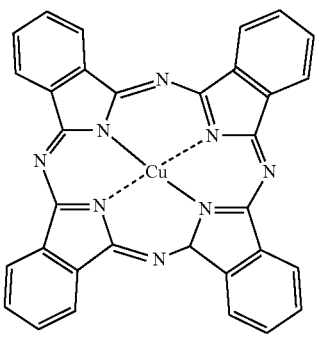
(v-1)

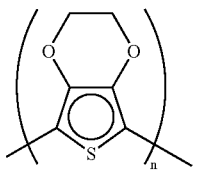
(V-2)

A compound having a fluorescence quantum yield higher than that of other compounds in the solid state is used as the light-emitting material in the light-emitting layer 4. When the light-emitting material is an organic low-molecular weight, the compound should give a favorable thin film by vacuum deposition or by coating/drying of a solution or dispersion containing a low-molecular weight compound and a binder resin. Alternatively when it is a polymer, it should give a favorable thin film by coating/drying of a solution or dispersion containing it.

If it is an organic low-molecular weight compound, favorable examples thereof include chelating organic metal complexes, polynuclear or fused aromatic ring compounds, perylene derivatives, coumarin derivatives, styryl arylene derivatives, silole derivatives, oxazole derivatives, oxathiazole derivatives, oxadiazole derivatives, and the like, and when it is a polymer, examples thereof include poly-para-phenylene derivatives, poly-para-phenylene vinylene derivatives, polythiophene derivatives, polyacetylene derivatives, polyfluorene derivatives and the like. Specifically preferable examples include, but are not limited to, the following compounds (VI-1) to (VI-17):

In Formulae (VI-1) to (VI-17), Ar represents a monovalent or divalent group having a similar structure to the Ar in Formulae (II-1) and (II-2).

X represents a substituted or unsubstituted divalent aromatic group. Specifically, X represents a substituted or unsubstituted phenylene group, or a substituted or unsubstituted divalent polynuclear aromatic hydrocarbon group having 2 to 10 aromatic rings, or a substituted or unsubstituted divalent condensed aromatic hydrocarbon group having 2 to 10 aromatic rings, a substituted or unsubstituted divalent aromatic heterocyclic group, or a substituted or unsubstituted divalent aromatic group containing at least one aromatic heterocyclic group. n and x each represent an integer of 1 or more, and y represents 0 or 1.

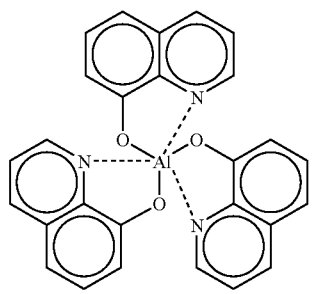

(VI-1)

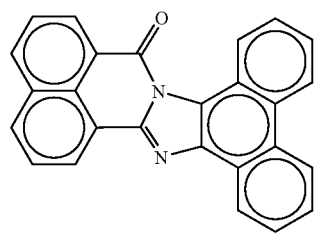

(VI-2)

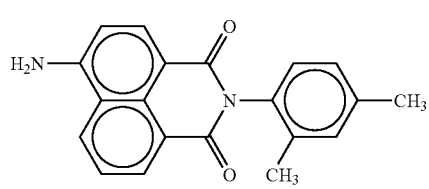

(VI-3)

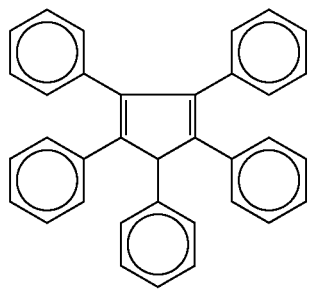

(VI-4)

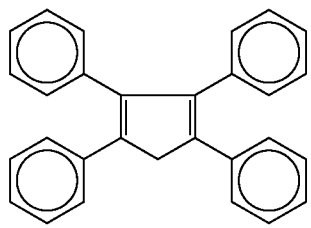

(VI-5)

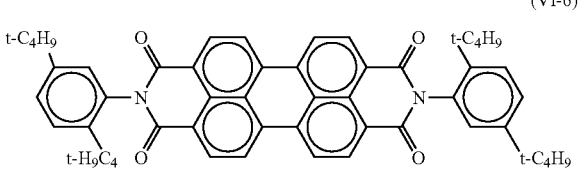

(VI-6)

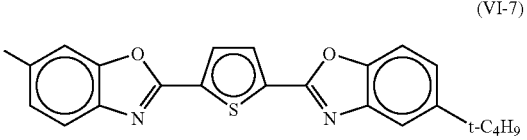

(VI-7)

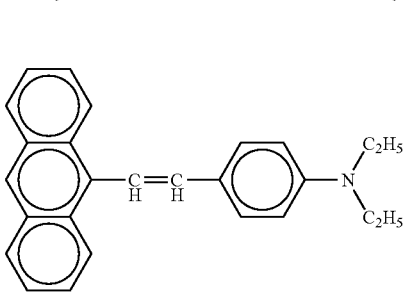

(VI-8)

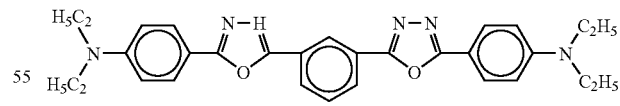

(VI-9)

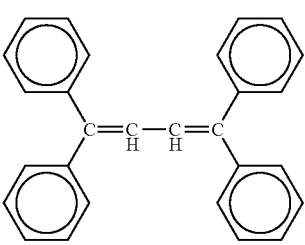

(VI-10)

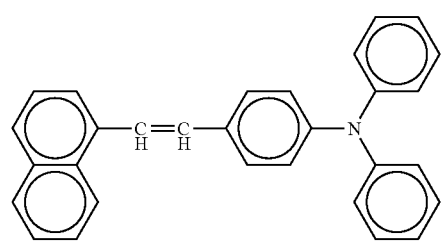

(VI-11)

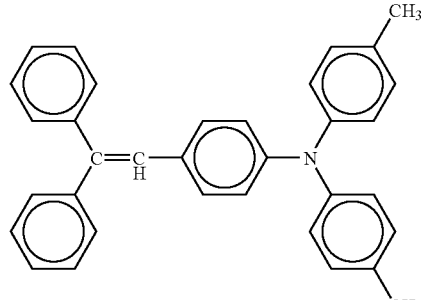

(VI-12)

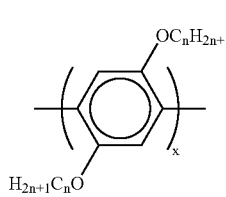

(VI-13)

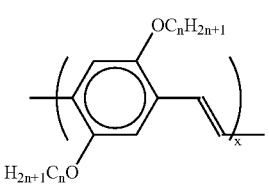

(VI-14)

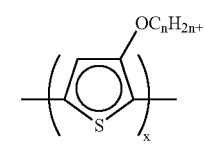

(VI-15)

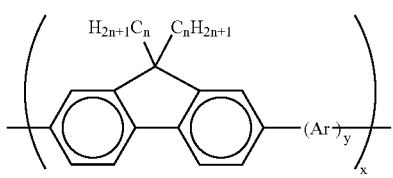

(VI-16)

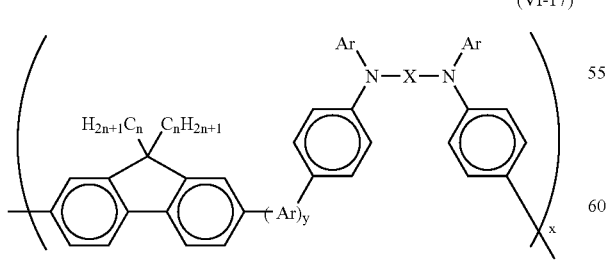

(VI-17)

A colorant compound different from the light-emitting material may be doped as a guest material into the light-emitting material, for improvement in durability or luminous efficiency of the organic electroluminescent device. Doping is performed by vapor co-deposition when the light-emitting layer is formed by vacuum deposition, while by mixing to a solution or dispersion when the light-emitting layer is formed by coating/drying of the solution or dispersion. The degree of the colorant compound doping in the light-emitting layer is approximately 0.001 to 40 wt %, preferably approximately 0.01 to 10 wt %.

The colorant compound used in doping is favorably an organic compound favorably compatible with the light-emitting material, giving a favorable thin-film light-emitting layer, and favorable examples thereof include 4-dicyanmethylene-2-methyl-6-(dimethylaminostyryl)-4H-pyran (DCM) derivatives, quinacridone derivatives, rubrene derivatives, porphyrin-based compounds and the like. Specifically favorable examples thereof include, but are not limited to, the following compounds (VII-1) to (VII-4):

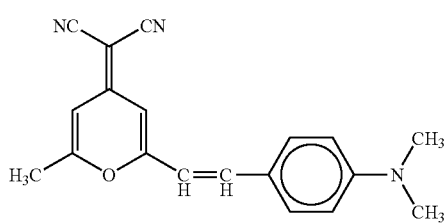

(VII-1)

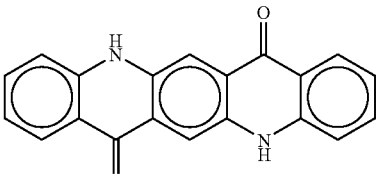

(VII-2)

(VII-3)

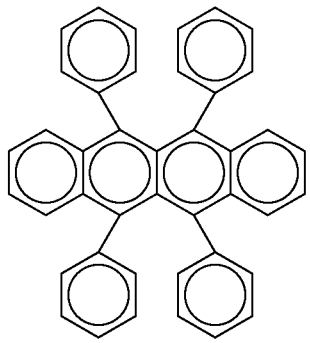

(VII-4)

Furthermore, in order to improve durability or luminescent efficiency of an organic electroluminescent device, to a charge transporting polyester used in the exemplary embodiment of the invention, in order to control the hole mobility, a hole transport material other than the charge transporting polyester may be blended and dispersed in a range of from 0.1 to 50% by weight to form. As such hole transport materials, a tetraphenylenediamine derivative, triphenylamine derivative, carbazole derivative, stilbene derivative, arylhydrazone derivative and porphyrin compound can be included. From the viewpoint of excellent compatibility with the charge transporting polyester, a tetraphenylenediamine derivative and triphenylamine derivative are preferred.

Still furthermore, same as above, when the electron mobility is controlled, to the charge transporting polyester, an electron transport material may be blended and dispersed in a range of from 0.1 to 50% by weight to form. As such electron transport materials, an oxadiazole derivative, nitro-substituted fluorenone derivative, diphenoquinone derivative, thiopyrane dioxide derivative, silole derivative, chelate type organometallic complex, polynucleus or condensed aromatic ring compound, perylene derivative, triazole derivative, and fluorenylidenemethane derivative can be included.

Furthermore, when both of the hole mobility and electron mobility are necessary to be controlled, to the charge transporting polyester, both of a hole transport material and an electron transport material may be blended together.

In order to improve the film forming property and to inhibit pinholes from occurring and so on, an appropriate resin (polymer) and an additive may be added. As specific resins, electroconductive resins such as a polycarbonate resin, polyester resin, methacrylic resin, acrylic resin, polyvinyl chloride resin, cellulose resin, urethane resin, epoxy resin, polystyrene resin, polyvinyl acetate resin, styrene/butadiene copolymer, vinylidene chloride/acrylonitrile copolymer, vinyl chloride/vinyl acetate/maleic anhydride copolymer, silicone resin, poly-N-vinyl carbazole resin, polysilane resin, polythiophene and polypyrrole can be used. Furthermore, as the additives, known anti-oxidants, UV-absorbents and plasticizers can be used.

Furthermore, in order to improve the charge injectability, there is a case where a hole injection layer and/or an electron injection layer is used. As the hole injection materials, a phenylenediamine derivative, phthalocyanine derivative, indanthrene derivative and polyalkylenedioxythiophene derivative can be used. Still furthermore, Lewis acid or sulfonic acid may be blended therewith. As the electron injection materials, metals such as Li, Ca and Sr, metal fluorides such as LiF and $MgF_2$ and metal oxides such as MgO, $Al_2O_3$ and $Li_2O$ can be used.

Furthermore, a luminescent compound is used as a luminescent material. As the luminescent material, a compound that shows high luminescence quantum efficiency in a solid state is used. The luminescent material may be any one of a low molecular weight compound and a high molecular weight compound. Preferable examples as organic low molecular weight compounds include a chelate-type organometallic complex, polynucleus or condensed aromatic ring compound, perylene derivative, cumarin derivative, styrylarylene derivative, silole derivative, oxazole derivative, oxathiazole derivative and oxadiazole derivative. Preferable examples as organic high molecular weight compounds include a polyparaphenylene derivative, polyparaphenylenevinylene derivative, polythiophene derivative and polyacetylene derivative. Preferable specific examples include luminescent materials from (VIII-1) to (VIII-17) below without restricting thereto. In the luminescent materials from (VIII-13) to (VIII-17), V represents the above-shown functional group and n and g represent an integer from 1 or more.

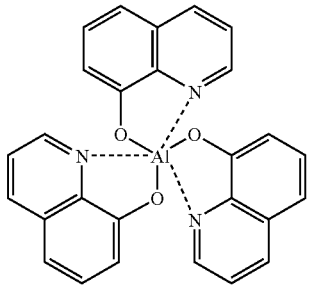
(VIII-1)

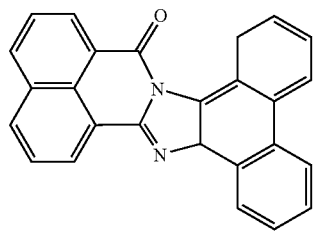
(VIII-2)

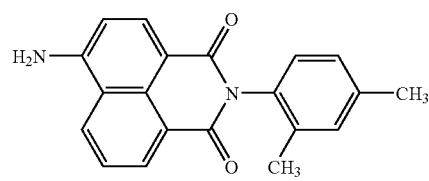
(VIII-3)

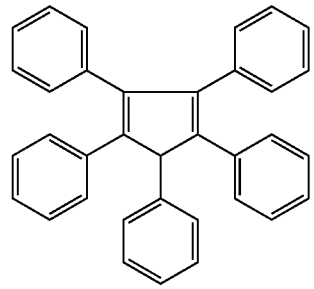
(VIII-4)

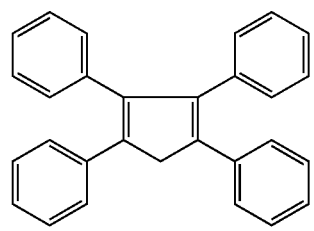
(VIII-5)

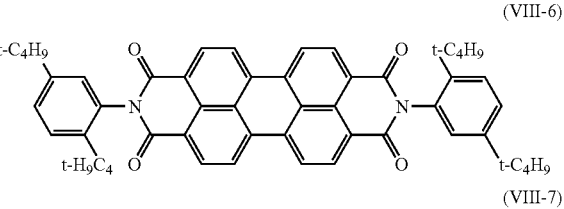
(VIII-6)

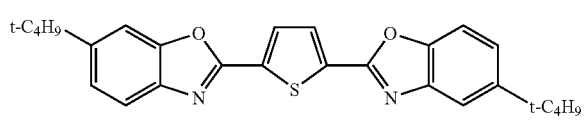
(VIII-7)

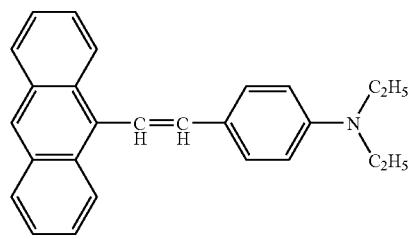
(VIII-8)

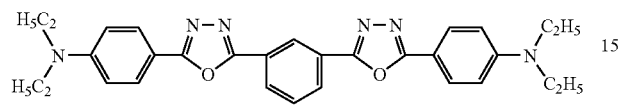
(VIII-9)

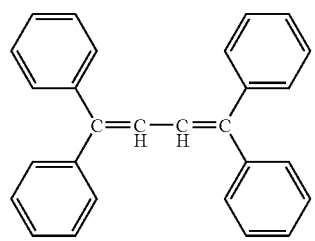
(VIII-10)

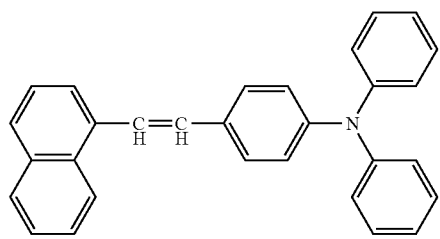
(VIII-11)

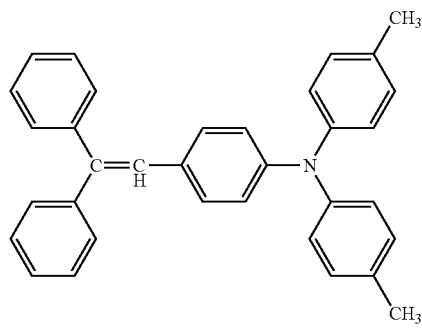
(VIII-12)

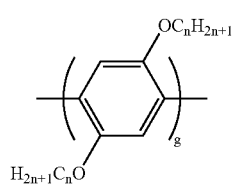
(VIII-13)

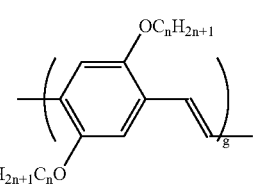
(VIII-14)

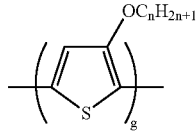
(VIII-15)

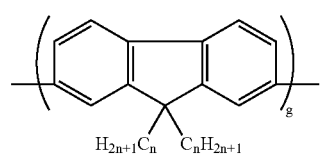
(VIII-16)

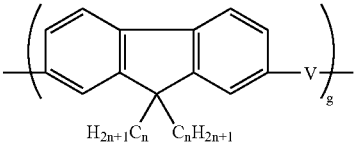
(VIII-17)

Furthermore, in order to improve the durability of the device or to improve the luminescence efficiency thereof, in the luminescent material or the charge transporting polyester, as a guest material, a dye compound that is different from the luminescent material may be doped. A doping ratio of the dye compound is in a range of substantially from 0.001 to 40% by weight and preferably in the range of substantially from 0.001 to 10% by weight. As the dye compounds that are doped like this, organic compounds that are excellent in the compatibility with the luminescent material and the charge transporting polyester and do not disturb excellent thin film formation of the luminescent layer are used. Exemplary examples thereof include a cumarin derivative, DCM derivative, quinacridone derivative, rubrene derivative, porphyrin derivative and metal complex compounds of Ir, Eu and Pt. Preferable specific examples thereof include dye compounds from the following (IX-1) to (IX-6) without restricting thereto.

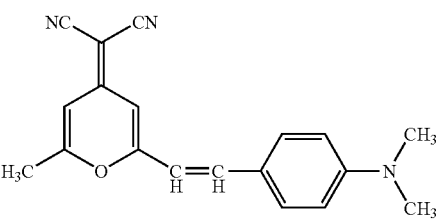
(IX-1)

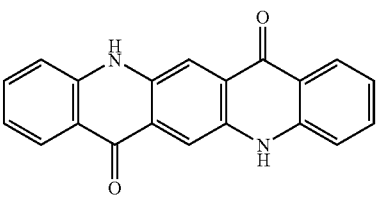
(IX-2)

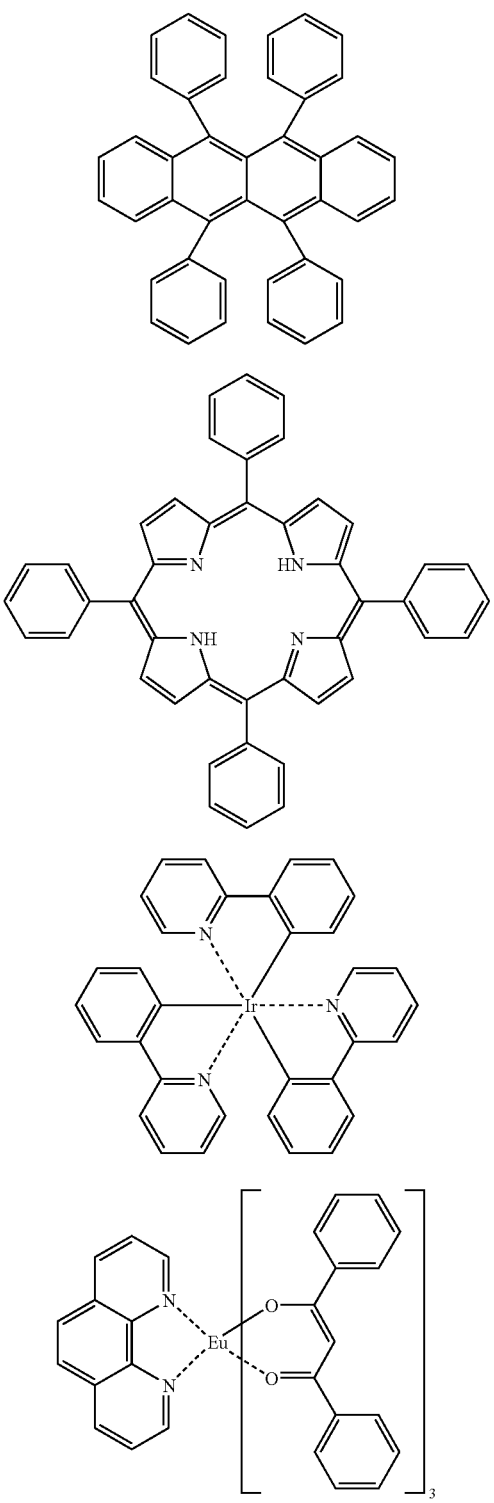

(IX-3)

(IX-4)

(IX-5)

(IX-6)

The light-emitting layer 4 may be formed only with the light-emitting material; a charge-transporting polyester described above may be added to and dispersed in the light-emitting material in an amount in the range of 1 to 50 wt %, for example for further improvement in electrical properties and light-emitting characteristics; or a charge-transporting material other than the charge-transporting polyester may be added to and dispersed in the light-emitting polymer in an amount in the range of 1 to 50 wt % before preparation of the light-emitting layer.

The light-emitting layer 6 having a charge-transporting capability preferably contains according to applications, for example, a material containing any one of the light-emitting materials above (VI-1) to (VI-17) as its light-emitting material in an amount of 50 wt % or less, as it is dispersed in the charge-transporting polyester with an added function (positive hole- or electron-transporting capability). In such a case, a charge-transporting material other than the charge-transporting polyester may be dispersed in the organic electroluminescent device in an amount of 10 to 50 wt % for control of the balance of positive hole and electron injected.

The charge-transporting material for adjustment of electron transfer efficiency, i.e., electron-transporting material, is favorably an oxadiazole derivative, a nitro-substituted fluorenone derivative, a diphenoquinone derivative, a thiopyranedioxide derivative, a fluorenylidenemethane derivative or the like. Specifically favorable examples include the compounds above (A-1) to (A-3). The charge-transporting compound for use is preferably an organic compound having no strong electronic interaction with the charge-transporting polyester above, and a favorable example thereof, includes, but is not limited to, the following compound (X).

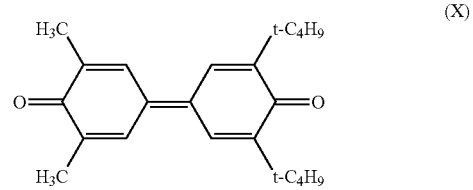

(X)

For adjustment of positive hole mobility, the positive hole-transporting material is favorably a tetraphenylenediamine derivative, a triphenylamine derivative, a carbazole derivative, a stilbene derivative, an aryl hydrazone derivative, a porphyrin-based compound, or the like, and specifically favorable examples thereof include the compounds (IV-1) to (IV-7), however tetraphenylenediamine derivatives are preferable, because they are more compatible with the charge-transporting polyester.

A metal element allowing vacuum deposition and having a small work function permitting electron injection is used for the rear-face electrode 7, and particularly favorable examples thereof include magnesium, aluminum, silver, indium, the alloys thereof, metal halogen compounds such as lithium fluoride and lithium oxide, and metal oxides.

A protective layer may be provided additionally on the rear-face electrode 7 for prevention of degradation of the device by water or oxygen. Specific materials for the protective layer include metals such as In, Sn, Pb, Au, Cu, Ag, and Al; metal oxides such as MgO, $SiO_2$, and $TiO_2$; and resins such as polyethylene resin, polyurea resin, and polyimide resin. Vacuum deposition, sputtering, plasma polymerization, chemical vapor deposition (CVD), or coating may be used in forming the protective layer.

The organic electroluminescent devices shown in FIGS. 1 to 4 are prepared in the following manner: First, a buffer layer is formed on a transparent electrode 2 previously formed on a transparent insulator substrate 1 by coating a coating solution obtained by dissolving the components in solvent on the transparent electrode 2 by spin coating or dip coating and hardening the resulting film as needed, for example, by heating. Then, a positive hole-transporting layer 3, an emitting layer 4, an electron-transporting layer 5, and an emitting layer 6 having a charge-transporting capability are formed on the transparent electrode 2 or the buffer layer according to the layer structure of each organic electroluminescent device. Each layer is laminated additionally in a particular order on these layers according to the layer structure of each organic electroluminescent device.

As described above, a positive hole-transporting layer 3, an emitting layer 4, an electron-transporting layer 5 and the light-emitting layer 6 having a charge-transporting capability are formed by vacuum deposition of the material for each layer. Alternatively, the layer is formed for example by spin coating or dip coating, by using a coating solution obtained by dissolving materials for each layer in organic solvent.

When a polymer compound is used as the charge transport material and luminescent material, the layers are preferably formed from a coating solution, but may be formed by ink jetting. The thickness of the buffer layer is in the range of 1 nm to 200 nm, and preferably in the range of 10 nm to 150 nm. The thickness of the hole-transporting layer 3, the light-emitting layer 4, and the electron-transporting layer 5 is in the range of 20 nm to 100 nm, and preferably in the range of 30 nm to 80 nm. The thickness of the light-emitting layer 6 having charge-transporting properties is in the range of 20 nm to 200 nm, and preferably in the range of 30 nm to 200 nm.

These materials (e.g., the charge-transporting polyester, and luminescent material) may be dispersed in the form of molecules or particles. When a film is formed using a coating solution, in order to disperse the materials in the form of molecules, the dispersion solvent is preferably a common solvent for the materials. On the other hand, in order to disperse the materials in the form of particles, the dispersion solvent is preferably in consideration of the dispersibility and solubility of the materials. Examples of the means for dispersing the materials in the form of particles include a ball mill, a sand mill, a paint shaker, an attritor, a homogenizer, and ultrasonic vibration.

Finally, the rear-face electrode 7 is formed by vacuum deposition on the light-emitting layer 4, the electron-transporting layer 5, or the light-emitting layer 6 having charge-transporting properties to obtain the organic electroluminescent element shown in FIGS. 1 to 4.

—Display Device—

The configuration of the display device according to the exemplary embodiment is further described below.

The display device in the exemplary embodiment includes the organic electroluminescent elements in the exemplary embodiment, and a driving means for driving the organic electroluminescent elements.

Specifically, the display device is composed of, for example, as shown in FIGS. 1 to 4, a pair of electrodes (transparent electrode 2, rear-face electrode 7) of the organic electroluminescent element, and a voltage application device 9 which serves as a driving means for applying a direct current voltage between the pair of electrodes.

The organic electroluminescent elements are driven to emit light by the voltage application device 9 through, for example, application of a direct current voltage of 4 V to 20 V to between the pair of electrodes at a current density of 1 mA/cm² to 200 mA/cm².

The organic electroluminescent element in the exemplary embodiment is described regarding the structure of a minimum unit (one pixel unit). For example, the embodiment is applied to a display device wherein the pixel units (organic electroluminescent elements) are arranged in a matrix configuration and/or a segment configuration. When the organic electroluminescent elements are arranged in a matrix configuration, the electrodes may be arranged alone in a matrix configuration, or the electrode and the organic compound layer may be arranged in a matrix configuration. In the exemplary embodiment, when the organic electroluminescent elements are arranged in a segment configuration, the electrodes may be arranged alone in a segment configuration, or the electrodes and organic compound may be arranged in a segment configuration. The organic compound layer in a matrix or segment configuration is readily formed by the ink jet method.

The driving system for the display device may employ a conventionally known technique, for example, a simple matrix driving system wherein plural row electrodes and column electrodes are arranged, and the column electrode are collectively driven according to the image data corresponding to the respective row electrodes under scanning, or an active matrix driving system utilizing pixel electrodes arranged for respective pixels.

EXAMPLES

Hereunder is a specific description of exemplary embodiments of the present invention with reference to Examples. However, the present invention is not limited to these Examples.

Example A1

Synthesis Example 1

—Synthesis of DAA-1—

Acetoanilide (25.0 g, the compound shown at the left side of the reaction formula), methyl 4-iodophenylpropionate (64.4 g, the compound shown at the left side of the reaction formula), potassium carbonate (38.3 g), copper sulfate pentahydrate (2.3 g), and N-tridecane (50 ml) are placed in a 500-ml three-necked flask, and heated at 230° C. for 20 hours under stirring in a nitrogen gas stream. After completion of the reaction, a solution of potassium hydroxide (15.6 g) in ethylene glycol (300 ml) is added, heated for 3.5 hours under reflux in a nitrogen gas stream, and cooled to room temperature (25° C.). The reaction solution is poured to 1 L of distilled water, neutralized with hydrochloric acid to precipitate crystals. The crystals are collected by suction filtration, washed with water, and then transferred to a 1-L flask. Toluene (500 ml) is added into the flask, heated under reflux, and water is removed azeotropically. Subsequently, a solution of concentrated sulfuric acid (1.5 ml) in methanol (300 ml) is added, and heated under reflux for 5 hours in a nitrogen gas stream. After completion of the reaction, the organic layer is extracted with toluene, and washed with distilled water. Subsequently, after drying with anhydrous sodium sulfate, the solvent is removed by evaporation under reduced pressure, followed by recrystallization from hexane, whereby the compound (DAA-1) shown at the right side of the reaction formula is obtained in a yield of 36.5 g.

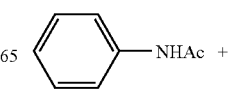

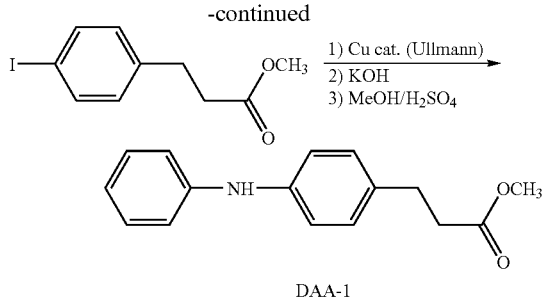

DAA-1

—Synthesis of Halogenated Intermediate 1—

Arylboronic acid described in a Non-patent Document, J. Org. Chem., 68, 26, 2003 is converted into a dimer, whereby the intermediate compound (the compound shown at the right side of the reaction formula (halogenated intermediate 1)) corresponding to the group X in Formula (II-1) is synthesized by the following procedure.

In the first place, copper acetate (II) (9.1 g) and DMF (dimethylformamide) 200 ml are placed in a 500-ml three-necked flask equipped with a thermometer, a condenser, and a magnetic stirrer, to which 5-bromobenzo[b]thiophene-2-boronic acid (manufactured by Frontier Scientific, Inc., the compound shown at the left side of the reaction formula) (25.7 g) is added under magnetic stirring, followed by heating for 1 hour under reflux and magnetic stirring. Subsequently, thin layer chromatography (TLC, hexane/ethyl acetate=3/1 (volume ratio)) confirms the disappearance of the spot of 5-bromobenzo[b]thiophene-2-boronic acid, and then purification is conducted by silica gel column chromatography (hexane/ethyl acetate=5/1 (volume ratio)), followed by vacuum drying at 50° C. for 15 hours, whereby the halogenated intermediate 1 is obtained. The yield is 40%.

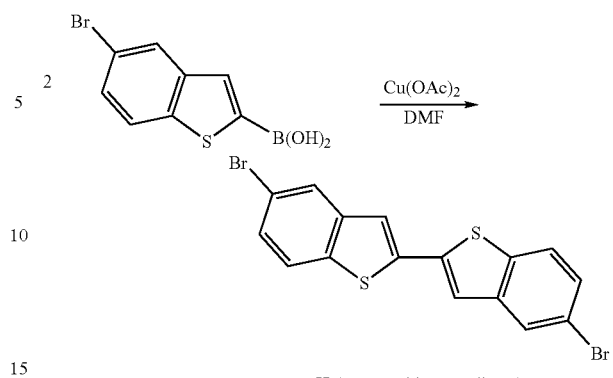

Halogenated intermediate 1

—Synthesis of Monomer 1—

DAA-1 (8.0 g), the halogenated intermediate 1 (6.4 g), palladium acetate (II) (170 mg), and rubidium carbonate (21 g) are placed in a 200-ml three-necked flask equipped with a thermometer, a condenser, and a magnetic stirrer, and dissolved in 50 ml of xylene. Subsequently, tri-t-butylphosphine (1.2 g) is quickly added, and heated for 9 hours in a nitrogen atmosphere under reflux and magnetic stirring.

Thereafter, TLC (hexane/ethyl acetate=3/1 (volume ratio)) confirms the disappearance of the spot attributable to the halogenated intermediate 1, and the solution is cooled to room temperature (25° C.). After inorganic substances are removed by celite suction filtration, the solution is washed with 100 ml of 1 N dilute hydrochloric acid, and then washed three times with 200 ml portions of water, and finally washed with 200 ml of saturated saline. After the solution is dried with anhydrous sodium sulfate, purified by silica gel column chromatography (hexane/ethyl acetate=3/1), and then vacuum dried at 70° C. for 15 hours, whereby the compound (monomer 1) shown at the right side of the reaction formula is obtained. The yield is 63%.

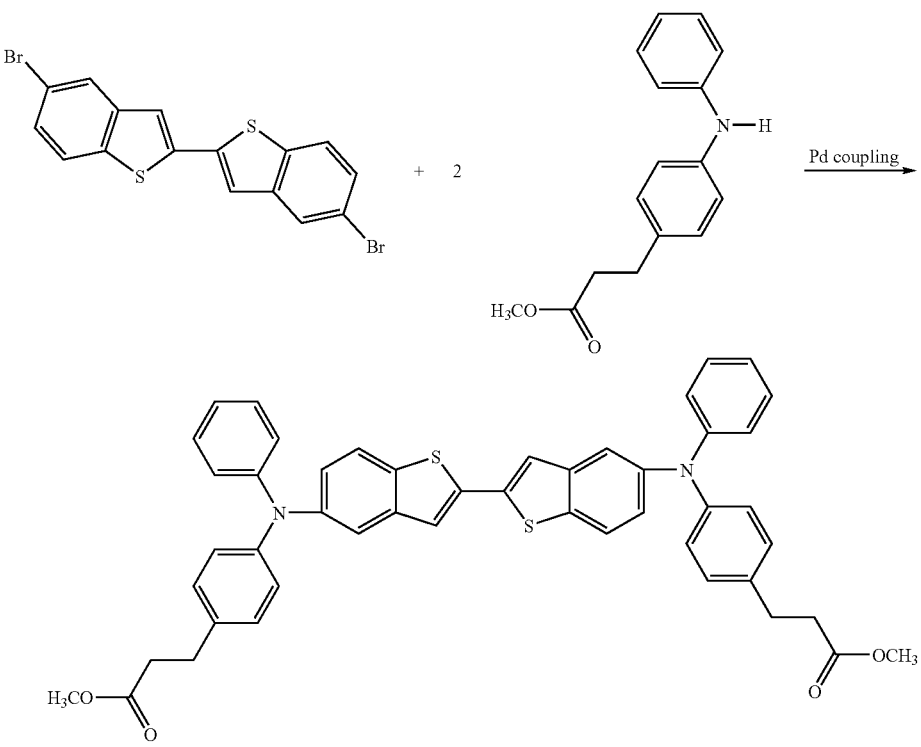

Monomer 1

—Synthesis of Exemplary Compound (1)—

1.5 g of the monomer 1, 10 ml of ethylene glycol, and 0.02 g of tetrabutoxy titanium are placed in a 50-ml three-necked eggplant-shaped flask, and heated at 210° C. for 6 hours under stirring in a nitrogen atmosphere.

After TCL confirms the disappearance of the monomer 1, the pressure is reduced to 40 Pa, and the solution is heated to 200° C. to carry out the reaction for 7 hours while ethylene glycol is removed by evaporation. Thereafter, the solution is cooled to room temperature (25° C.), dissolved in 50 ml of tetrahydrofuran, and insoluble matter is removed by filtration through a 0.5-µl polytetrafluoroethylene (PTFE) filter. The filtrate is collected by evaporation under reduced pressure, dissolved in 300 ml of monochlorobenzene, washed with 300 ml of 1 N dilute hydrochloric acid, and then washed three times with 500 ml portions of water.

Subsequently, the monochlorobenzene solution is evaporated under reduced pressure until reduced to 30 ml, dropped into 800 ml of a mixed solvent (ethyl acetate/methanol=1/5 (volume ratio)), whereby the polymer is reprecipitated. The obtained polymer is collected by filtration, washed with methanol, and vacuum dried at 70° C. for 16 hours, whereby the polymer [exemplary compound (1), the compound shown at the right side of the reaction formula] is obtained in a yield of 1.1 g.

The molecular weight of the polymer is measured by gel permeation chromatography (GPC) (trade name: HLC-8120GPC, manufactured by Tosoh Corporation); Mw=7.3× $10^4$ (in terms of styrene), Mw/Mn=1.43, and the degree of polymerization p calculated from the molecular weight of the monomer is about 88.

<Making of Organic Electroluminescent Element>

A glass substrate (a non-alkali glass substrate having a size of 25 mm×25 mm, a thickness of 0.7 mm, manufactured by Sanyo Vacuum Industries Co., Ltd.) having an ITO coating with a thickness of 150 nm is patterned by photolithography with a strip-shaped photomask, and then etched to form a strip-shaped ITO electrode having a width of 2 mm. Subsequently, the ITO-coated glass substrate is washed sequentially with a neutral detergent solution, pure water, acetone (for electronic industry, manufactured by Kanto Chemical Co., Inc.) and isopropanol (for electronic industry, manufactured by Kanto Chemical Co., Inc.) for 5 minutes each under ultrasonication, and then dried with a spin coater.

After washing, a monochlorobenzene solution containing 5% by weight of the charge-transporting polyester [exemplary compound (1)] (a solution filtered through a 0.1-µm PTFE filter) is applied by dip coating onto the ITO-coated side of the substrate to form a hole-transporting layer having a thickness of 0.050 µm.

Subsequently, the compound (VI-1) as a luminescent material is applied by vapor deposition onto the surface of the hole-transporting layer to form a light-emitting layer having a thickness of 0.055 µm. Subsequently, with a metallic mask having strip-shaped holes placed on the light-emitting layer, an Mg—Ag alloy is evaporated by co-deposition to form a rear-face electrode having a width of 2 mm and a thickness of

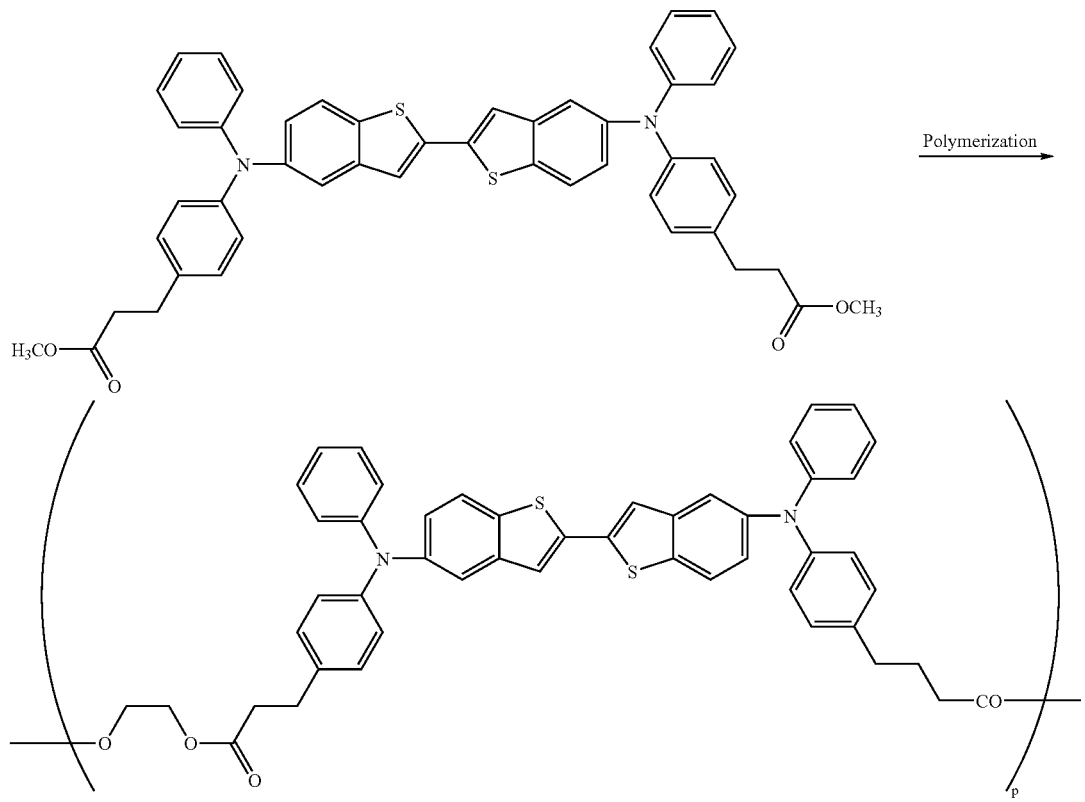

Exemplary compound (1)

0.15 μm such that the rear-face electrode intersects with the ITO electrode, and thus an organic electroluminescent element is obtained. The effective area of the organic electroluminescent element is 0.04 cm².

Example A2

Synthesis Example 2

—Synthesis of DAA-2—

4-phenylacetoanilide (4.0 g, the compound shown at the left side of the reaction formula), methyl 4-iodophenylpropionate (6.4 g, the compound shown at the left side of the reaction formula), potassium carbonate (3.9 g), and copper sulfate pentahydrate (0.40 g) are placed in a 100-ml three-necked flask equipped with a thermometer, a condenser, and a magnetic stirrer, and dissolved in o-dichlorobenzene (20 ml). The mixture is heated at 185° C. for 13 hours under stirring in a nitrogen atmosphere. After completion of the reaction, a solution of potassium hydroxide (1.3 g) in ethylene glycol (25 ml) is added into the flask, heated for 5 hours under reflux in a nitrogen atmosphere. After completion of the reaction, the solution is cooled to 25° C., poured to water (200 ml), and neutralized with hydrochloric acid to precipitate crystals. The crystals are collected by filtration, washed with water, and then transferred to a 1-L flask. Toluene (300 ml) is added into the flask, heated under reflux, and water is removed azeotropically. Subsequently, methanol (100 ml) and concentrated sulfuric acid (0.5 ml) are added, and heated under reflux for 3 hours in a nitrogen gas stream. After completion of the reaction, the content is poured to distilled water, and extracted with toluene. The toluene layer is washed with distilled water, and dried with anhydrous sodium sulfate. Subsequently, the solvent is removed by evaporation under reduced pressure, followed by recrystallization from a mixed solution of ethyl acetate and hexane, whereby the compound (DAA-2) shown at the right side of the reaction formula is obtained in a yield of 3.2 g.

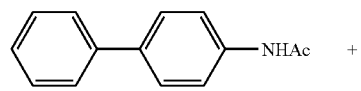

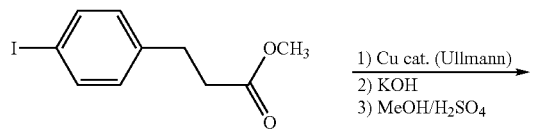

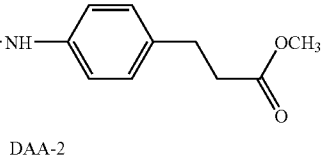

DAA-2

—Synthesis of Halogenated Intermediate 2—

Arylboronic acid described in a Non-patent Document, J. Org. Chem., 68, 26, 2003 is converted into a dimer, whereby the intermediate compound (the compound shown at the right side of the reaction formula (halogenated intermediate 2)) corresponding to the group X in Formula (II-1) is synthesized by the following procedure.

In the first place, copper acetate (II) (3.6 g) and 200 ml of DMF (dimethylformamide) are placed in a 500-ml three-necked flask equipped with a thermometer, a condenser, and a magnetic stirrer, to which 5-bromobenzo[b]thiophene-2-boronic acid (the compound shown at the left side of the reaction formula) (10.8 g) is added under magnetic stirring, followed by heating for 1 hour under reflux and magnetic stirring.

Subsequently, TLC (hexane/ethyl acetate=3/1 (volume ratio)) confirms the disappearance of the spot of 5-bromobenzo[b]thiophene-2-boronic acid, and then purification is conducted by silica gel column chromatography (hexane/ethyl acetate=5/1 (volume ratio)), followed by vacuum drying at 50° C. for 15 hours, whereby the halogenated intermediate 2 is obtained. The yield is 60%.

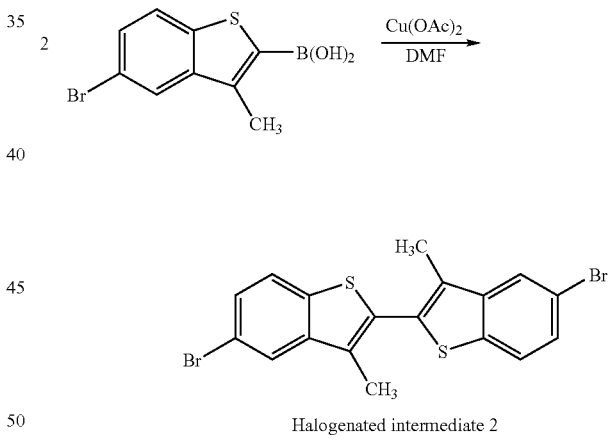

Halogenated intermediate 2

—Synthesis of Exemplary Compound (17)—

Synthesis is carried out in a manner substantially similar to Synthesis Example 1, except that DAA-2 is used in place of DAA-1, and the halogenated intermediate 2 is used in place of the halogenared intermediate 1, whereby the polymer (exemplary compound (17)) shown at the right side of the reaction formula is obtained in a yield of 1.2 g. The molecular weight of the polymer is measured by GPC; MW=8.8×10⁴ (in terms of styrene), Mw/Mn=1.32, and the degree of polymerization p calculated from the molecular weight of the monomer is about 87.

149             150
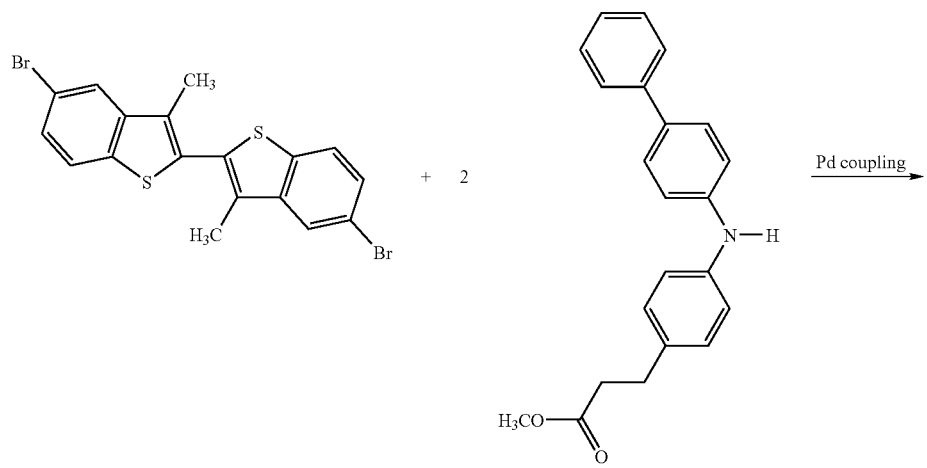
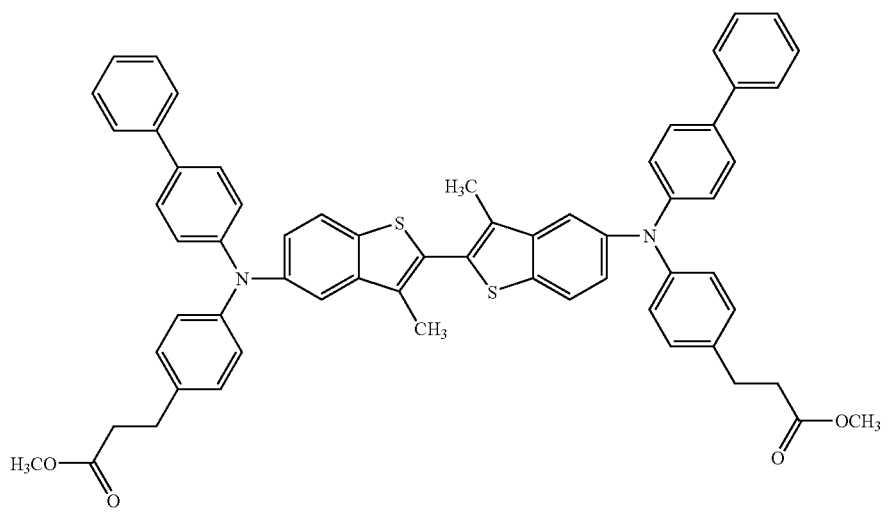
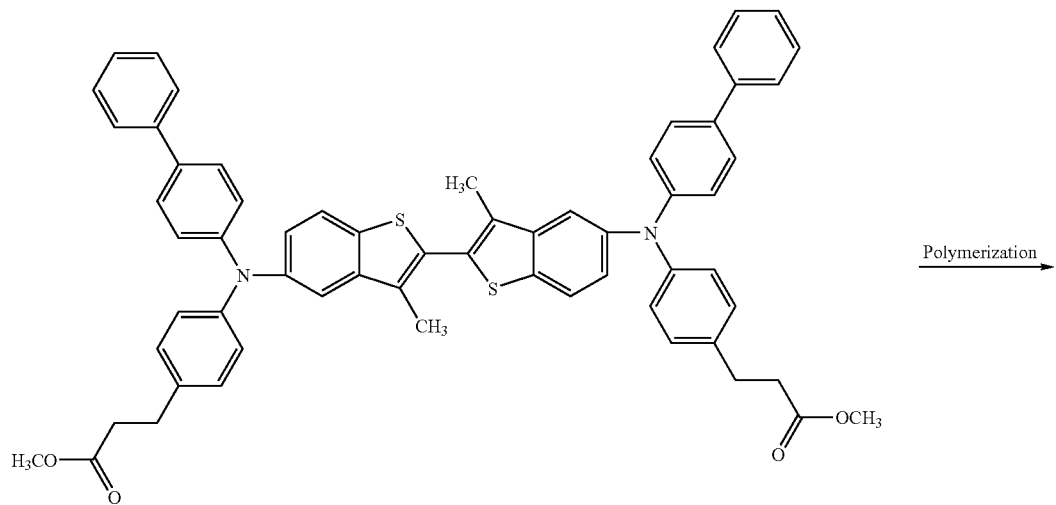

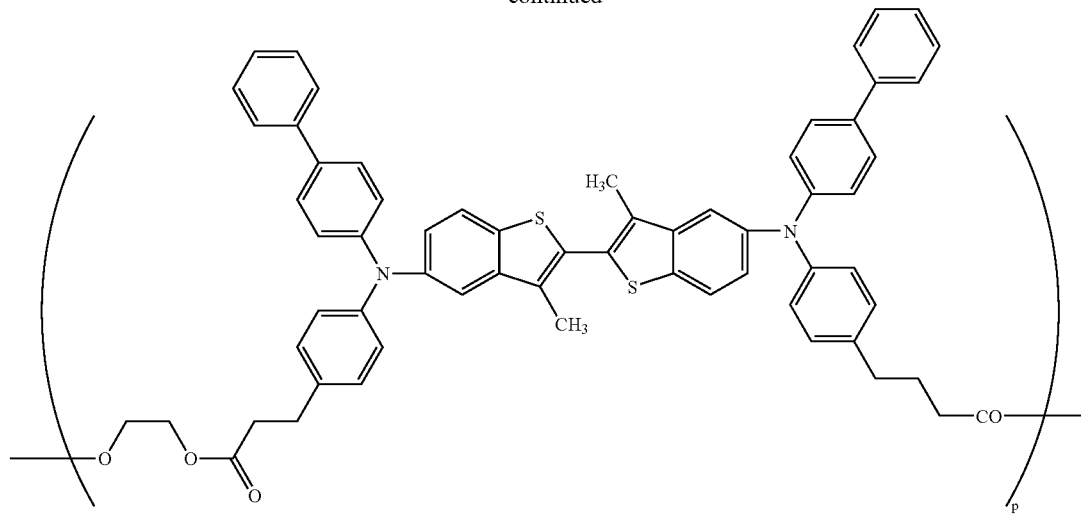

Exemplary compound (17)

<Making of Organic Electroluminescent Element>

A 10% by weight dichloromethane solution (a solution filtered through a 0.1-μm PTFE filter) containing 1 part by weight of the exemplary compound (17), 4 parts by weight of poly(N-vinylcarbazole) and 1 part by weight of the compound (VIII-1) is applied by spin coating onto a glass substrate with ITO electrode, which is the same as that used in Example A1, at the side having the electrode to form a light-emitting layer having a thickness of 0.15 μm and charge-transporting properties.

After the layer is thoroughly dried, an Mg—Ag alloy is evaporated by co-deposition to form a rear-face electrode having a width of 2 mm and a thickness of 0.15 μm such that the rear-face electrode intersects with the ITO electrode, and thus an organic electroluminescent element is obtained. The effective area of the organic electroluminescent element is 0.04 $cm^2$.

Example A3

Synthesis Example 3

—Synthesis of Intermediate 3-1—

21.4 g of 5-phenylpentanoic acid (the compound shown at the left side of the reaction formula), 12.1 g of iodine, 4.6 g of periodic acid dhydrate are placed in a 300-ml three-necked flask, to which a mixed solution of 2 ml of sulfuric acid, 80 ml of acetic acid, and 15 ml of water is added.

After stirring at 80° C. for 2 hours, the content is poured to 500 ml of 1 L of pure water in a beaker. The precipitated crystals are collected by suction filtration. The crystals are washed twice with 500 ml of a 10% by weight aqueous solution of sodium thiosulfate, and then washed with pure water until neutralized. Subsequently, the obtained crystals are vacuum dried at 50° C. for 15 hours to obtain 30 g of 5-(4-iodophenyl)pentanoic acid.

The obtained crystals (5-(4-iodophenyl pentanoic acid) are placed in a 300-ml three-necked flask, to which 100 ml of toluene is added. A mixed solution of 20 ml of methanol and 2 ml of sulfuric acid is added, and stirred for 1 hour under reflux. Subsequently, methanol is removed by evaporation from water removing tube, 500 ml of pure water is added, and the toluene layer and the aqueous layer are separated. The toluene layer is washed with pure water until neutral, and dried with sodium sulfate. After drying, toluene is removed by evaporation under reduced pressure to obtain colorless crystals. The obtained crystals are recrystallized from toluene/hexane, whereby the compound (intermediate 3-1) shown at the right side of the reaction formula is obtained in a yield of 25 g.

Subsequently, the procedure in Synthesis Example 1 is followed, except that 4-(2,4-dimethyl)-phenyl acetoanilide is used in place of acetoanilide, and the intermediate 3-1 is used in place of methyl 4-iodophenylpropionate, whereby DAA-13 is obtained.

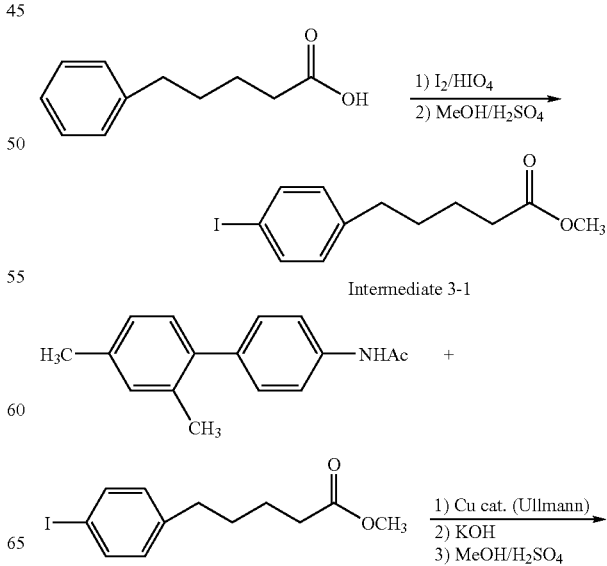

Intermediate 3-1

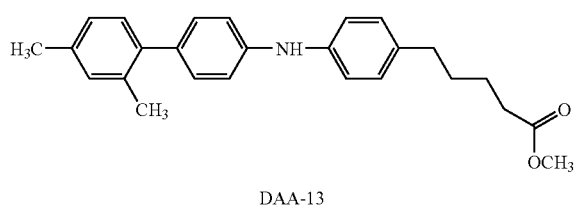

DAA-13

—Synthesis of Exemplary Compound (9)

Subsequently, synthesis is carried out in a manner substantially similar to Synthesis Example 1, except that DAA-13 is used in place of DAA-1, and the halogenated intermediate 2 is used in place of the halogenated intermediate 1, whereby the compound shown at the right side of the reaction formula is obtained in a yield of 1.4 g.

The molecular weight of the polymer is measured by GPC; $Mw=9.8\times10^4$ (in terms of styrene), $Mw/Mn=1.15$, and the degree of polymerization p calculated from the molecular weight of the monomer is about 87.

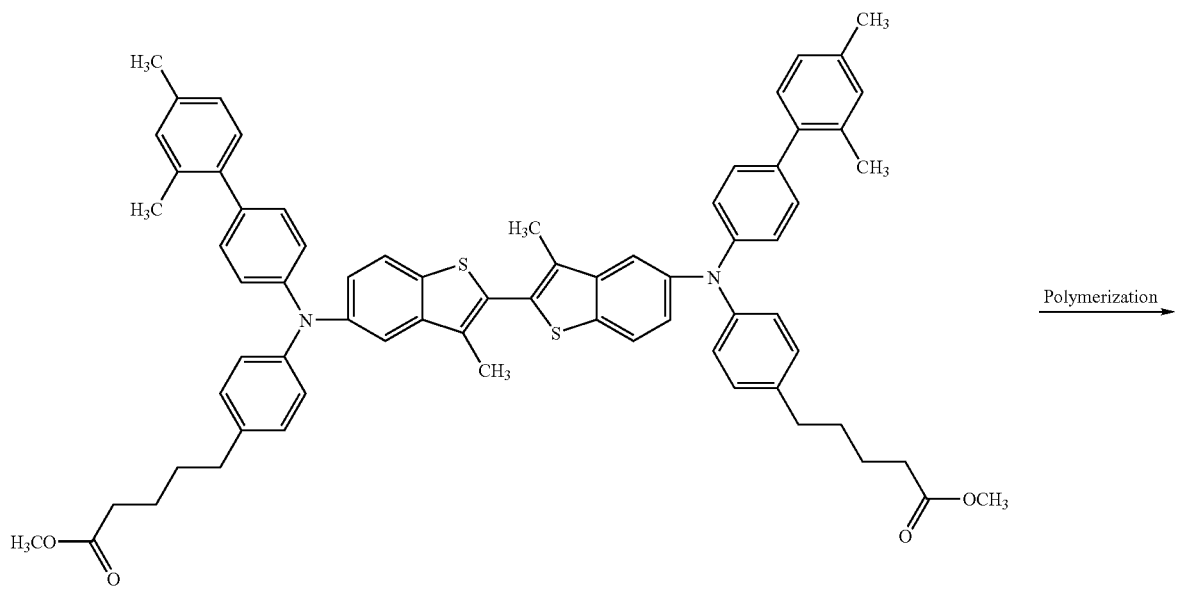

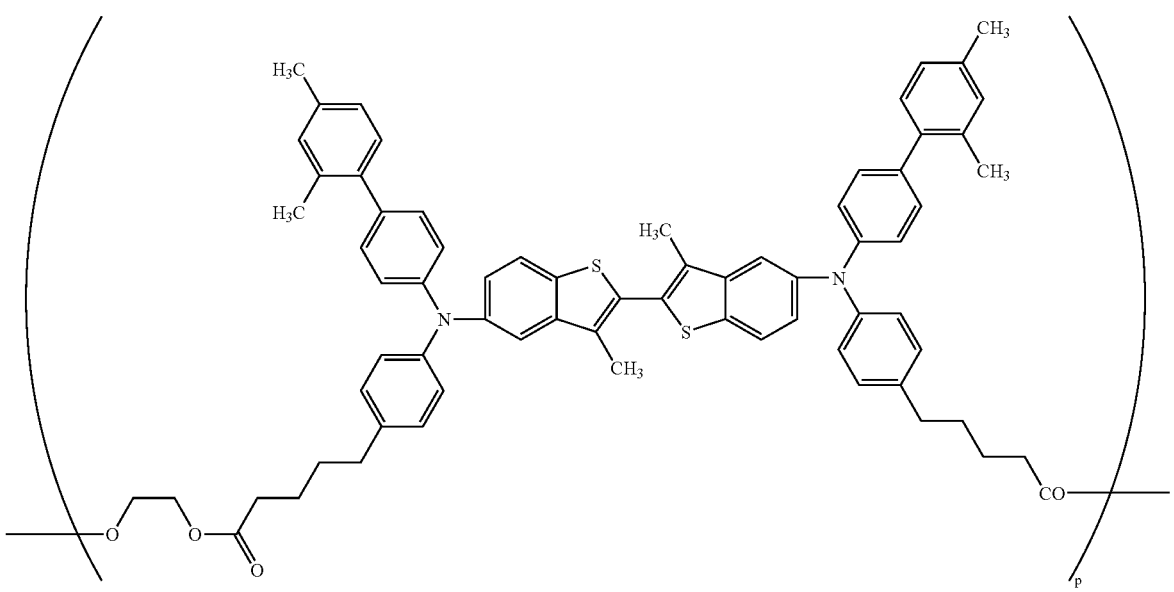

Exemplary compound (9)

<Making of Organic Electroluminescent Element>

The charge-transporting polyester [exemplary compound (9)] is applied onto a glass substrate with ITO electrode, which is the same as that used in Example A1, at the side having the electrode to form a hole-transporting layer having a thickness of 0.050 μm.

Subsequently, the exemplary compound (VIII-1) and the compound (IX-1) are applied in a thickness of 0.065 μm to form a light-emitting layer, and the compound (A-1) is applied in a thickness of 0.030 μm to form an electron-transporting layer. Subsequently, an Mg—Ag alloy is evaporated by co-deposition to form a rear-face electrode having a width of 2 mm and a thickness of 0.15 μm such that the rear-face electrode intersects with the ITO electrode, and thus an organic electroluminescent element is obtained. The effective area of the organic electroluminescent element is 0.04 cm$^2$.

Example A4

Synthesis Example 4

—Synthesis of Exemplary Compound (42)—
—Synthesis of DAA-5—

4-(2-thienyl)phenyl acetoanilide (43 g, the compound shown at the left side of the reaction formula), methyl 4-iodophenylpropionate (64 g, the compound shown at the left side of the reaction formula), potassium carbonate (33 g), and copper sulfate pentahydrate (6.0 g) are placed in a 500-ml three-necked flask equipped with a thermometer, a condenser, and a magnetic stirrer, and dissolved in o-dichlorobenzene (50 ml). In a nitrogen atmosphere, the solution is heated at 180° C. for 10 hours. After completion of the reaction, a solution of potassium hydroxide (17 g) in ethylene glycol (200 ml) is added, and heated for 3 hours under reflux in a nitrogen atmosphere. After completion of the reaction, the solution is cooled to 25° C., poured to pure water (500 ml), and neutralized with hydrochloric acid to precipitate crystals. The crystals are collected by filtration, washed with water, and then transferred to a 2-L flask. Toluene (500 ml) is added into the flask, heated under reflux, and water is removed azeotropically. Subsequently, methanol (100 ml) and concentrated sulfuric acid (0.5 ml) are added into the flask, and heated under reflux for 3 hours in a nitrogen gas stream. After completion of the reaction, the content is poured to distilled water, and extracted with toluene. The toluene layer is washed with distilled water, and dried with anhydrous sodium sulfate. The solvent is removed by evaporation under reduced pressure, followed by recrystallization from a mixed solution of ethyl acetate and hexane, whereby the compound (DAA-5) shown at the right side of the reaction formula is obtained in a yield of 35 g.

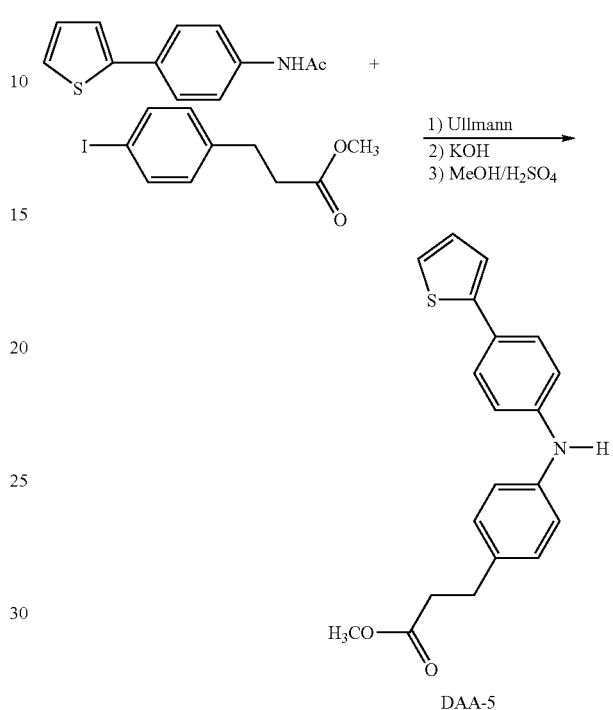

DAA-5

—Synthesis of Exemplary Compound (42)—

Synthesis is conducted in a manner substantially similar to Synthesis Example 1, except that DAA-5 is used in place of DAA-1, and the halogenared intermediate 2 is used in place of the halogenated intermediate 1, whereby the polymer (exemplary compound (42)) shown at the right side of the reaction formula is obtained in a yield of 1.1 g. The molecular weight of the polymer is measured by GPC; Mw=9.1×10$^4$ (in terms of styrene), Mw/Mn=1.14, and the degree of polymerization p calculated from the molecular weight of the monomer is about 86.

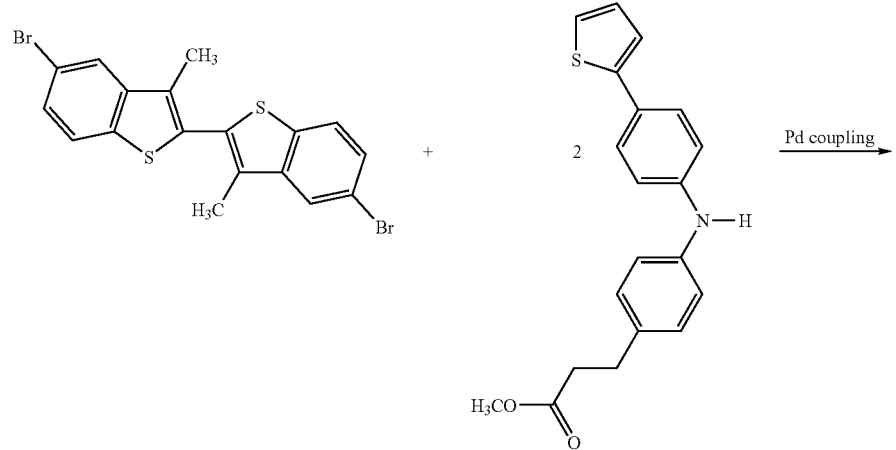

-continued
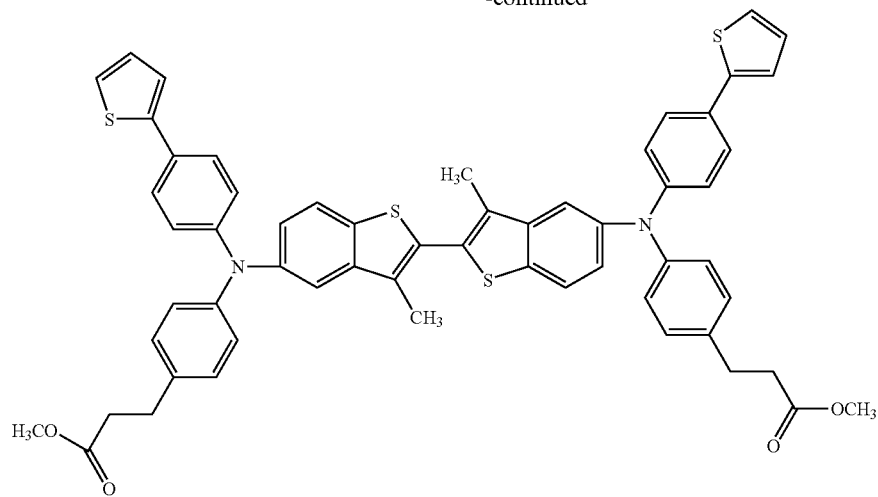
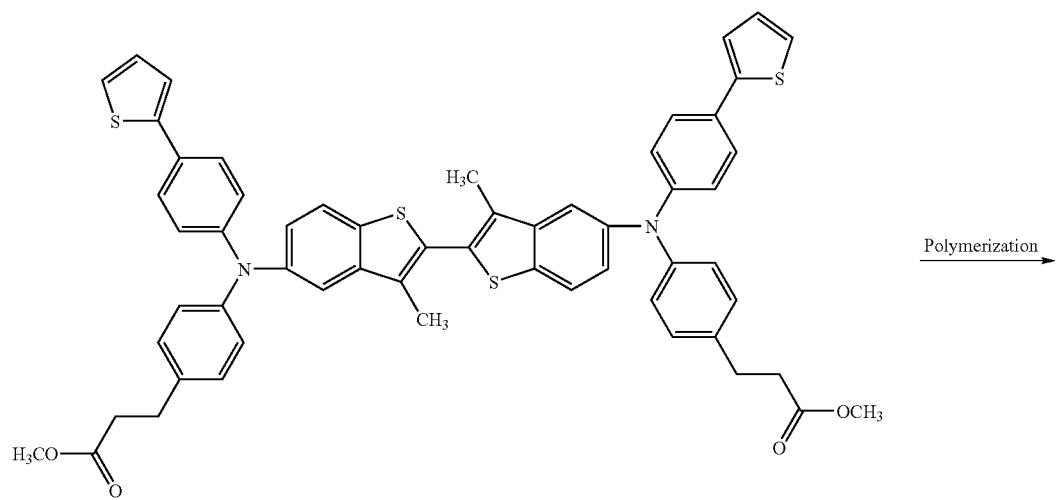
Polymerization
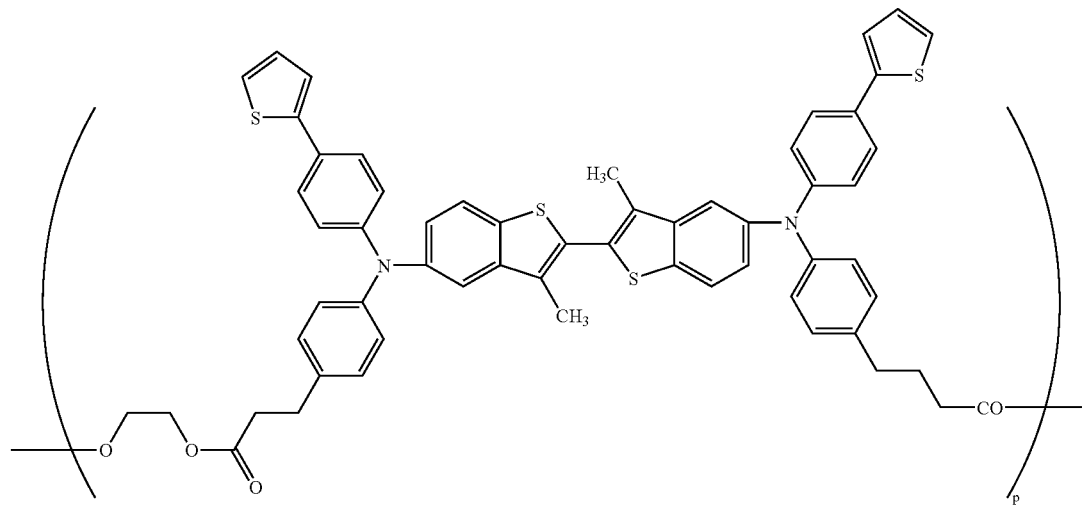
Exemplary compound (42)

<Making of Organic Electroluminescent Element>

Charge-transporting polyester [exemplary compound (42)] is applied by ink jetting onto a glass substrate with ITO electrode, which is the same as that used in Example A1, at the side having the electrode to form a hole-transporting layer having a thickness of 0.050 μm. Subsequently, a 10% by weight dichloromethane solution (a solution filtered through a 0.1-μm PTFE filter) containing 1 part by weight of the compound (VIII-17) and 1 part by weight of the compound (IX-5) is applied by spin coating to form a light-emitting layer having a thickness of 0.065 μm. The compound (VIII-17) has a structure wherein n=4, g=200, and V is a compound represented by Formula (30) (wherein c=0, $R_{16}$ is a hydrogen atom). After thorough drying, Ca is evaporated to a thickness of 0.08 μm, and then Al is evaporated to a thickness of 0.15 μm to form a rear-face electrode having a width of 2 mm and a total thickness of 0.23 μm such that the rear-face electrode intersects with the ITO electrode, and thus an organic electroluminescent element is obtained. The effective area of the organic electroluminescent element is 0.04 cm$^2$.

Example A5

Synthesis Example 5

—Synthesis of DAA-3—

9,9-dimethyl-2-acetamidofluorene (5.0 g, the compound shown at the left side of the reaction formula), methyl 4-iodophenylpropionate (6.0 g, the compound shown at the left side of the reaction formula), potassium carbonate (4.1 g), and copper sulfate pentahydrate (0.41 g) are placed in a 100-ml three-necked flask equipped with a thermometer, a condenser, and a magnetic stirrer, and dissolved in o-dichlorobenzene (20 ml). In a nitrogen atmosphere, the solution is heated at 185° C. for 13 hours. After completion of the reaction, a solution of potassium hydroxide (1.5 g) in ethylene glycol (30 ml) is added, and heated for 5 hours under reflux in a nitrogen atmosphere. After completion of the reaction, the solution is cooled to 25° C., poured to water (200 ml), and neutralized with hydrochloric acid to precipitate crystals. The crystals are collected by filtration, washed with water, and then transferred to a 1-L flask. Toluene (300 ml) is added into the flask, heated under reflux, and water is removed azeotropically. Subsequently, methanol (100 ml) and concentrated sulfuric acid (0.5 ml) are added into the flask, and heated under reflux for 3 hours in a nitrogen gas stream. After completion of the reaction, the content is poured to distilled water, and extracted with toluene. The toluene layer is washed with distilled water, and dried with anhydrous sodium sulfate. The solvent is removed by evaporation under reduced pressure, followed by recrystallization from a mixed solution of ethyl acetate and hexane, whereby the compound (DAA-3) shown at the right side of the reaction formula is obtained in a yield of 5.0 g. the right side of the reaction formula is obtained in a yield of 5.0 g.

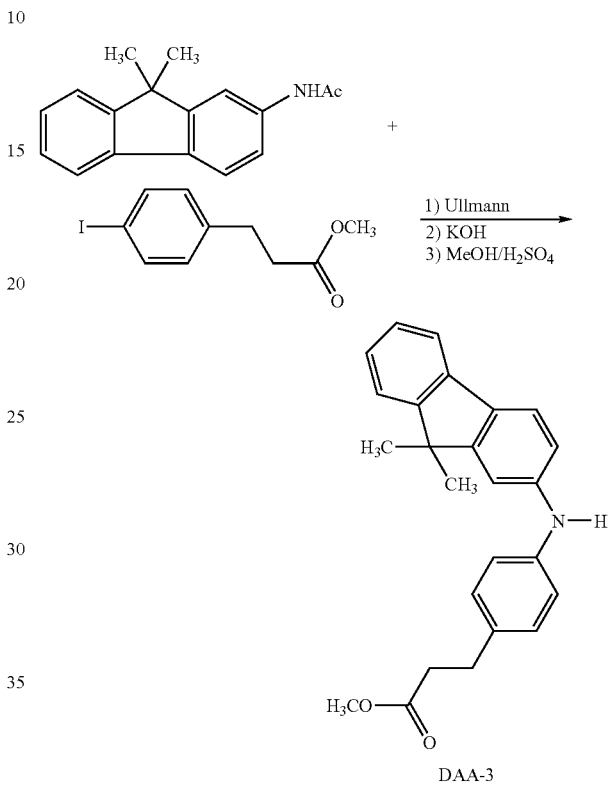

—Synthesis of Exemplary Compound (25)—

Synthesis is carried out in a manner substantially similar to Synthesis Example 1, except that DAA-3 is used in place of DAA-1, and the halogenated intermediate 2 is used in place of the halogenated intermediate 1, whereby the monomer shown at the right side of the reaction formula is obtained.

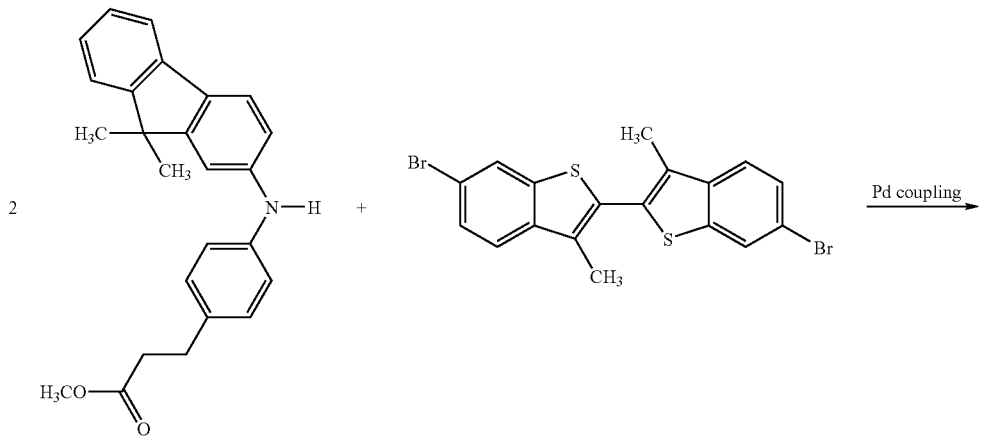

-continued

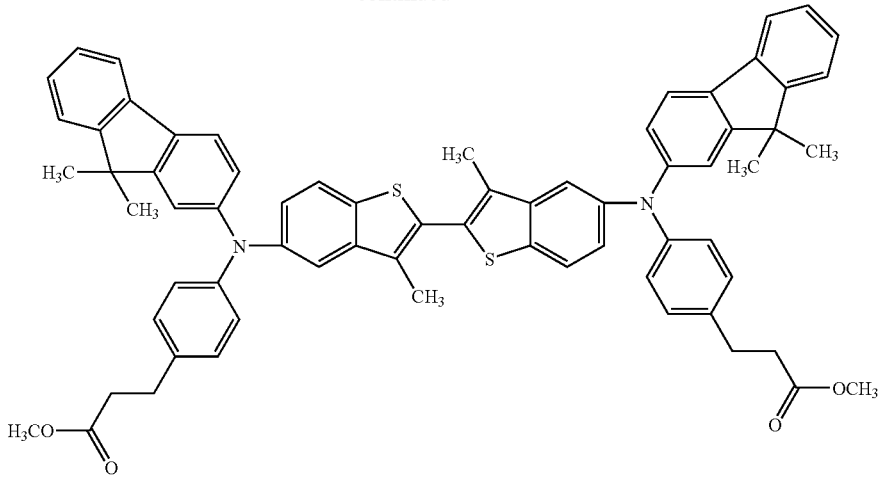

Subsequently, synthesis is conducted in a manner substantially similar to Synthesis Example 1, except that the above monomer is used in place of the monomer 1, whereby the polymer shown at the right side of the reaction formula (exemplary compound (25)) is obtained in a yield of 1.8 g. The molecular weight of the polymer is measured by GPC; $Mw=7.7\times10^4$ (in terms of styrene), $Mw/Mn=1.26$, and the degree of polymerization p calculated from the molecular weight of the monomer is about 70.

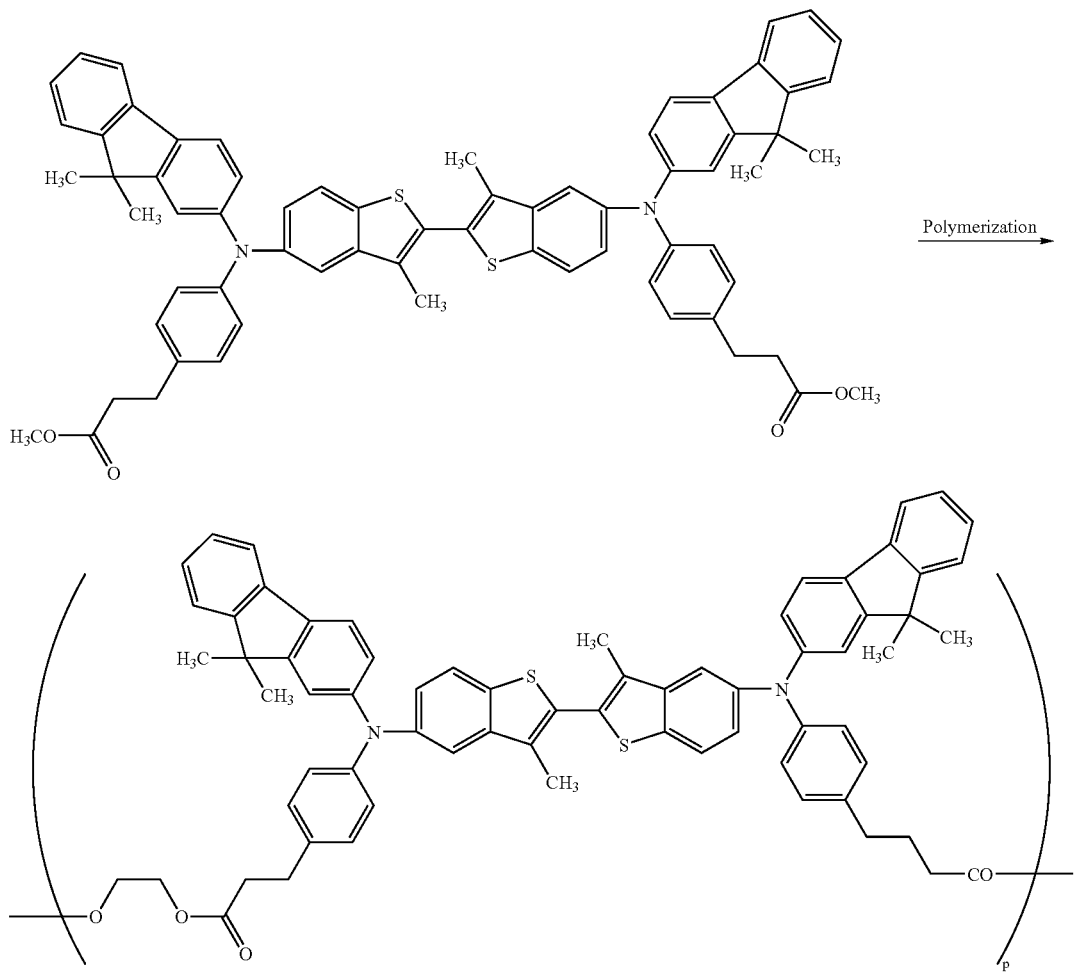

Exemplary compound (25)

<Making of Organic Electroluminescent Element>

An organic electroluminescent element is made in a manner substantially similar to Example A4, except that the exemplary compound (25) is used in place of the exemplary compound (42).

Example A6

Synthesis Example 6

—Synthesis of Exemplary Compound (34)—
—Synthesis of DAA-6—

4-bromotriphenylamine (18 g, manufactured by Aldrich, the compound shown at the left side of the reaction formula), methyl 4-acetamidophenylpropionate (11 g, the compound shown at the left side of the reaction formula), potassium carbonate (8.3 g), and copper sulfate pentahydrate (2.0 g) are placed in a 300-ml three-necked flask equipped with a thermometer, a condenser, and a magnetic stirrer, and dissolved in o-dichlorobenzene (300 ml). In a nitrogen atmosphere, the solution is heated at 185° C. for 11 hours. After completion of the reaction, a solution of potassium hydroxide (4.0 g) in ethylene glycol (50 ml) is added, and heated for 5 hours under reflux in a nitrogen atmosphere. After completion of the reaction, the solution is cooled to 25° C., poured to water (300 ml), and neutralized with hydrochloric acid to precipitate crystals. The crystals are collected by filtration, washed with water, and then transferred to a 1-L flask. Toluene (300 ml) is added into the flask, heated under reflux, and water is removed azeotropically. Subsequently, methanol (100 ml) and concentrated sulfuric acid (0.5 ml) are added into the flask, and heated under reflux for 3 hours in a nitrogen gas stream. After completion of the reaction, the content is poured to distilled water, and extracted with toluene. The toluene layer is washed with distilled water, and dried with anhydrous sodium sulfate. The solvent is removed by evaporation under reduced pressure, followed by recrystallization from a mixed solution of ethyl acetate and hexane, whereby the compound (DAA-6) shown at the right side of the reaction formula is obtained in a yield of 11 g.

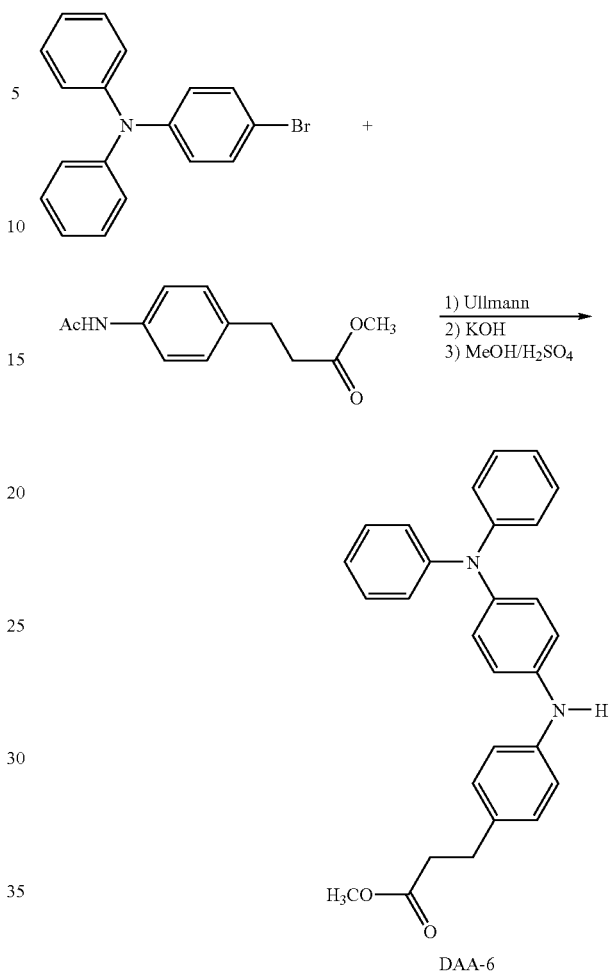

Synthesis is carried out in a manner substantially similar to Synthesis Example 1, except that DAA-6 is used in place of DAA-1, and the halogenated intermediate 2 is used in place of the halogenated intermediate 1, whereby the monomer shown at the right side of the reaction formula is obtained.

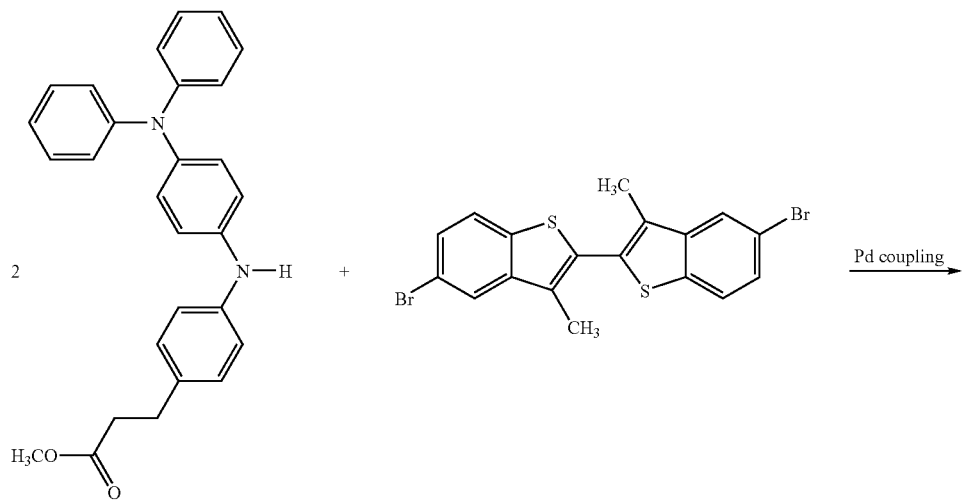

-continued

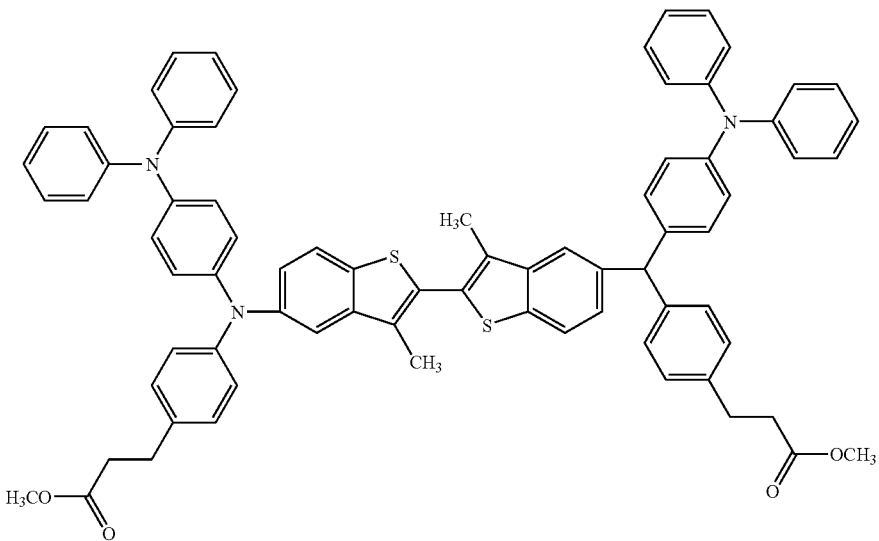

Subsequently, 1.5 g of the exemplary compound (34) shown at the right side of the reaction formula is obtained in a manner substantially similar to Synthesis Example 1. The molecular weight of the polymer is measured by GPC; $Mw=9.7\times10^4$ (in terms of styrene), $Mw/Mn=1.55$, and the degree of polymerization p calculated from the molecular weight of the monomer is about 81.

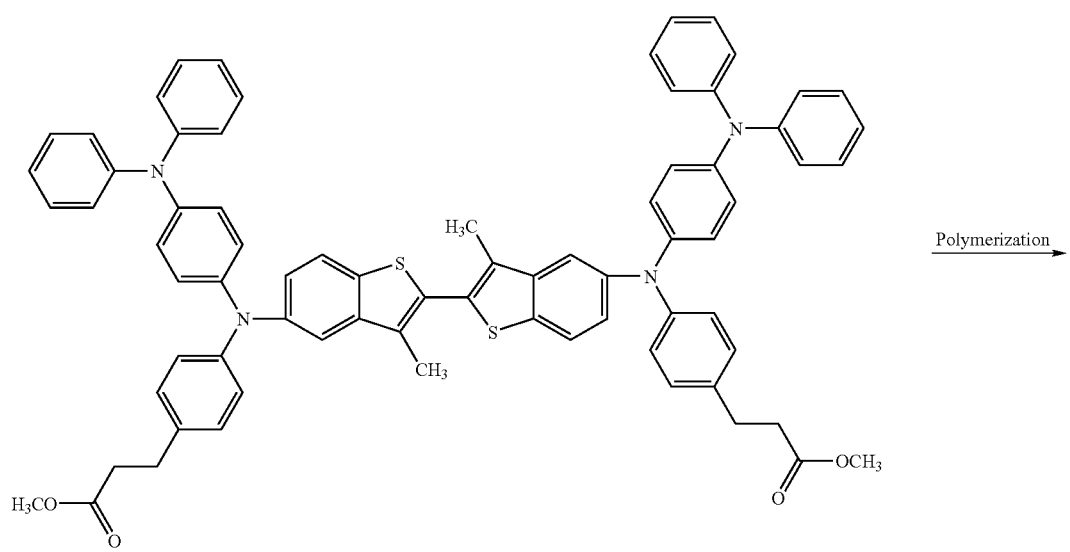

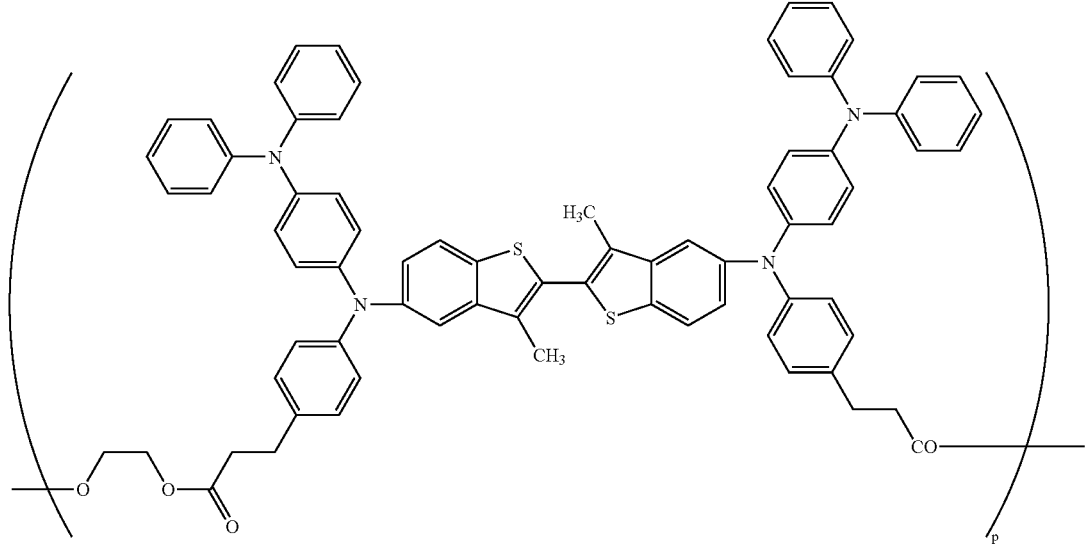

Exemplary compound (34)

<Making of Organic Electroluminescent Element>

An organic electroluminescent element is made in a manner substantially similar to Example A2, except that the exemplary compound (34) is used in place of the exemplary compound (17).

Example A7

Synthesis Example 7

—Synthesis of Intermediate 7-1—

In a nitrogen atmosphere, tetrakis(triphenylphosphine) palladium (0) (18.7 g) and 1 L of tetrahydrofuran (THF) are placed in a 10 l separable flask equipped with a thermometer, a condenser, and a stirring motor, and stirred. Into the flask, a sodium carboxylate aqueous solution, which has been prepared by dissolving 4-iodophenylpropionic acid (441 g, the compound shown at the right side of the reaction formula) in 1 N sodium hydroxide aqueous solution (1600 ml), is added. A 2 M sodium carbonate aqueous solution (1600 ml), and a solution of phenylboronic acid (214 g, the compound shown at the right side of the reaction formula) in 800 ml of THF are added in this order. The solution is refluxed for 3 hours in a nitrogen atmosphere, cooled to 25° C., and then 500 ml of hydrochloric acid is added to the solution to obtain a pH 1. The aqueous solution is extracted with 2.5 L of acetic acid, the ethyl acetate layer is washed three times with 3 L portions of pure water, and once with 3 L of saturated saline. The solution is dried with sodium sulfate, filtered, and the solvent is removed by evaporation under reduced pressure. The precipitated crystals are washed with 1 L of boiling hexane. The obtained coarse crystals are recrystallized from diisopropyl ether, whereby biphenylpropionic acid (the compound shown at the right side of the reaction formula) is obtained in a yield of 300 g. The yield is 83%.

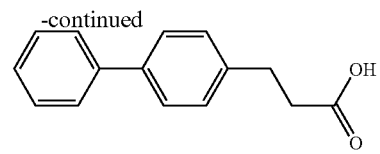

Synthesis is carried out in a manner substantially similar to the synthesis of the intermediate 3-1, except that biphenylpropionic acid is used in place of 5-phenylpentanoic acid, whereby the compound shown at the right side of the reaction formula (intermediate 7-1) is obtained. The yield is 60%.

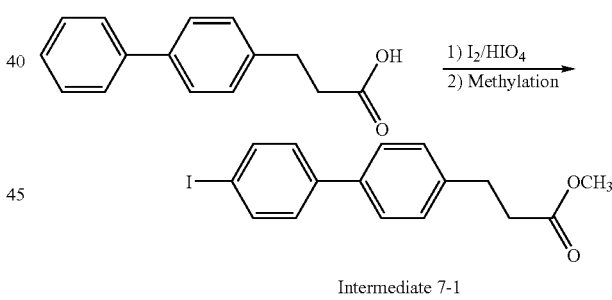

Intermediate 7-1

—Synthesis of DAA-4—

Synthesis is carried out in a manner substantially similar to the synthesis of DAA-1 in Synthesis Example 1, except that 4-ethylacetoanilide is used in place of acetoanilide, and the intermediate 7-1 is used in place of methyl 4-iodophenylpropionate, whereby the compound (DAA-4) shown at the right side of the reaction formula is obtained in a yield of 20 g.

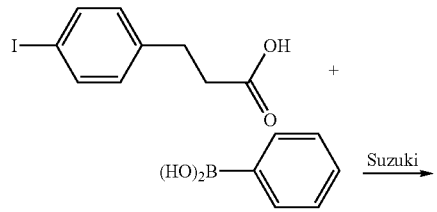

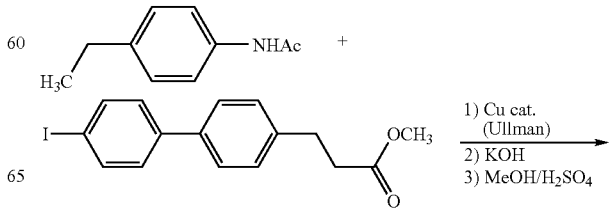

-continued

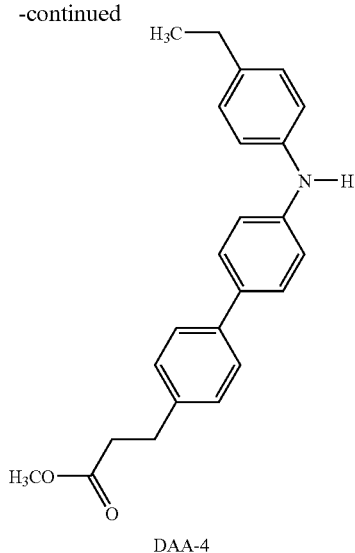

DAA-4

—Synthesis of Exemplary Compound (57)—

Synthesis is carried out in a manner substantially similar to the synthesis of monomer 1 in Synthesis Example 1, except that DAA-4 is used in place of DAA-1, and the intermediate 7-1 is used in place of the halogenated intermediate 1, whereby the monomer shown at the right side of the reaction formula is obtained.

Subsequently, synthesis is carried out in a manner substantially similar to Synthesis Example 1, except that the monomer shown at the left side of the reaction formula is used in place of the monomer 1, and 1,6-hexylene glycol is used ethylene glycol, whereby the exemplary compound (57) is obtained in a yield of 2.3 g.

The molecular weight of the polymer is measured by GPC; $Mw=1.1\times10^5$ (in terms of styrene), $Mw/Mn=1.32$, and the degree of polymerization p calculated from the molecular weight of the monomer is about 74.

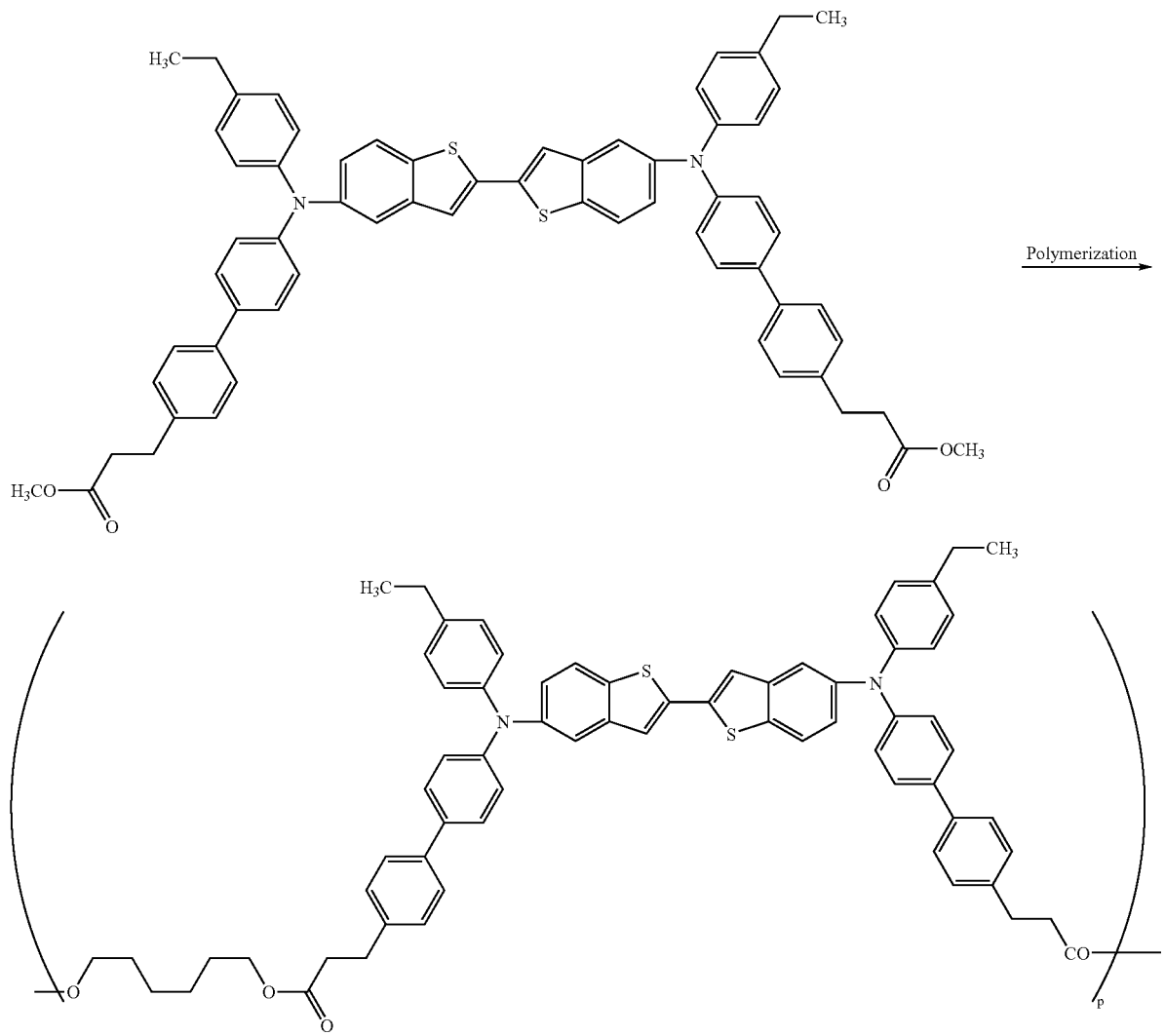

Exemplary compound (57)

Making of Organic Electroluminescent Element

The compound (VIII-14) as a luminescent material is applied by ink jetting onto a glass substrate with ITO electrode, which is the same as that used in Example A1, at the side having the electrode to form a light-emitting layer having a thickness of 0.050 μm. In the compound (VIII-14), n=1 and g=800.

After the light-emitting layer is thoroughly dried, a dichloromethane solution containing 1.5 parts by weight of the charge-transporting polyester [exemplary compound (57)] (a solution filtered through a 0.1-μm PTFE filter) is applied by ink jetting to form an electron-transporting layer having a thickness of 0.05 μm.

Subsequently, Ca is evaporated to a thickness of 0.08 μm, and then Al is evaporated to a thickness of 0.15 μm to form a rear-face electrode having a width of 2 mm and a total thickness of 0.23 μm such that the rear-face electrode intersects with the ITO electrode, and thus an organic electroluminescent element is obtained. The effective area of the organic electroluminescent element is 0.04 cm$^2$.

Example A8

Synthesis Example 8

—Synthesis of Exemplary Compound (59)—
—Synthesis of Intermediate 8-1—

Synthesis is carried out in a manner substantially similar to the synthesis of the intermediate 3-1 in Synthesis Example 3, except that 6-phenylhexanoic acid is used in place of 5-phenylpentanoic acid, whereby the compound (intermediate 8-1) shown at the right side of the reaction formula is synthesized in a yield of 63%.

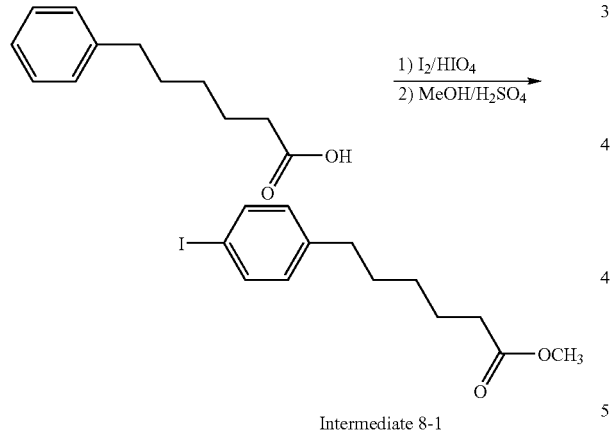

Intermediate 8-1

—Synthesis of Intermediate 8-2—

Subsequently, in a nitrogen atmosphere, tetrakis(triphenylphosphine) palladium (0) (0.58 g) and 50 ml of THF are placed in a 500-ml three-necked flask equipped with a thermometer, a condenser, and a magnetic stirrer, and stirred. Into the flask, the intermediate 8-1 (18.2 g), a 2 M sodium carbonate aqueous solution (50 ml), and a solution of 4-acetamidophenylboronic acid pinacol ester (manufactured by Aldrich, 13 g, the compound shown at the left side of the reaction formula) in 50 ml of THF are added in this order. The solution is refluxed for 3 hours in a nitrogen atmosphere, cooled to 25° C., and then 50 ml of hydrochloric acid is added to the solution to obtain a pH 1. The aqueous solution is extracted with 1.0 L of toluene, the toluene layer is washed three times with 1 L portions of pure water, and once with 1 L of saturated saline. The solution is dried with sodium sulfate, filtered, and the solvent is removed by evaporation under reduced pressure. The obtained coarse crystals are washed with 500 ml of boiling ethyl acetate. The obtained coarse crystals are recrystallized from toluene, whereby the compound shown at the right side of the reaction formula (intermediate 8-2) is obtained in a yield of 11.5 g. The yield is 70%.

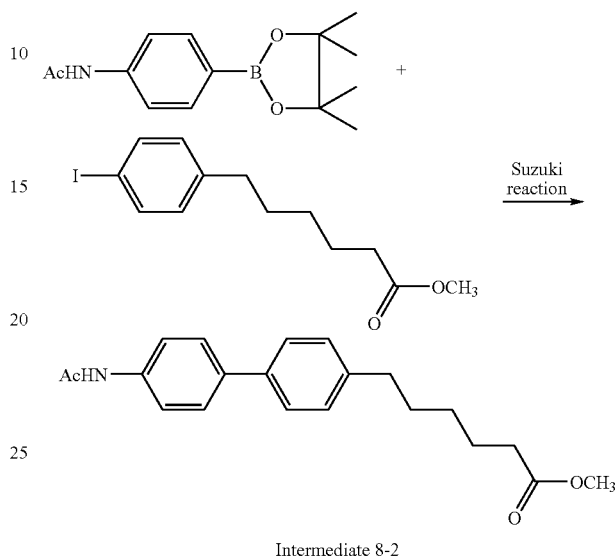

Intermediate 8-2

—Synthesis of Halogenated Intermediate 3—

Synthesis is carried out in a manner substantially similar to the synthesis of the halogenated intermediate 1 in Synthesis Example 1, except that the compound shown at the left side of the reaction formula is used in place of 5-bromobenzo[b]thiophene-2-boronic acid, whereby the compound shown at the right side of the reaction formula (halogenated intermediate 3) is obtained in a yield of 60%.

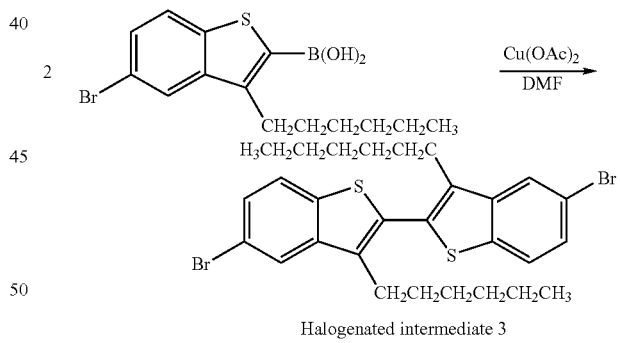

Halogenated intermediate 3

—Synthesis of Halogenated Intermediate 4—

5-hexyl-2,2'-bithiophene (25 g, the compound shown at the left side of the reaction formula) is dissolved in N,N-dimethylformamide (DMF, 100 ml) in a 500-ml three-necked flask equipped with a thermometer, and a magnetic stirrer. Into the flask, N-bromosuccinimido (NBS, 18 g) is added slowly, and magnetically stirred at room temperature (25° C.) for 3 hours in a nitrogen atmosphere. After completion of the reaction, the content is poured to pure water (1000 ml) to precipitate crystals. After the crystals are washed with pure water (1000 ml), followed by recrystallization from hexane, and vacuum drying at 50° C. for 15 hours, whereby the compound (halogenated intermediate 4) shown at the right side of the reaction formula is obtained in a yield of 30 g.

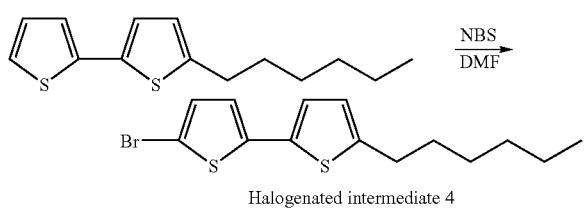

Halogenated intermediate 4

—Synthesis of Halogenated Intermediate 5—

In a nitrogen atmosphere, tetrakis(triphenylphosphine) palladium (0) (5.8 g) and 200 ml of THF are placed in a 1000-ml three-necked flask equipped with a thermometer, a condenser, and a stirring motor, and stirred. Into the flask, the halogenated intermediate 4 (30 g, the compound shown at the left side of the reaction formula), a 2 M sodium carbonate aqueous solution (100 ml), and a solution of 2,2'-bithiophene-5-boronic acid pinacol ester (30 g, the compound shown at the left side of the reaction formula) in THF (100 ml) are added in this order. The solution is refluxed for 5 hours in a nitrogen atmosphere, cooled to 25° C., and then 50 ml of hydrochloric acid is added to the solution to obtain a pH 1. The aqueous solution is extracted with 500 ml of ethyl acetate, the ethyl acetate layer is washed three times with 500 ml portions of pure water, and once with 500 ml of saturated saline. The solution is dried with sodium sulfate, filtered, and ethyl acetate and THF are removed by evaporation under reduced pressure, whereby 37 g of coarse crystals are obtained.

Subsequently, the coarse crystals of N-hexyl-quarter-thiophene (30 g) are dissolved in DMF (300 ml) in a 500-ml three-necked flask equipped with a thermometer, and a magnetic stirrer. Into the flask NBS (14 g) is added slowly, and magnetically stirred at room temperature (25° C.) for 10 hours in a nitrogen atmosphere. After completion of the reaction, the content is poured to pure water (1000 ml) to precipitate crystals. The crystals are washed with pure water (1000 ml), followed by recrystallization from toluene, whereby the compound (halogenated intermediate 5) shown at the right side of the reaction formula is obtained in a yield of 27 g.

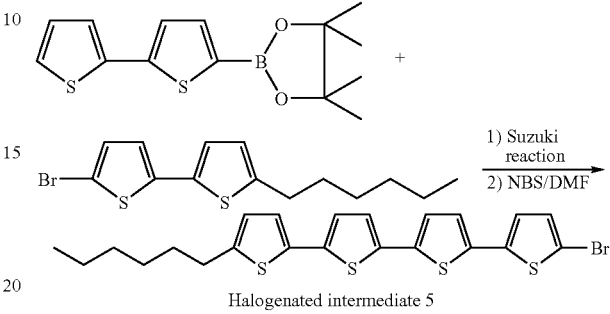

Halogenated intermediate 5

—Synthesis of DAA-8—

Synthesis is carried out in a manner substantially similar to the synthesis of DAA6 in Synthesis Example 6, except that the halogenated intermediate 5 is used in place of 4-bromotriphenylamine, and the intermediate 8-2 is used in place of methyl 4-acetamidophenylpropionate, whereby the compound shown at the right side of the reaction formula (DAA-8) is obtained in a yield of 45%.

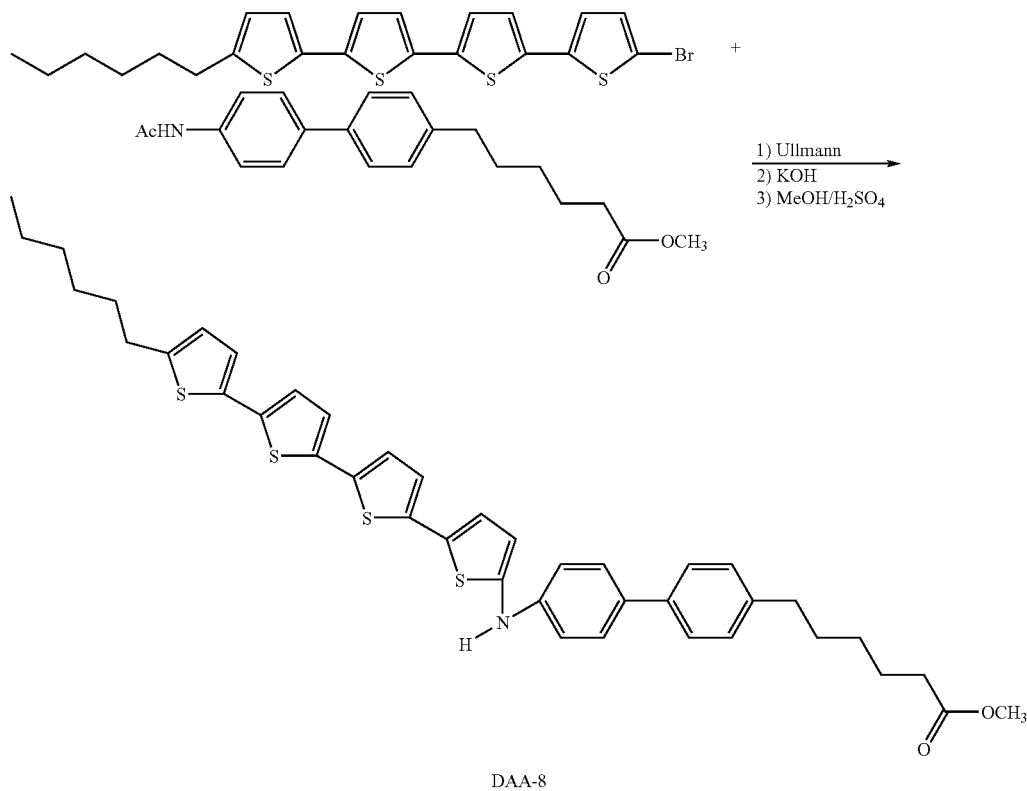

DAA-8

Synthesis is carried out in a manner substantially similar to the synthesis of the monomer of the exemplary compound (1), except that DAA-8 is used in place of DAA-1, and the halogenated intermediate 3 is used in place of the halogenated intermediate 1, whereby the monomer shown at the right side of the reaction formula is obtained.

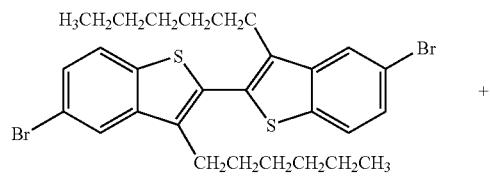
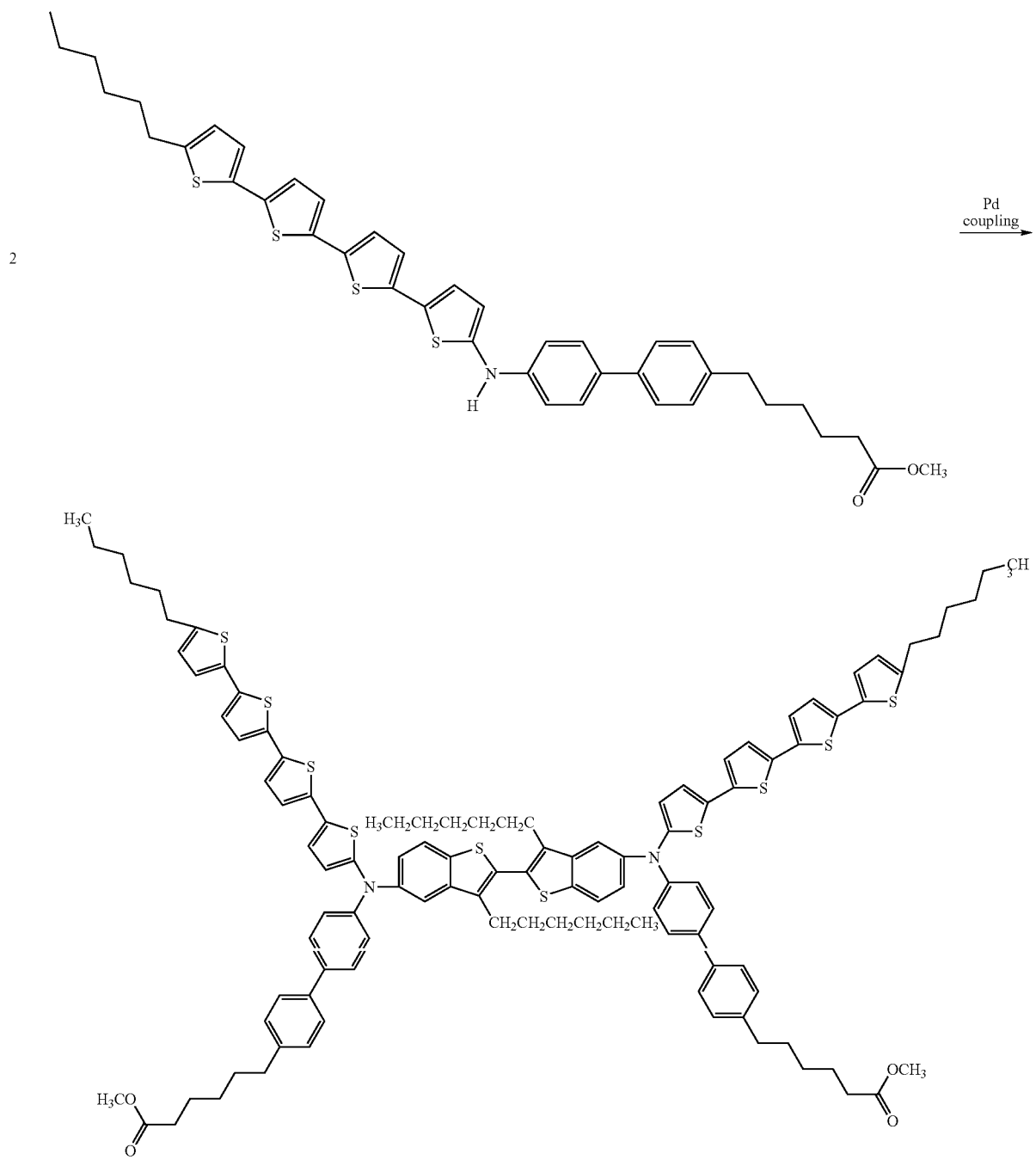

Subsequently, synthesis is carried out in a manner substantially similar to Synthesis Example 1, except that the monomer shown at the left side of the reaction formula is used in place of the monomer 1, and cyclohexylene glycol is used in place of ethylene glycol, whereby the exemplary compound (59) is obtained in a yield of 2.3 g.

The molecular weight of the polymer is measured by GPC; the Mw=$7.9 \times 10^4$ (in terms of styrene), Mw/Mn=1.28, and the degree of polymerization p calculated from the molecular weight of the monomer is about 40.

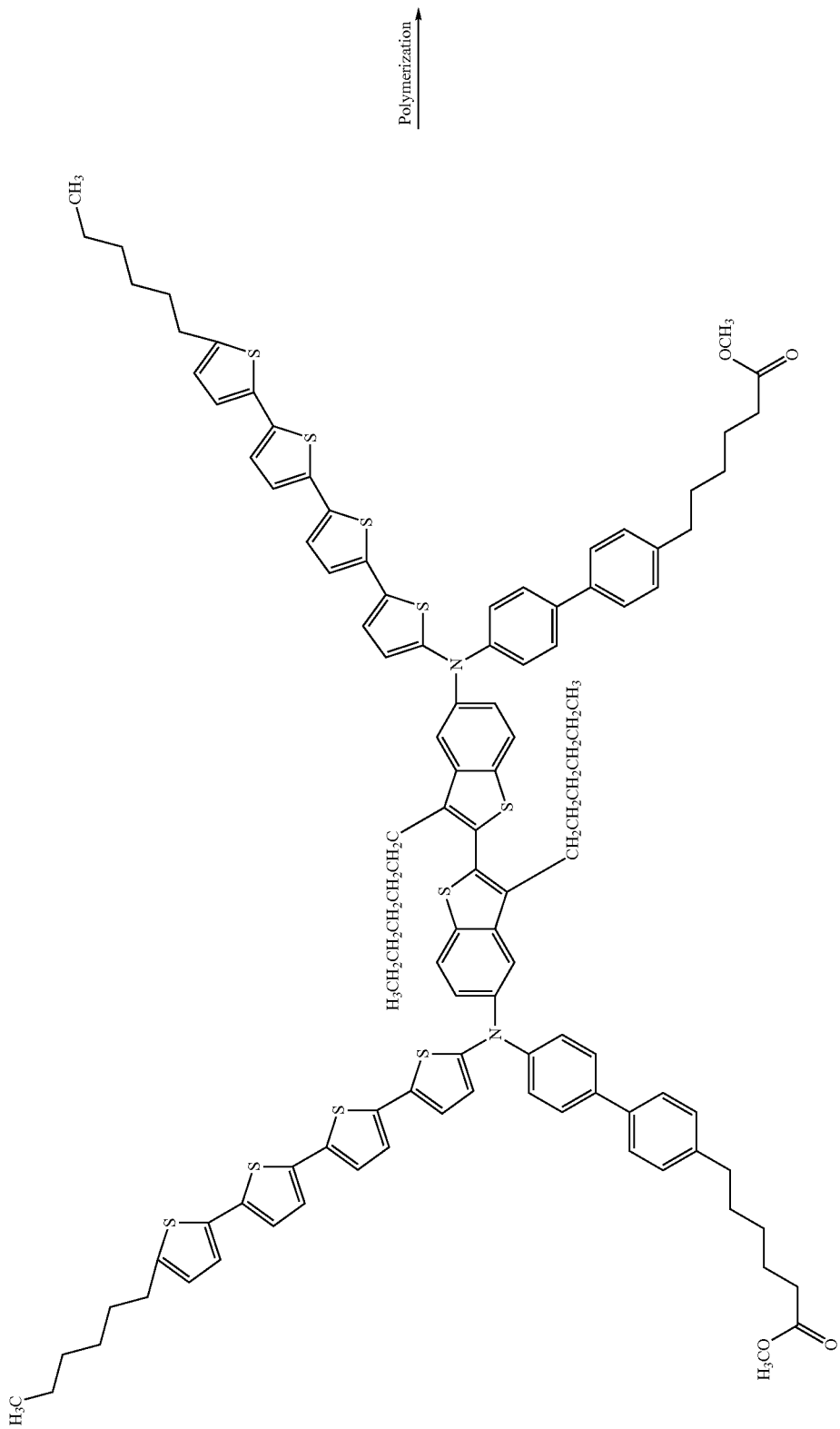

-continued
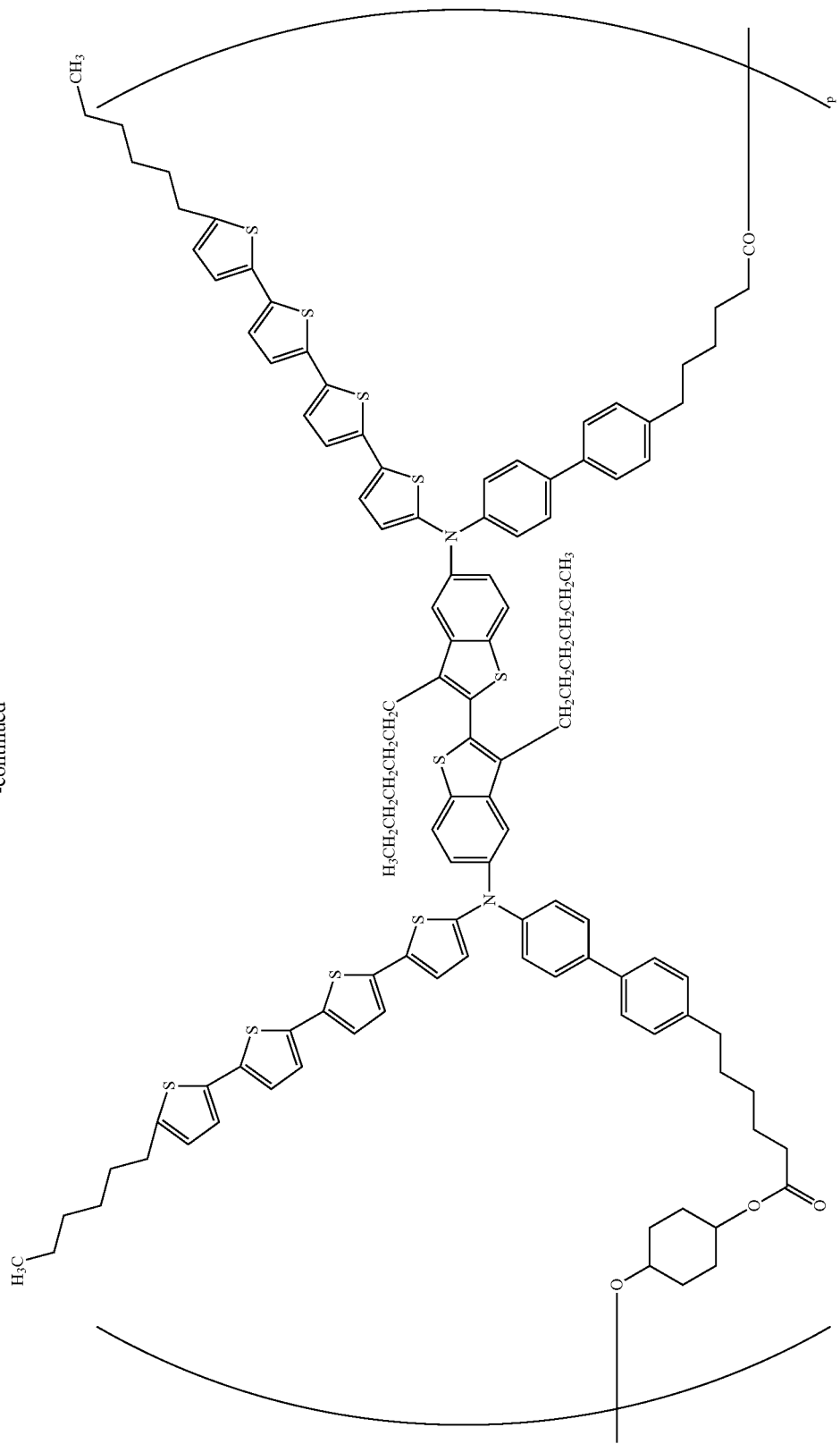
Exemplary compound (59)

<Making of Organic Electroluminescent Element>

A dichloromethane solution (a solution filtered through a 0.5-μm PTFE filter) 5% by weight of the charge-transporting polyester [exemplary compound (59)] is applied by spin coating onto a glass substrate with ITO electrode, which is the same as that used in Example A1, at the side having the electrode to form a light-emitting layer having a thickness of 0.10 μm and charge-transporting properties.

After the layer is thoroughly dried, using a metallic mask having strip-shaped holes, LiF and Al are evaporated onto the layer to thicknesses of 0.005 μm and 0.15 μm, respectively, to form a rear-face electrode having a width of 2 mm and a thickness of 0.15 μm such that the rear-face electrode intersects with the ITO electrode, and thus an organic electroluminescent element is obtained. The effective area of the organic electroluminescent element is 0.04 cm$^2$.

The charge-transporting polyester is identified using a $^1$H-NMR spectrum ($^1$H-NMR, solvent: CDCl$_3$, trade name: UNITY-300, manufactured by Varian, Inc., 300 MHz) and an IR spectrum (KBr method, Fourier transform infrared spectrophotometer (trade name: FT-730, manufactured by Horiba, Ltd., resolution: 4 cm$^{-1}$).

Comparative Example A1

An organic electroluminescent element is made in a manner substantially similar to Example A1, except that the compound (XI) is used in place of the exemplary compound (1).

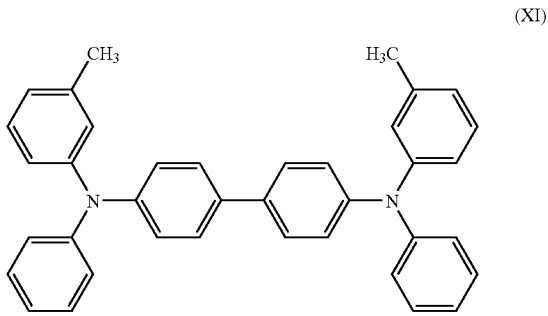

(XI)

Comparative Example A2

A 10% by weight dichloromethane solution containing 2 parts by weight of polyvinylcarbazole (PVK) as a charge-transporting polymer, 0.1 parts by weight of the compound (VI-1) as a luminescent material, and 1 part by weight of the compound (A-1) as an electron-transporting material is prepared, and the solution is filtered through a 0.1-μm PTFE filter.

Subsequently, the solution is applied by dip coating on the glass substrate with ITO electrode, which is the same as that used in Example A1, at the side having the electrode to form a light-emitting layer having a thickness of 0.15 μm and charge-transporting properties. After the light-emitting layer having charge-transporting properties is thoroughly dried, an Mg—Ag alloy is evaporated by co-deposition to form a rear-face electrode having a width of 2 mm and a thickness of 0.15 μm such that the rear-face electrode intersects with the ITO electrode, and thus an organic electroluminescent element is obtained. The effective area of the organic electroluminescent element is 0.04 cm$^2$.

Comparative Example A3

A 10% by weight dichloromethane solution containing 2 parts by weight of the compound (XII) as a charge-transporting polymer, 0.1 parts by weight of the compound (VI-1) as a luminescent material, and 1 part by weight of the compound (A-1) as an electron-transporting material is prepared, and the solution is filtered through a 0.1-μm PTFE filter.

Subsequently, the solution is applied by dip coating on a glass substrate with ITO electrode, which is the same as that used in Example A1, at the side having the electrode to form a light-emitting layer having a thickness of 0.15 μm and charge-transporting properties. After the light-emitting layer having charge-transporting properties is thoroughly dried, an Mg—Ag alloy is evaporated by co-deposition to form a rear-face electrode having a width of 2 mm and a thickness of 0.15 μm such that the rear-face electrode intersects with the ITO electrode, and thus an organic electroluminescent element is obtained. The effective area of the organic electroluminescent element is 0.04 cm$^2$.

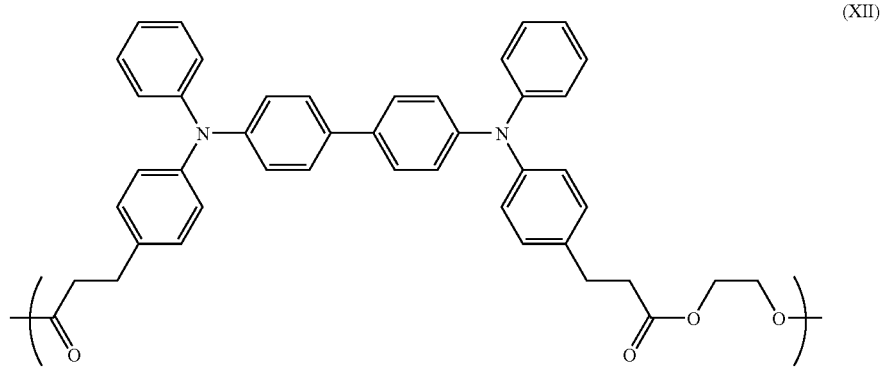

(XII)

Comparative Example B1

An organic electroluminescent element is made in a manner substantially similar to Example A1, except that the compound (XIII) is used in place of the exemplary compound (1).

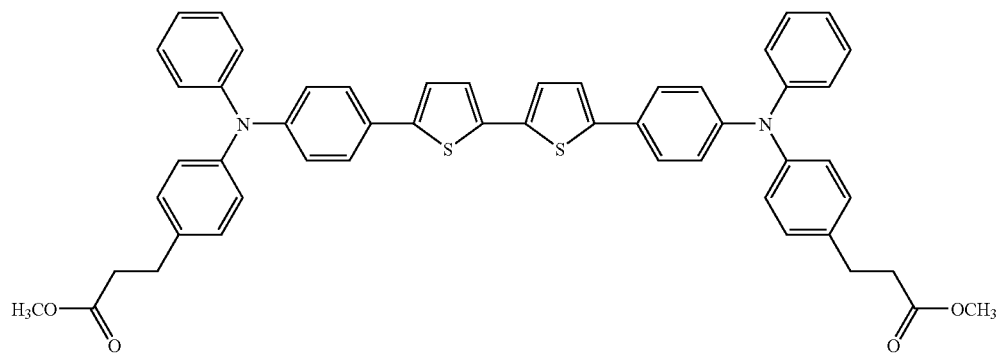

(XIII)

Comparative Example B2

An organic electroluminescent element is made in a manner substantially similar to Example A7, except that the compound (XIII) is used in place of the exemplary compound (57).

Comparative Example B3

An organic electroluminescent element is made in a manner substantially similar to Example A3, except that the compound (XIII) is used in place of the exemplary compound (9).

Comparative Example B4

An organic electroluminescent element is made in a manner substantially similar to Example A8, except that the compound (XIII) is used in place of the exemplary compound (59).

Comparative Example C1

An organic electroluminescent element is made in a manner substantially similar to Example A1, except that the compound (XIV) is used in place of the exemplary compound (1).

Comparative Example C2

An organic electroluminescent element is made in a manner substantially similar to Example A7, except that the compound (XIV) is used in place of the exemplary compound (57).

Comparative Example C3

An organic electroluminescent element is made in a manner substantially similar to Example A3, except that the compound (XIV) is used in place of the exemplary compound (9).

Comparative Example C4

An organic electroluminescent element is made in a manner substantially similar to Example A8, except that the compound (XIV) is used in place of the exemplary compound (59).

(Evaluation)
—Evaluation of Various Properties—

The organic electroluminescent elements made as described above are sealed with glass using an adhesive in a dry nitrogen atmosphere, and the various properties are measured with the ITO electrode side positive and the rear-face electrode side negative.

The maximum luminance is measured with a TOPCON BM-7 luminance meter, and the light-emitting properties are (XIV)

compared in terms of the driving current density when the initial luminance is 400 cd/m² under a direct current driving system (DC driving). The luminescence life is evaluated based on the relative time to the drive time 1.0, which is assigned to the point when the luminance of the element of Comparative Example A1 (initial luminance $L_0$:4000 cd/m²) becomes 0.5 in terms of luminance L/initial luminance $L_0$ at room temperature (25° C.), and on a voltage increment (=voltage/initial driving voltage) when the luminance of the element becomes 0.5 in terms of luminance L/initial luminance $L_0$. The results are listed in Table 72.

TABLE 72

| | Maximum luminance (cd/m²) | Driving current density (mA/cm²) | Voltage increment (L/L$_0$ = 0.5) | Relative time (L/L$_0$ = 0.5) |
|---|---|---|---|---|
| Example A1 | 18300 | 17.9 | 1.12 | 1.56 |
| Example A2 | 17600 | 18.4 | 1.22 | 1.5 |
| Example A3 | 15000 | 16.9 | 1.09 | 1.72 |
| Example A4 | 16800 | 16.5 | 1.16 | 1.54 |
| Example A5 | 14500 | 16.3 | 1.18 | 1.48 |
| Example A6 | 12500 | 15.6 | 1.29 | 1.12 |
| Example A7 | 18200 | 17.3 | 1.06 | 1.93 |
| Example A8 | 13000 | 15.2 | 1.22 | 1.4 |
| Comparative Example A1 | 11000 | 14.6 | 1.32 | 1 |
| Comparative Example A2 | 8750 | 15.7 | 1.25 | 1.08 |
| Comparative Example A3 | 10800 | 15 | 1.25 | 1.15 |
| Comparative Example B1 | — | — | — | 1.22 |
| Comparative Example C1 | — | — | — | 1.25 |

—Evaluation of Solubility of Charge-Transporting Polyester—

Table 73 shows the solubility of the charge-transporting polyesters in various solvents used in Examples and Comparative Examples. In addition to the solubility in monochlorobenzene and dichloromethane used in Examples and Comparative Examples, solubility in other solvents suitable for making of organic electroluminescent elements is also shown in Table 73. The solubility test is conducted by dissolving 1 g of a compound in 20 ml of a solvent, and visually observing the state.

TABLE 73

| | Solubility | | | |
|---|---|---|---|---|
| Compound | Dichloromethane | Monochlorobenzene | Cyclopentanone | Xylene |
| Exemplary compound (1) | A | A | A | A to B |
| Exemplary compound (17) | A | A | A to B | A to B |
| Exemplary compound (9) | A | A | A | A to B |
| Exemplary compound (42) | A | A | A to B | A to B |
| Exemplary compound (25) | A | A | A | B |
| Exemplary compound (34) | A | A | A | A to B |
| Exemplary compound (57) | A | A | A to B | A to B |
| Exemplary compound (59) | A | A | B | B |
| Compound (XI) | A | A | A | A |
| PVK | A | A | A | B |
| Compound (XII) | A | A | A | A to B |
| Compound (XIII) | A | A to B | B | B |
| Compound (XIV) | A | A | A to B | B |

A: Dissolved without heating.
A to B: Dissolved under heating.
B: Partially dissolved.

(Evaluation)

The organic electroluminescent elements made as described above are sealed with glass using an adhesive in a dry nitrogen atmosphere, and the luminescence life is measured with the ITO electrode side positive and the rear-face electrode side negative.

The luminescence life is compared between elements having the same layer structure based on the relative time to the drive time 1.0, which is assigned to the point when the luminance of the elements of Comparative Examples C1 to C4 (initial luminance $L_0$:4000 cd/m$^2$) become 0.5 in terms of luminance L/initial luminance $L_0$ at room temperature (25° C.). The results are listed in Table 74.

TABLE 74

| | Layer structure | Layer containing charge-transporting polyester | Relative time (L/L$_0$ = 50) | | |
| --- | --- | --- | --- | --- | --- |
| | | | (Examples A1, A3, A7, and A8) | (Comparative Examples B1 to B4) | (Comparative Examples C1 to C4) |
| Example A1/ Comparative Example B1/ Comparative Example C1 | FIG. 3 | Hole-transporting layer | 2.7 | 1.3 | 1.0 |
| Example A3/ Comparative Example B3/ Comparative Example C3 | FIG. 2 | Hole-transporting layer | 4.5 | 1.2 | 1.0 |
| Example A7/ Comparative Example B2/ Comparative Example C2 | FIG. 1 | Electron-transporting layer | 2.5 | 1.4 | 1.0 |
| Example A8/ Comparative Example B4/ Comparative Example C4 | FIG. 4 | Light-emitting layer having charge transporting properties | 2.1 | 1.3 | 1.0 |

As described above, an exemplary embodiment of the present invention, there is provided an organic electroluminescent element having a longer element life than other organic electroluminescent element including polyvinyl carbazole.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments

What is claimed is:

1. An organic electroluminescent element comprising a pair of electrodes and an organic compound layer sandwiched between the pair of electrodes, at least one of the electrodes being transparent, the organic compound layer comprising one or more layers, and at least one of the one or more layers containing at least one charge-transporting polyester represented by the following Formula (I-1) or (I-2):

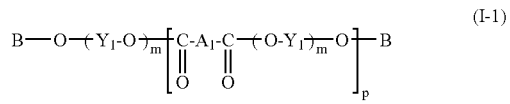

(I-1)

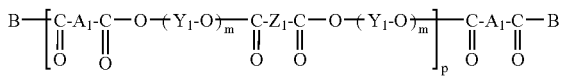

(I-2)

wherein, in Formulae (I-1) and (I-2), $A_1$ represents at least one structure selected from the structures represented by the following Formulae (II-1) and (II-2), $Y_1$ represents a divalent alcohol residue, $Z_1$ represents a divalent carboxylic acid residue, terminal groups B each independently represent hydrogen or a group represented by —O—$(Y_1$—O$)_m$—H or —O—$(Y_1$—O$)_m$—CO—$Z_1$—CO—OR' (wherein R' represents a hydrogen atom, an alkyl group, a substituted or unsubstituted aryl group, or a substituted or unsubstituted aralkyl group), m represents an integer of 1 to 5, and p represents an integer of 5 to 5000:

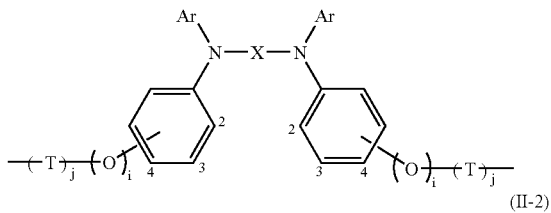

(II-1)

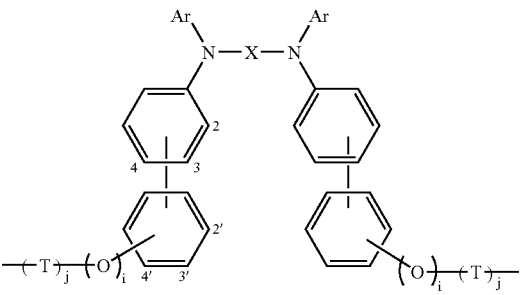

(II-2)

wherein, in Formulae (II-1) and (II-2), Ar represents a substituted or unsubstituted phenyl group, a substituted or unsubstituted monovalent polynuclear aromatic hydrocarbon group having 2 to 10 aromatic rings, a substituted or unsubstituted monovalent condensed aromatic hydrocarbon group having 2 to 10 aromatic rings, or a substituted or unsubstituted monovalent aromatic heterocyclic group, i and j each represent 0 or 1, T represents a divalent straight-chain hydrocarbon group having 1 to 6 carbon atoms or a divalent branched hydrocarbon group having 2 to 10 carbon atoms, and X represents a divalent group represented by the following Formula (III):

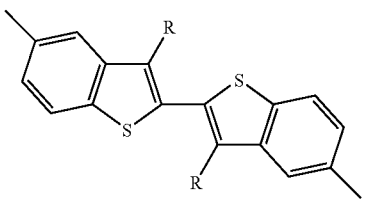

(III)

wherein, in Formula (III), R represents a hydrogen atom, a straight-chain hydrocarbon group having 1 to 6 carbon atoms, or a monovalent branched hydrocarbon group having 2 to 10 carbon atoms.

2. The organic electroluminescent element of claim 1, wherein the organic compound layer comprises at least a light-emitting layer as well as an electron-transporting layer and/or an electron-injecting layer,
wherein at least one layer selected from the light-emitting layer, the electron-transporting layer and the electron-injecting layer comprises the at least one charge-transporting polyester.

3. The organic electroluminescent element of claim 1, wherein the organic compound layer comprises at least a light-emitting layer as well as a hole-transporting layer and/or a hole-injecting layer,
wherein at least one layer selected from the light-emitting layer, the hole-transporting layer and the hole-injecting layer comprises the at least one charge-transporting polyester.

4. The organic electroluminescent element of claim 1, wherein the organic compound layer comprises at least a light-emitting layer, at least one layer selected from a hole-transporting layer or a hole-injecting layer, and at least one layer selected from an electron-transporting layer or an electron-injecting layer,
wherein at least one layer selected from the light-emitting layer, the hole-transporting layer, the hole-injecting layer, the electron-transporting layer and the electron-injecting layer comprises the at least one charge-transporting polyester.

5. The organic electroluminescent element of claim 1, wherein the organic compound layer comprises a light-emitting layer having charge-transporting properties,
wherein the light-emitting layer having charge-transporting properties comprises the at least one charge-transporting polyester.

6. The organic electroluminescent element of claim 1, wherein the Ar is a phenyl group, a biphenyl group, a thienylphenyl group, a dimethylbiphenyl group, a triphenylamino group, a 9,9-dimethyl-2-fluorenyl group, or an ethylphenyl group, and the $Y_1$ and $Z_1$ are selected from the groups represented by the following Formulae (1) to (6):

(1)

(2)

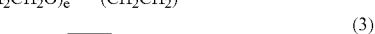

(3)

(4)

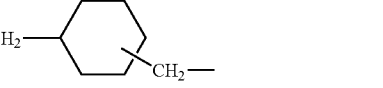

(5)

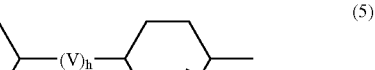

(6)

wherein, in Formulae (1) to (6), $R^3$ and $R^4$ each represent a hydrogen atom, an alkyl group having 1 to 4 carbon atoms, an alkoxyl group having 1 to 4 carbon atoms, a substituted or unsubstituted phenyl group, a substituted or unsubstituted aralkyl group, or a halogen atom, d and e each represent an integer of 1 to 10, f represents an integer of 0, 1, or 2, h and i each represent 0 or 1, and V is selected from the groups represented by the following Formulae (13) to (33):

(13)

(14)

(15)

(16)

(17)

(18)

(19)

(20)

(21)

(22)

(23)

-continued

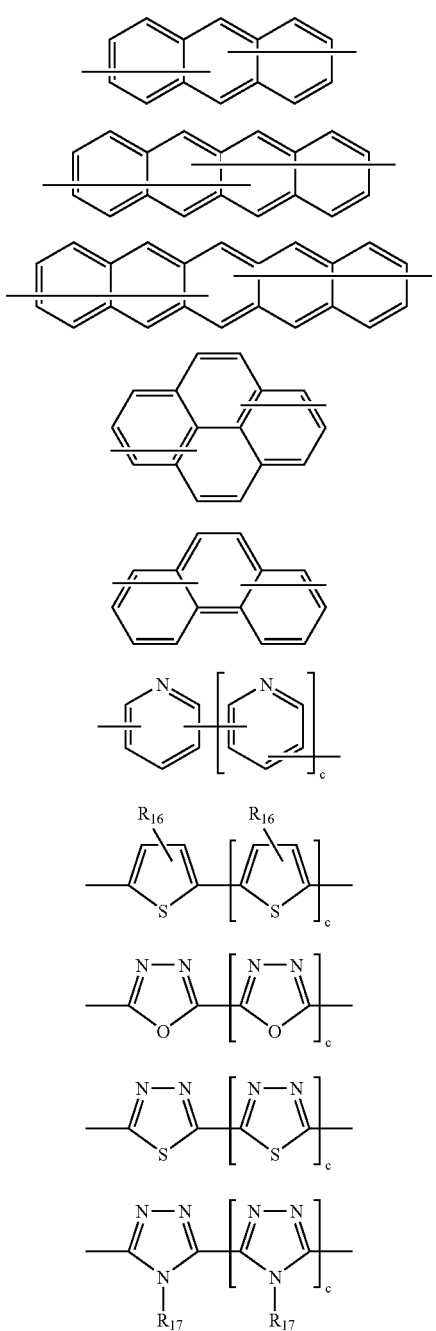

wherein in Formulae (13) to (33), $R_{15}$ represents a hydrogen atom, an alkyl group, or a cyano group, $R_{16}$ to $R_{17}$ represents a hydrogen atom, an alkyl group having 1 to 10 carbon atoms, an alkoxyl group having 1 to 10 carbon atoms, a substituted or unsubstituted phenyl group, a substituted or unsubstituted aralkyl group, or a halogen atom, b represents an integer of 1 to 10, and c represents an integer of 1 to 10.

7. The organic electroluminescent element of claim 1, wherein the organic compound layer further comprises a hole-transporting material or an electron-transporting material that is different than the at least one charge-transporting polyester.

8. The organic electroluminescent element of claim 7, wherein the hole-transporting material is at least one selected from the group consisting of tetraphenylenediamine derivatives, triphenylamine derivatives, carbazole derivatives, stilbene derivatives, arylhydrazone derivatives, and porphyrin-based compounds, and the electron-transporting material is at least one selected from the group consisting of oxadiazole derivatives, triazole derivatives, phenylquinoxaline derivatives, nitro-substituted fluorenone derivatives, diphenoquinone derivatives, thiopyran dioxide derivatives, and fluorenylidenemethane derivatives.

9. The organic electroluminescent element of claim 2, wherein the electron-injecting layer comprises a metal, a metal fluoride, and/or a metal oxide.

10. The organic electroluminescent element of claim 3, wherein the hole-injecting layer further comprises at least one selected from the group consisting of tetraphenylenediamine derivatives, triphenylamine derivatives, carbazole derivatives, stilbene derivatives, arylhydrazone derivatives, and porphyrin-based compounds.

11. The organic electroluminescent element of claim 1, wherein the organic compound layer further comprises a light-emitting compound that is different than the at least one charge-transporting polyester.

12. The organic electroluminescent element of claim 11, wherein the light-emitting compound is at least one selected from the group consisting of organic metal chelate complexes, polynuclear or condensed aromatic cyclic compounds, perylene derivatives, coumarin derivatives, styrylarylene derivatives, silole derivatives, oxazole derivatives, oxathiazole derivatives, oxadiazole derivatives, polyparaphenylene derivatives, polyparaphenylene vinylene derivatives, polythiophene derivatives, polyacetylene derivatives, and polyfluorene derivatives.

13. The organic electroluminescent element of claim 11, wherein the at least one charge-transporting polyester further comprises a doped dye compound that is different than a light-emitting compound.

14. The organic electroluminescent element of claim 13, wherein the dye compound is at least one selected from the group consisting of 4-dicyanmethylene-2-methyl-6-(p-dimethylaminostyryl)-4H-pyran (DCM) derivatives, quinacridone derivatives, rubrene derivatives, and porphyrin-based compounds.

15. A display device comprising the organic electroluminescent element of claim 1 and a driving means for driving the organic electroluminescent element, the organic electroluminescent element being arranged in a matrix shape and/or a segment shape.

* * * * *